US008433874B2

(12) United States Patent
Oh et al.

(10) Patent No.: US 8,433,874 B2
(45) Date of Patent: Apr. 30, 2013

(54) ADDRESS ASSIGNMENT AND TYPE RECOGNITION OF SERIALLY INTERCONNECTED MEMORY DEVICES OF MIXED TYPE

(75) Inventors: HakJune Oh, Kanata (CA); Hong Beom Pyeon, Kanata (CA); Jin-Ki Kim, Ottawa (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 435 days.

(21) Appl. No.: 11/771,023

(22) Filed: Jun. 29, 2007

(65) Prior Publication Data

US 2008/0140899 A1 Jun. 12, 2008

Related U.S. Application Data

(60) Provisional application No. 60/868,773, filed on Dec. 6, 2006, provisional application No. 60/870,892, filed on Dec. 20, 2006.

(51) Int. Cl.
*G06F 12/00* (2006.01)

(52) U.S. Cl.
USPC ........... 711/167; 711/148; 711/103; 711/104; 711/E12.084; 714/48; 710/9

(58) Field of Classification Search .................. None
See application file for complete search history.

(56) References Cited

U.S. PATENT DOCUMENTS

| | | | |
|---|---|---|---|
| 4,360,870 A * | 11/1982 | McVey | 710/9 |
| 5,249,270 A | 9/1993 | Stewart | |
| 5,357,621 A * | 10/1994 | Cox | 711/172 |
| 5,404,460 A | 4/1995 | Thomsen et al. | |
| 5,430,859 A | 7/1995 | Norman et al. | |
| 5,475,854 A | 12/1995 | Thomsen | |
| 5,806,070 A | 9/1998 | Norman et al. | |
| 6,009,479 A | 12/1999 | Jeffries | |
| 6,044,426 A * | 3/2000 | Farmwald et al. | 710/104 |
| 6,144,576 A | 11/2000 | Leddige et al. | |
| 6,148,363 A | 11/2000 | Lofgren et al. | |
| 6,304,921 B1 | 10/2001 | Rooke | |

(Continued)

FOREIGN PATENT DOCUMENTS

EP 1717985 A1 11/2006

OTHER PUBLICATIONS

Intel, "Intel StrataFlash Wireless Memory (L18)", Order No. 251902, Revision 010, Aug. 2005.

(Continued)

*Primary Examiner* — Charles Rones
*Assistant Examiner* — Arvind Talukdar
(74) *Attorney, Agent, or Firm* — Shuji Sumi

(57) ABSTRACT

A memory system architecture is provided in which a memory controller controls operations of memory devices in a serial interconnection configuration. The memory controller has an output serial interface for sending memory commands and an input serial interface for receiving memory responses for those memory commands requisitioning such responses. Each memory device includes a memory, such as, for example, flash memory (e.g., NAND- and NOR-type flash memories). In an initialization phase, the memory devices are assigned with consecutive number addresses. The memory controller sends a target address and can recognize the type of the targeted memory device. A data path for the memory commands and the memory responses is provided by the interconnection.

9 Claims, 45 Drawing Sheets

U.S. PATENT DOCUMENTS

| | | | |
|---|---|---|---|
| 6,317,812 | B1 | 11/2001 | Lofgren et al. |
| 6,442,644 | B1 | 8/2002 | Gustavson et al. |
| 6,453,365 | B1 | 9/2002 | Habot |
| 6,567,904 | B1 | 5/2003 | Khandekar et al. |
| 6,658,509 | B1 | 12/2003 | Bonella et al. |
| 6,715,044 | B2 | 3/2004 | Lofgren et al. |
| 6,799,235 | B2 | 9/2004 | Bormann et al. |
| 6,928,501 | B2 | 8/2005 | Andreas et al. |
| 6,944,697 | B2 | 9/2005 | Andreas |
| 6,950,325 | B1 | 9/2005 | Chen |
| 6,996,644 | B2 | 2/2006 | Schoch |
| 7,031,221 | B2 | 4/2006 | Mooney et al. |
| 7,032,039 | B2 | 4/2006 | DeCaro |
| 7,356,639 | B2 | 4/2008 | Perego |
| 2003/0074505 | A1* | 4/2003 | Andreas et al. ............... 710/110 |
| 2003/0221061 | A1 | 11/2003 | El-Batal et al. |
| 2004/0148482 | A1 | 7/2004 | Grundy et al. |
| 2004/0256638 | A1 | 12/2004 | Perego et al. |
| 2005/0028057 | A1 | 2/2005 | Briggs |
| 2005/0120136 | A1 | 6/2005 | Park |
| 2005/0160216 | A1* | 7/2005 | Norman et al. .................... 711/5 |
| 2006/0031593 | A1 | 2/2006 | Sinclair |
| 2007/0076479 | A1 | 4/2007 | Kim et al. |
| 2007/0083701 | A1 | 4/2007 | Kapil |
| 2007/0109833 | A1 | 5/2007 | Pyeon et al. |
| 2008/0028176 | A1 | 1/2008 | Bartley et al. |
| 2008/0086590 | A1 | 4/2008 | Urabe |

OTHER PUBLICATIONS

Intel, "How to Use OTP Registers for Security Applications", Application Note 717, Oct. 1999, Order No. 292265-001.

The I 2C-Bus Specification, Version 2.1, Jan. 2000.

Spansion Data Sheet, S70GL01GN00 MirrorBit Flash 1024 Megabit, 3.0 Volt-only Page Mode Flash Memory Featuring 110 mm MirrorBit Process Technology, Jun. 1, 2005.

ST Product Description, "2 Mbit, Low Voltage, Serial Flash Memory With 40MHz SPI Bus Interface", Aug. 2005.

HyperTransport Technology Consortium, HyperTransport I/O Link Specification, Revision 3.00, Apr. 21, 2006.

IEEE Standard for High-Bandwidth Memory Interface Based on Scalable Coherent Interface (SCI) Signaling Technology (RamLink), IEEE Std. 1596.4-1996, The Institute of Electrical Electronics Engineers, Inc., pp. i-91, (Mar. 1996).

PCT Patent Application No. PCT/CA2007/002173 International Search Report Dated Apr. 7, 2008.

PCT Patent Application No. PCT/CA2007/002171 International Search Report dated Mar. 17, 2008.

PCT Patent Application No. PCT/CA2007/002193 International Search Report Dated Apr. 7, 2008.

PCT Patent Application No. PCT/CA2007/002182 International Search Report dated Mar. 18, 2008.

PCT Patent Application No. PCT/CA2007/002147 Written Opinion dated Mar. 10, 2008.

King et al., "Communicating with Daisy Chained MCP42XXX Digital Potentiometers", Microtechnology Inc., Company Document #DS00747A, Jan. 30, 2001.

Microchip Technology Inc., Product Description 24AA1025/ 24LC1025/24FC1025, Document #DS21941C, Feb. 16, 2006.

Samsung Electronics Product Description and Data Sheet, "K9XXG08UXM", Preliminary Flash Memory, May 2005.

Atmel Product Description "8-megabit 2.5-volt Only or 2.7-volt Only DataFlash", AT45DB081B, Rev.2225H-DFLASH-10/04, Oct. 2004.

Silicon Storage Technology, Inc. Specification, "16 Mbit SPI Serial Flash", Doc #S7 1271-00-000, Apr. 2005.

Samsung, "DDR2 Fully Buffered DIMM: 240pin FBDIMMs based on 512Mb C-die", Rev. 1.3, Sep. 2006, pp. 1-32.

Kennedy et al., "A 2Gb/s Point-to-Point Heterogeneous Voltage Capable DRAM for Capacity-Scalable Memory Subsystems", IEEE International Solid-State Circuits Conference, San Francisco, USA, Feb. 2004.

Kim et al., A 3.6Gb/s/pin Simultaneous Bidirectional (SBD) I/O Interface for High-Speed DRAM, IEEE International Solid-State Circuits Conference, San Francisco, USA, Feb. 2004.

\* cited by examiner

| TYPE | HEX | Bit 7 | Bit 6 | Bit 5 | Bit 4 | Bit 3 | Bit 2 | Bit 1 | Bit 0 |
|---|---|---|---|---|---|---|---|---|---|
| NAND Flash | 00h | 0 | 0 | 0 | 0 | 0 | 0 | 0 | 0 |
| NOR Flash | 01h | 0 | 0 | 0 | 0 | 0 | 0 | 0 | 1 |
| DRAM | 02h | 0 | 0 | 0 | 0 | 0 | 0 | 1 | 0 |
| SRAM | 03h | 0 | 0 | 0 | 0 | 0 | 0 | 1 | 1 |
| PSRAM | 04h | 0 | 0 | 0 | 0 | 0 | 1 | 0 | 0 |
| DiNOR Flash | 05h | 0 | 0 | 0 | 0 | 0 | 1 | 0 | 1 |
| FeRAM | 06h | 0 | 0 | 0 | 0 | 0 | 1 | 1 | 0 |
| PCRAM | 07h | 0 | 0 | 0 | 0 | 0 | 1 | 1 | 1 |
| Serial EEPROM | 08h | 0 | 0 | 0 | 0 | 1 | 0 | 0 | 0 |
| RFU | . | . | . | . | . | . | . | . | . |
| RFU | . | . | . | . | . | . | . | . | . |
| RFU | . | . | . | . | . | . | . | . | . |
| MRAM | FFh | 1 | 1 | 1 | 1 | 1 | 1 | 1 | 1 |

FIG. 5B

| Operation | 1st Byte | 2nd Byte | 3rd Byte | 4th Byte | 5th Byte | 6th Byte | 7th Byte | 8th Byte | ... | N-th Byte |
|---|---|---|---|---|---|---|---|---|---|---|
| Read | TDA | CMD | RA | RA | RA | CA | CA | - | - | - |
| Write | TDA | CMD | RA | RA | RA | CA | CA | DATA | DATA | DATA |
| Erase | TDA | CMD | RA | RA | RA | - | - | - | - | - |
| Read Status | TDA | CMD | - | - | - | - | - | - | - | - |
| Read Device Type | TDA | CMD | - | - | - | - | - | - | - | - |
| Write Configuration Register | TDA | CMD | DATA | - | - | - | - | - | - | - |
| Write Device Address | TDA*1 | CMD | DATA | - | - | - | - | - | - | - |
| Reset | TDA | CMD | - | - | - | - | - | - | - | - |

FIG. 9

| Operation | Target DA (1 Byte) | Command (1 Byte) | Row Address (3 Bytes) | Column Address (2 Bytes) | Input Data (1st to N-th Bytes) |
|---|---|---|---|---|---|
| Page Read | Valid | 00h | Valid*2 | Valid*2 | - |
| Random Data Read | Valid | 05h | - | Valid | - |
| Page Read for Copy | Valid | 35h | Valid | - | - |
| Target Address Input for Copy | Valid | 8Fh | Valid | - | - |
| Serial Data Input | Valid | 80h | Valid | Valid | Valid |
| Random Data Input | Valid | 85h | - | Valid | Valid |
| Page Program | Valid | 10h | - | - | - |
| Block Erase | Valid | 60h | Valid | - | - |
| Read Status | Valid | 70h | - | - | - |
| Read Device Type | Valid | 90h | - | - | - |
| Write Configuration Register | Valid | A0h | - | - | Valid (1 Byte) |
| Write Device Address | Valid*1 | 39h | - | - | Valid (1 Byte) |
| Reset | Valid | FFh | - | - | - |

| Operation | Target DA (1 Byte) | Command (1 Byte) | Row Address (3 Bytes) | Column Address (2 Bytes) | Input Data (1th to N-th Bytes) |
|---|---|---|---|---|---|
| Page Read | Valid | 00h | Valid*2 | Valid*2 | - |
| Write to Buffer | Valid | 80h | Valid | Valid | Valid |
| Program Buffer to Flash (Confirm) | Valid | 10h | - | - | - |
| Chip Erase | Valid | 20h | - | - | - |
| Sector Erase | Valid | 21h | Valid | - | - |
| Program/Erase Suspend | Valid | C0h | - | - | - |
| Program/Erase Resume | Valid | D0h | - | - | - |
| Read Status | Valid | 70h | - | - | - |
| Read Device Type | Valid | 90h | - | - | - |
| Write Configuration Register | Valid | A0h | - | - | Valid (1 Byte) |
| Write Device Address | Valid*1 | 39h | - | - | Valid (1 Byte) |
| Reset | Valid | FFh | - | - | - |

|  | Bit 7 | Bit 6 | Bit 5 | Bit 4 | Bit 3 | Bit 2 | Bit 1 | Bit 0 |
|---|---|---|---|---|---|---|---|---|
| TDA (Target Device Address) | | | | | | | | |
| 1st Byte | DA[7] | DA[6] | DA[5] | DA[4] | DA[3] | DA[2] | DA[1] | DA[0] |
| RA (Row Address) | | | | | | | | |
| 1st Byte | Low | Low | Low | Low | Low | Low | RA[17] | RA[16] |
| 2nd Byte | RA[15] | RA[14] | RA[13] | RA[12] | RA[11] | RA[10] | RA[9] | RA[8] |
| 3rd Byte | RA[7] | RA[6] | RA[5] | RA[4] | RA[3] | RA[2] | RA[1] | RA[0] |
| CA (Column Address) | | | | | | | | |
| 1st Byte | Low | Low | Low | Low | CA[11] | CA[10] | CA[9] | CA[8] |
| 2nd Byte | CA[7] | CA[6] | CA[5] | CA[4] | CA[3] | CA[2] | CA[1] | CA[0] |

ADDRESS ASSIGNMENT AND TYPE RECOGNITION OF SERIALLY INTERCONNECTED MEMORY DEVICES OF MIXED TYPE

CROSS REFERENCE TO RELATED APPLICATIONS

This application claims the benefit of priority from U.S. Provisional Patent Application No. 60/868,773 filed Dec. 6, 2006, and U.S. Provisional Patent Application No. 60/870,892 filed Dec. 20, 2006, the disclosures of which are expressly incorporated herein by reference in their entirety.

FIELD OF THE INVENTION

The present invention relates generally to semiconductor device systems. More particularly, the present invention relates to an apparatus and a method for controlling semiconductor devices, such as, for example, memory systems with memory devices of varying or mixed type.

BACKGROUND OF THE INVENTION

Computer-based systems contain semiconductor devices, such as, for example, memory devices and processing devices. Memory is where information is stored while waiting to be operated on by the Central Processing Unit (CPU) of the computer. Memory is controlled by a memory controller, which can form part of the CPU or be separate from the CPU. The memory controller has an interface with the memory for communicating information. Known interfaces include parallel interfaces and serial interfaces.

Parallel interfaces use a large number of pins to read and write data. Unfortunately, as the number of input pins and wires increases, so do a number of undesired effects. These undesired effects include inter-symbol interference, signal skew and cross talk. Therefore, there is a need in the art for memory modules that have increased memory capacities and/or operating speeds while minimizing the number of input pins and wires for accessing the memory modules.

Serial interfaces use fewer pins to read and write data. Serial flash memory is now available, but this tends to be very slow. For example, many conventional memories are using serial bus interface schemes that operate in the range of 1 MHz-20 MHz with the SPI (Serial Peripheral Interface) or I²C (Inter-Integrated Circuit) compatible interface. However, those serial interface standards are usually slower than their parallel counterparts.

With reference to FIGS. 1A, 1B, 1C and 1D, shown are four primary flash memory architectures. The four primary flash-memory architectures include a traditional XIP model as shown in FIG. 1A, a shadow model as shown in FIG. 1B, a store-and-download model with NAND as shown in FIG. 1C, and a newer store-and-download model with hybridized NAND flash memory as shown in FIG. 1D.

Referring to FIG. 1A, the traditional XIP model has a NOR flash memory 102 and volatile memory 103, which is likely SRAM (Static Random Access Memory) or DRAM (Dynamic Random Access Memory), connected to an application processor 101. In the XIP model, the NOR flash memory 102 executes code, while the volatile memory 103 accounts for constantly changing system elements, such as variables, stack and heat. In the XIP model, the NOR flash memory 102 can also provide data and code storage as well. The advantage of the XIP model is simplicity, but the disadvantage is its slow write speed.

Referring to FIG. 1B, the shadow model has a NOR flash memory 105, NAND flash memory 106 and volatile memory 107, which is likely SRAM or DRAM, connected to an application processor 104. Users boot a system with the NOR flash memory 105 and use the NAND flash memory 106 for storage. The volatile memory 107 handles all of the execution. The shadow model is an expensive model in that it is using the NOR flash memory 105, which is relatively pricey, only to boot up the system. The architecture is also complex, which means that it consumes more design time and cost. The shadow model also tends to be power-hungry because the volatile memory is constantly active.

To overcome the space issue, which is a huge factor, for example, in mobile handheld devices, the store-and-download architecture is employed as shown in FIG. 1C. The store-and-download architecture has a NAND flash memory 110 and volatile memory 111, which is likely SRAM or DRAM, connected to an application processor 108. The store-and-download architecture has no NOR flash memory, but there is an OTP (one-time-programmable) storage 109 or ROM (Read Only Memory) core designed into the application processor 108. The application processor 108 loads information into the volatile memory 111, which accesses the NAND flash memory 110 for data storage. The architecture is complex and requires more initial engineering costs, but ultimately, the unit cost of the system is less expensive. The main difficulty of the model is that users must employ extensive error-correction and error-detection coding because NAND flash memory is typically less reliable. Storing and downloading designs tend to require more power, as the RAM takes a more active role.

Referring to FIG. 1D, the hybrid store and download model has a hybrid NAND flash memory 113 and volatile memory 114, which is likely SRAM or DRAM, connected to an application processor 112. The hybrid NAND flash memory 113 mixes SRAM, control logic and NAND flash memory to create a memory device that is supposed to look like a NOR flash device. This hybrid model reads much faster than a standard NAND flash device and at the same speed as a NOR flash device. It also achieves better write performance than NOR flash devices. Hybrid NAND flash memories are now available. Hybrid model requires less error-correction and error-detection coding than store-and-download models with standard NAND flash memories. The unit cost for hybridized NAND flash memories is, for example, 30 to 40% less than NOR flash memories at the same density. The cost of stand-alone NAND flash memories is slightly less than that of hybridized NAND flash memories.

The memory systems using any of the four primary flash memory architectures need much time for engineering design, software development and verification.

SUMMARY OF THE INVENTION

According to a broad aspect, there is provided a system or apparatus comprising memory devices of varying or mixed type, the memory devices being serially interconnected, so that input data is serially transferred from device to device.

According to another broad aspect, there is provided a system comprising: a plurality of devices of mixed type, the devices being configured in at least one serial interconnection configuration wherein the devices are serially interconnected, each of the devices having serial input and output connections; and a controller having a serial output connection for providing a serial input to the serial input connection of a first device of the serial interconnection configuration, the serial input being propagated through the serial interconnection configuration, the controller having a serial input connection for receiving the propagated serial input from a last device of the serial interconnection configuration.

For example, in the system, the plurality of devices is configured in one serial interconnection configuration, the type of the devices being mixed. Each of the devices comprises: a device controller for controlling operation of the device in response to received serial input and further comprises: a device type holder for holding a device type identification of the device; and a device address holder for holding a device address to be assigned to the device.

Advantageously, each of the devices is assigned with a device address, the assigned device address being held in the device address holder of the device.

In one example, the device address assigned to each of the devices is predetermined address, the predetermined address being held by the device address holder of that device.

In another example, each of the devices is assigned with device address in response to the serial input provided by the controller, the assigned device address being held in the device address holder of the device. For example, each of the devices further comprises an address changer for changing a device address contained in the received serial input to provide a changed device address. If the address change is performed by each of the devices, the assigned device addresses will be consecutive and therefore, each of the devices will hold its unique device address. For example, the address changing by one device is performed after the previous device completes the operation of address changing.

By providing a target address with a type read command, a device type of the device to be targeted can be read by executing the type read command. By receiving the target address and the read device type, the controller can recognize the device type.

The device address assignment to the devices and the reading of the device types in the serial interconnection configuration may be performed in an initialization phase of the system operations. Advantageously, after the initialization phase, the system may conduct a normal operation. In such a normal operation mode, the serial output/input may issue an operation command together with a target device address to the devices of the serial interconnection configuration. In response to the command, each of the devices performs an address match determination. The device which determines the address match with the target device address executes the command, so that the device operation is performed in accordance with the operation command. The operation may include a memory access, for example, page read of flash memories.

Advantageously, in the system, the plurality of devices is configured in a plurality of serial interconnection configurations, the configured serial interconnection configurations including at least first and second serial interconnection configurations. The controller has a plurality of groups of serial output and input connections. The device types of each of the first and second serial interconnection configurations may be identical or different.

According to another broad aspect, there is provided a semiconductor device comprising: an input connection for connection for receiving device commands, each device command being specific to any one of a plurality of supported types; an output connection; and a device controller for executing the device commands addressed to the device and for forwarding other device commands.

For example, the device has a device type and a device address. The input connection is operable to receive device commands. Each device command comprises: a first portion for identifying a device address of a selected device; and a second portion for identifying a selected command to be executed by the selected device. The device controller is operable to determine for each device command whether the device command is addressed to the device in response to the first portion of the device command.

According to another broad aspect, there is provided a method for processing commands in a semiconductor device, the method comprising: receiving device commands, each device command being specific to any one of a plurality of supported device types; executing the device commands addressed to the device; and forwarding the device commands addressed to another device.

For example, the step of executing includes device address assignment in response to the device command. Once device addresses are assigned to the devices, the step of executing may include a memory access to a memory included in the device.

According to another broad aspect, there is provided a method used in a system comprising a plurality of devices of mixed type being serially interconnected, the method comprising: holding a device type identification of the device; holding a device address to be assigned to the device; providing a serial input to the first device, the serial input being propagated through the devices, and receiving a serial output from the last device.

For example, a device address match is determined between the device address held in one device and a target device address of the serial input. In response to a determination result, the device may perform a memory operation. The memory operation result may be propagated through the devices.

According to an embodiment of the present invention, there is provided a memory system architecture in which a memory controller controls memory devices that are serially interconnected. The memory controller has an output connection for sending memory (or device) commands, and an input connection for receiving memory responses for those memory commands requisitioning such responses. Each memory device may be of any memory type, such as NAND flash or NOR flash for example. Each memory command is specific to the memory type of the intended memory device. A data path for the memory commands and the memory responses is provided through the serial interconnection. A given memory command may traverse many memory devices in order to reach its intended memory device. Upon its receipt, the intended memory device executes the given memory command and, if appropriate, sends a memory response to the memory controller.

According to an embodiment of the present invention, there is provided a memory devices which have memory types of, for example, NAND Flash EEPROM, NOR Flash EEPROM, AND Flash EEPROM, DiNOR Flash EEPROM, Serial Flash EEPROM, DRAM, SRAM, ROM, EPROM, FRAM, MRAM, and PCRAM. In a memory system having a serial interconnection configuration of mixed type memory devices, based on the target addresses, the memory type of each device can be read.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 5B is a table of an example encoding scheme for each memory type;

FIG. 9 is a table of example predetermined formats for memory operations;

FIG. 10 is a table of an example encoding scheme for NAND flash commands;

FIG. 11 is a table of an example encoding scheme for NOR flash commands;

FIG. 12 is a table of an example address format;

DETAILED DESCRIPTION

Figure 1D:
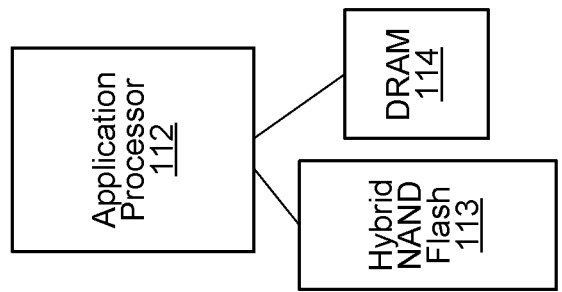
FIGS. 1A, 1B, 1C and 1D are block diagrams of four primary flash memory architectures.
Figure 1C:
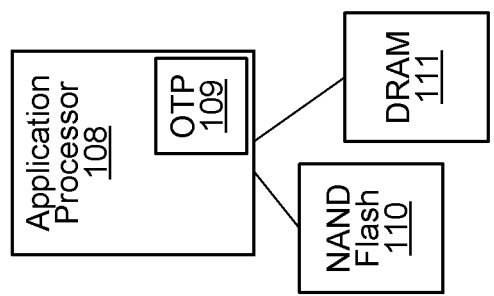
Figure 1B:
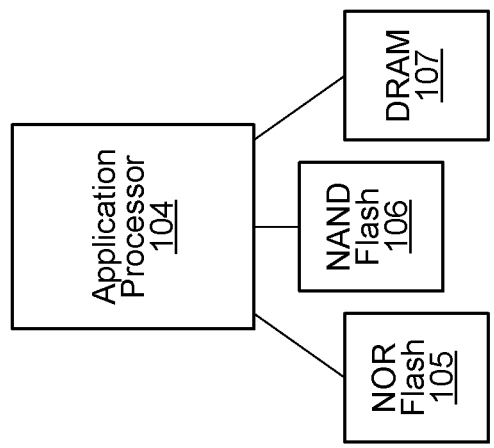
Figure 1A:
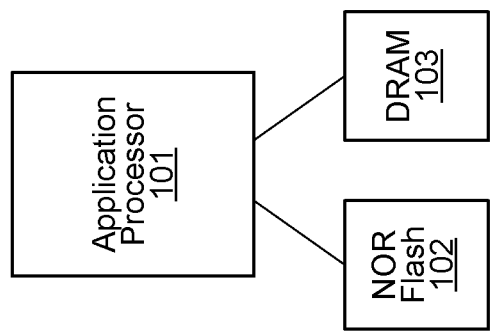

In the following detailed description of sample embodiments of the invention, reference is made to the accompanying drawings that form a part hereof, and in which is shown by way of illustration specific sample embodiments in which the present invention may be practiced. These embodiments are described in sufficient detail to enable those skilled in the art to practice the present invention, and it is to be understood that other embodiments may be utilized and that logical, mechanical, electrical, and other changes may be made without departing from the scope of the present invention. The following detailed description is, therefore, not to be taken in a limiting sense, and the scope of the present invention is defined by the appended claims.

Generally, the present invention provides apparatus and method for controlling semiconductor devices, such as, for example, memory systems with memory devices of mixed type.

Embodiments of the present invention are now described in the context of memory system. A memory system includes a memory controller and a serial interconnection configuration of memory devices.

Some memory subsystems employ multiple memory devices, such as, for example, flash memory devices, with serial interfaces. Here, the command string may be fed to all of the devices even though the command may only be performed on one of the devices. To select the device on which the command is to be performed, the command string may contain a device identifier (ID) or a device address (DA) that identifies the memory device to which the command is directed. Each device receiving the command string compares the ID contained in the command string to an ID associated with the device. If the two match, the device will assume that the command is directed to the device to execute the command.

As mentioned previously, there are many different memory types with different interface specifications. Designing memory systems with varying or mixed memory types using traditional architectures involves a lot of time in engineering design, software development and verification. Also, parallel interface schemes can involve too much physical wiring or routings on a PCB (print circuit board) or on a MCP (Multi Chip Package), which may cause various noise problems in higher speed operation. More signal lines means more complex board designs and more space requirements as systems grow in density and in features. There is a need for an improved memory system architecture.

Details of serial interconnection of memory devices are disclosed in U.S. patent application Ser. No. 11/324,023 filed Dec. 30, 2005, U.S. Provisional Patent Application No. 60/787,710 entitled "Serial Interconnection of Memory Devices" filed Mar. 28, 2006, U.S. Provisional Patent Application No. 60/802,645 entitled "Serial Interconnection of Memory Devices" filed May 23, 2006, and U.S. patent application Ser. No. 11/622,828 filed Jan. 12, 2007 entitled "Apparatus and method for producing IDs for interconnected devices of mixed type," the contents of which are entirely incorporated herein by reference.

Figure 2A:
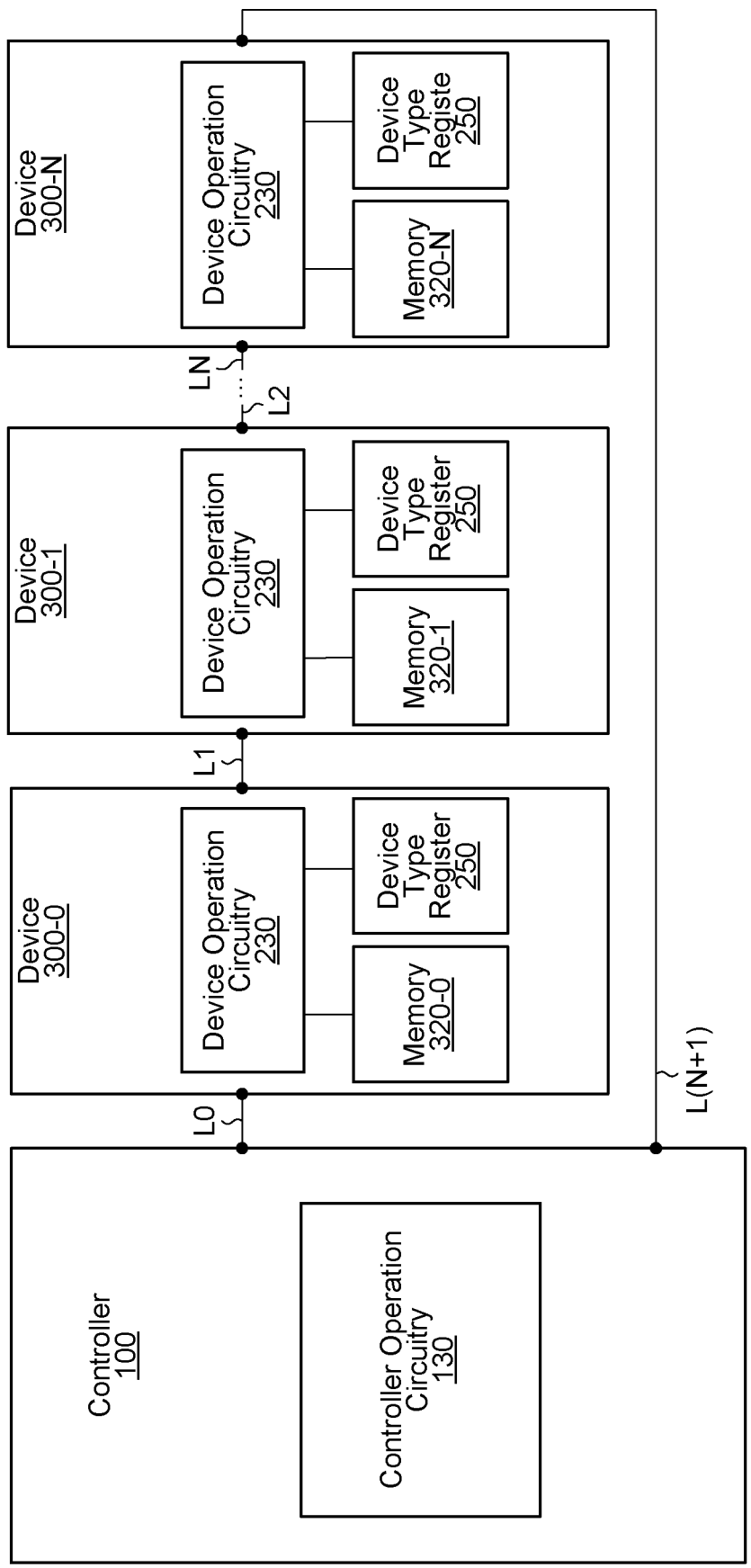
FIG. 2A is a block diagram of a memory system according to an embodiment of the present invention.

FIG. 2A shows a memory system according to an embodiment of the present invention. Referring to FIG. 2A, a memory system includes a controller 100 and a plurality of devices 300-0, 300-1, . . . , and 300-N in a serial interconnection configuration. N is an integer greater than one. In this particular example, the number of the serially interconnected memory devices is (N+1). The controller 100 and the devices 300-0, 300-1, . . . , and 300-N are interconnected using any appropriate connections, such as, for example, links. In the illustrated example, the links are serial links. The controller 100 and the devices 300-0, 300-1, . . . , and 300-N are interconnected through serial links L0, L1, L2, . . . , LN and L(N+1).

The controller 100 has controller operation circuitry 130. Each of the devices 300-0, 300-1, . . . , and 300-N has device operation circuitry 230 that performs memory operation control and memory initialization functions. The devices 300-0, 300-1, . . . , and 300-N have respective memory-type specific components such as respective memories 320-0, 320-1, . . . , and 320-N. Each of the devices 300-0, 300-1, . . . , and 300-N has a memory type from a plurality of supported memory types. The plurality of supported memory types is defined on an implementation-specific basis. Information on or identification of the memory type of each device is stored in a register 250 thereof. However, the types of the devices are unknown to the controller 100. Each of the controller operation circuitry and the device operation circuitry includes input and output circuitry, e.g., interface circuitry.

Figure 2B:
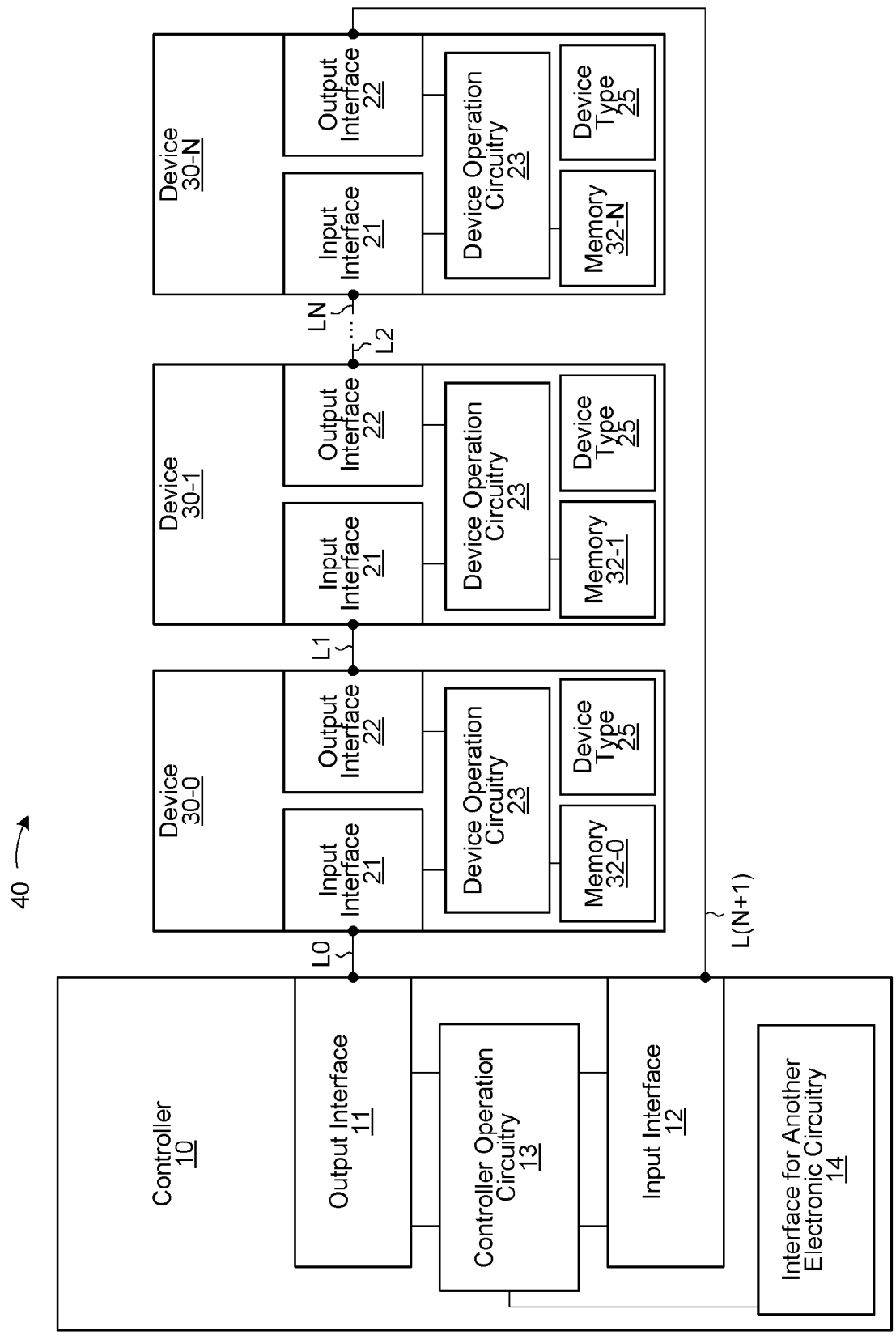
FIG. 2B is a block diagram of a memory system according to an embodiment of the present invention.

FIG. 2B shows an example memory system according to one embodiment of the present invention. Referring to FIG. 2B, a memory system 40 includes a controller 10 and a plurality of devices 30-0, 30-1, . . . , and 30-N in a serial interconnection configuration. N is an integer greater than one. In this particular example, the number of the serially interconnected memory devices is (N+1). The controller 10 and the devices 30-0, 30-1, . . . , and 30-N are interconnected using links, such as, for example, serial links L0, L1, L2, . . . , LN and L(N+1).

The controller 10 has an output interface 11, an input interface 12 and controller operation circuitry 13. In some implementations, as shown in the illustrated example, the controller 10 also has another interface 14 for connection with another electronic circuit (not shown). The controller 10 may have other components, but they are not shown for sake of simplicity.

Some components of the devices 30-0, 30-1, . . . , and 30-N are identically numbered. For instance, each of the devices 30-0, 30-1, . . . , and 30-N has an input interface 21, an output interface 22 and device operation circuitry 23 that performs memory operation control and memory initialization functions. The devices 30-0, 30-1, . . . , and 30-N have respective memory-type specific components such as respective memories 32-0, 32-1, . . . , and 32-N. Each of the devices 30-0, 30-1, . . . , and 30-N has a memory type from a plurality of supported memory types. The plurality of supported memory types is defined on an implementation-specific basis. This can be fixed, or in some embodiments subject to change, for example, by adding a memory type over time. While a given configuration may not necessarily include memory devices of each of the plurality of supported memory types, the controller 10 and interfaces are designed to allow for this functionality. There are many possibilities for the plurality of supported memory types. The plurality of supported memory types might, for example, include any two or more of NAND Flash EEPROM, NOR Flash EEPROM, AND Flash EEPROM, DiNOR Flash EEPROM, Serial Flash EEPROM, DRAM, SRAM, ROM, EPROM, FRAM, MRAM (Magnetoresistive Random Access Memory), and PCRAM. Other combinations of supported memory types are also possible.

Each of the devices 30-0, 30-1, . . . , and 30-N is aware of its memory type. For example, information on or identification of the memory type is stored in a register as indicated by 25; however, more generally, each of the devices 30-0, 30-1, . . . , and 30-N may be provided with any appropriate circuitry for maintaining an identification of its memory type. Other mechanisms by which each of the devices 30-0, 30-1, . . . , and 30-N is aware of its memory type are also possible. Each of the devices 30-0, 30-1, . . . , and 30-N may have other components, but they are not shown for sake of simplicity.

The controller operation circuitry 13 of the controller 10 performs memory operation control and initialization functions. The controller operation circuitry 13 sends memory (or device) commands over the output interface 11. A data path for each memory command is provided by the combination of the devices 30-0, 30-1, . . . , and 30-N and the serial links L0, L1, L2, . . . , LN and L(N+1). For example, if a memory command is intended for the second device 30-1, the memory command will traverse the first device 30-0 over the serial links L0 and L1. If the memory command requisitions a response from the second device 30-1, the response will traverse the third memory device, the fourth memory device, . . . , and the last (N-th) device 30-N over the serial links L2, . . . , LN and L(N+1) back to the controller 10.

Each of the devices 30-0, 30-1, . . . , and 30-N executes the memory commands that are addressed to the memory device and forwards over the output interface 22 those memory commands that are addressed to another memory device. The memory system 40 can be expanded as appropriate in terms of different memory types or mixed memory type as well as memory density expansion without sacrificing system's overall performance.

Figure 2C:
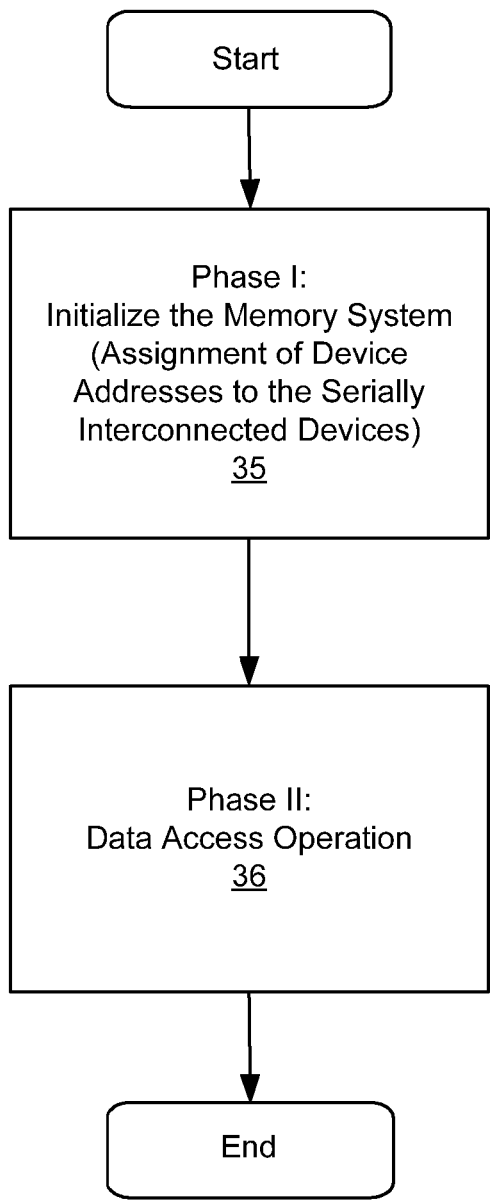
FIG. 2C is a flowchart illustrating operations of the memory system shown in FIG. 2A.

FIG. 2C shows operations of the memory system shown in FIG. 2B. Referring to FIGS. 2B and 2C, the controller operation circuitry 13 of the controller 10 sends memory commands over the output interface 11 for controlling the devices 30-0, 30-1, . . . , and 30-N. The controller operation circuitry 13 controls the devices 30-0, 30-1, . . . , and 30-N, by sending memory commands. There are many ways that this can be accomplished. For example purposes, some example implementations are described below; however, other implementations are possible.

In general, the memory system 40 performs operations of two phases: an initialization phase as indicated by 35; and a normal operation phase as indicated by 36. In the initialization phase 35 (or an initialization mode), the devices 30-0, 30-1, . . . , and 30-N are assigned with device addresses. The assigned device addresses are held in the devices 30-0, 30-1, . . . , and 30-N. Thereafter, in the normal operation phase 36 (or a normal operation mode), a target or addressed memory device performs data access operations.

In an example of the initialization phase 35, the controller operation circuitry 13 sends memory commands. The commands have portions of a device address assignment to assign unique addresses to the devices and of a device address related number. In one implementation, the device address related number of the command from the controller operation circuitry 13 is an initial value or number and the initial number is incremented by each of the devices. Each of the incremented number is held in a respective device as its device address.

In an example of the normal operation phase 36, the controller operation circuitry 13 of the controller 10 sends memory commands. The memory commands include a first portion that uniquely identifies a selected memory device of the plurality of memory devices, with the device address. No memory type is included in the memory commands. Each memory command also has a command portion identifying a selected command to be executed by the selected memory device. Each memory command may also include other portions as appropriate. When a memory device, for example, the first device 30-0 receives a memory command and then, the device operation circuitry 23 thereof determines whether the memory command is addressed to that device (i.e., the first device 30-0) in response to the first portion of the memory command. The device operation circuitry 23 determines whether the device address indicated by the first portion matches the device address of the first device 30-0. If there is a match between the two device addresses, the device operation circuitry 23 of the device 30-0 will execute the selected command indicated by the command portion. Otherwise, the device operation circuitry 23 forwards the memory command over the output interface 22 to a next device (e.g., the second device 30-1).

In some implementations, the controller operation circuitry 13 of the controller 10 is operable to send memory commands over the output interface 11 in response to requests received over the interface 14, and is further operable to respond to the requests using memory responses received over the input interface 12. The interface 14 may be any appropriate interface to another device or system (not shown) that uses the memory system 40.

There are many possibilities for the memory commands. These might include one or more of read operations, write operations, erase operations, read status operations, read DA operations, write configuration register operations, write address operations and reset operations. There may be other memory commands.

The way in which the controller 10 sends memory commands may depend on the manner in which the device addresses are assigned. Example implementations for assigning the device addresses are provided below.

Figure 2D:
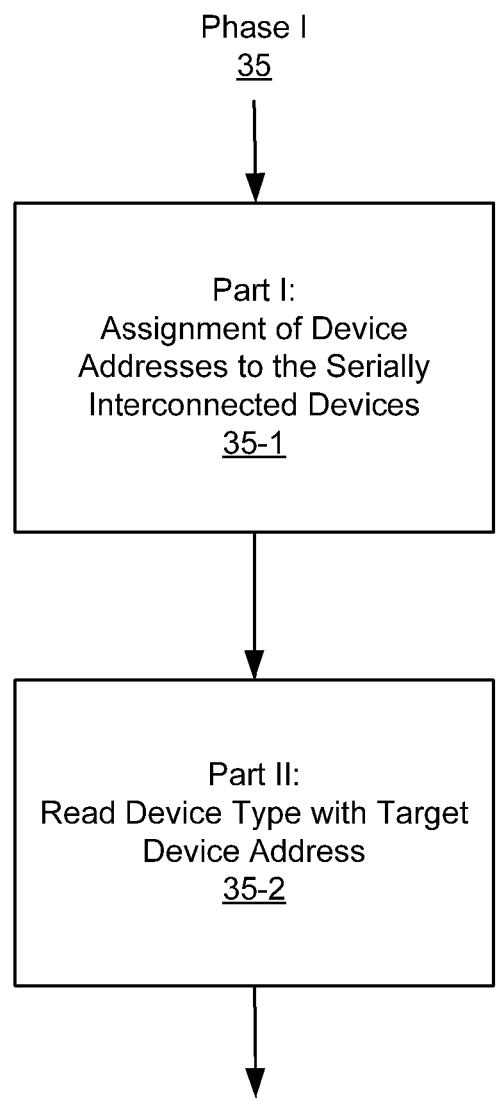
FIG. 2D illustrates details of an initial phase operations shown in FIG. 2C.

FIG. 2D shows details of the initialization phase 35 shown in FIG. 2C. The phase 35 includes two parts or steps: an address assignment as indicated by 35-1; and a device address read as indicated by 35-2. Referring to FIGS. 2B, 2C and 2D, at part 35-1, there are many ways for the device addresses to be assigned to the devices 30-0, 30-1, . . . , and 30-N. In a first example implementation, the device addresses are physically assigned by predetermined or hard-wired arrangements. In a second example implementation, the controller operation circuitry 13 of the controller 10 assigns the device addresses. For example purposes, the first and second example implementations will be described later; however, other implementations are possible. At part 35-2, the controller operation circuitry 13 of the controller 10 is operable to send over the output interface 11 memory type read messages with target device addresses for reading the memory types of the devices 30-0, 30-1, . . . , and 30-N. The devices 30-0, 30-1, . . . , and 30-N receive and process the memory type read messages.

In the first example implementation of part 35-1, the device addresses are physically assigned by predetermined or hard-wired arrangements as 'Device-0', 'Device-1', 'Device-2', . . . , and 'Device-n'. The predetermined device addresses are assigned addresses and held in the devices 30-0, 30-1, . . . , and 30-N.

In the second example implementation of part 35-1, the controller operation circuitry 13 of the controller 10 is operable to send, over the output interface 11, an initialization message for assigning the device address to the devices 30-0, 30-1, . . . , and 30-N. The devices 30-0, 30-1, . . . , and 30-N receive and process the initialization message. For example, the first device 30-0 receives the initialization message over the input interface 21 and the device operation circuitry 23 thereof reads a device address from the received initialization message. In some implementations, the device address as it is read from the initialization message becomes the device address of the first device 30-0. The device operation circuitry 23 forwards the initialization message over the output interface 22 with a new device address. Each of the other devices 30-1, . . . , and 30-N performs a similar initialization process. Eventually, the controller operation circuitry 13 of the controller 10 receives over the input interface 12, an initialization response from which the device address of each memory device can be determined.

For example, for each of the devices 30-0, 30-1, . . . , and 30-N, the new device address that is forwarded to the next device is an increment of the present device address. Therefore, if the first device 30-0 is assigned an address of 0, the last device 30-N will be assigned an address of N, where the number of memory devices is (N+1). By receiving the initialization response over the input interface 12 indicating an incremented device address of the last device 30-N, the controller operation circuitry 13 can determine the device address of each memory device.

In an example of part 35-2, the controller operation circuitry 13 of the controller 10 is operable to send, over the output interface 11, an additional initialization message for reading a memory type with a target device address to the devices 30-0, 30-1, . . . , and 30-N.

For example, upon the first device 30-0 receiving such an additional initialization message over the input interface 21, the first device 30-0 determines, based on the device address ("a target device address") indicated in the additional initialization message, whether the additional initialization message is intended for the first device 30-0. If the target device address matches the assigned device address of the device 30-0, the first device 30-0 will respond to the additional initialization message over the output interface 22 with an identification of its memory type. If the additional initialization message is intended for one of the other device 30-1, . . . , and 30-N, the first device 30-0 will forward the additional initialization message over the output interface 22. Each of the other devices 30-1, . . . , and 30-N performs similar processing of the additional initialization message. The controller operation circuitry 13 of the controller 10 receives over the input interface 12, for each memory device, an initialization response indicating the memory type of the target memory device.

It is to be understood that the implementations described above for the controller operation circuitry 13 are very specific for example purposes only. Variations and modifications are possible. For example, the implementation is described above to involve a plurality of initialization messages for assigning the device address to each memory device; however, alternatively, there may be one or more initialization messages for this purpose. Also, the other implementation is described above to involve a plurality of additional initialization messages for determining the memory type of each memory device; however, alternatively, there may be one or more additional initialization messages for this purpose. In the examples described, the address of the received initialization message is established as the device address and a new address is generated and sent to the next device. In another implementation, each memory device receives an address and increments it before establishing this as the device address. Detail examples of this implementation are described in U.S. Provisional Patent Application No. 60/787,710 entitled "Serial Interconnection of Memory Devices" filed Mar. 28, 2006; U.S. Provisional Patent Application No. 60/802,645 entitled "Serial Interconnection of Memory Devices" filed May 23, 2006; and U.S. patent application Ser. No. 11/529, 293 entitled "Packet Based ID Generation for Serially Interconnected Devices" filed Sep. 29, 2006, the contents of which are hereby incorporated by reference in their entirety.

The examples provided above refer to interfaces. It is to be understood that there are many possibilities for such interfaces. Specific interfaces are provided in the examples that are described below. More generally, any appropriate interface may be implemented.

In some implementations, the controller 10 has a reset output (not shown) for connection with each of the devices 30-0, 30-1, . . . , and 30-N. Examples of this are provided in the examples that are described below. More generally, the memory system 40 may be reset using any appropriate resetting implementation.

In some implementations, the controller 10 has a serial clock output (not shown) for connection with each of the devices 30-0, 30-1, . . . , and 30-N. Examples of this are provided in the examples that are described below. More generally, the memory system 40 may be provided with a serial clock using any appropriate clock implementation.

In some implementations, the controller 10 has a chip select (not shown) for connection with each of the devices 30-0, 30-1, . . . , and 30-N. Examples of this are provided in the examples that are described below. More generally, the devices 30-0, 30-1, . . . , and 30-N can be enabled using any appropriate device enabling implementation.

In the following description and figures, some reference signs are used for signals and connections. For example, "SCLK" represents a clock signal and a clock input connection of a memory device; "SIP" represents a serial input signal and a serial input connection; "SOP" represents a serial output signal and a serial output connection; "IPE" represents an input enable signal and an input enable input connection; "OPE" represents an output enable signal and an output enable input connection; "CS#" represents a chip select signal and a chip select input connection or port; "RST#" represents a reset signal and a reset input connection or port. Also, the same reference signs are used for the same or corresponding blocks, connections, signals and circuitry.

FIGS. 3A, 3B, 3C, 3D, 3E and 3F show specific example memory systems according to embodiments of the present invention. It is to be understood that these Figures are very specific and are provided for example purposes only.

Figure 3A:
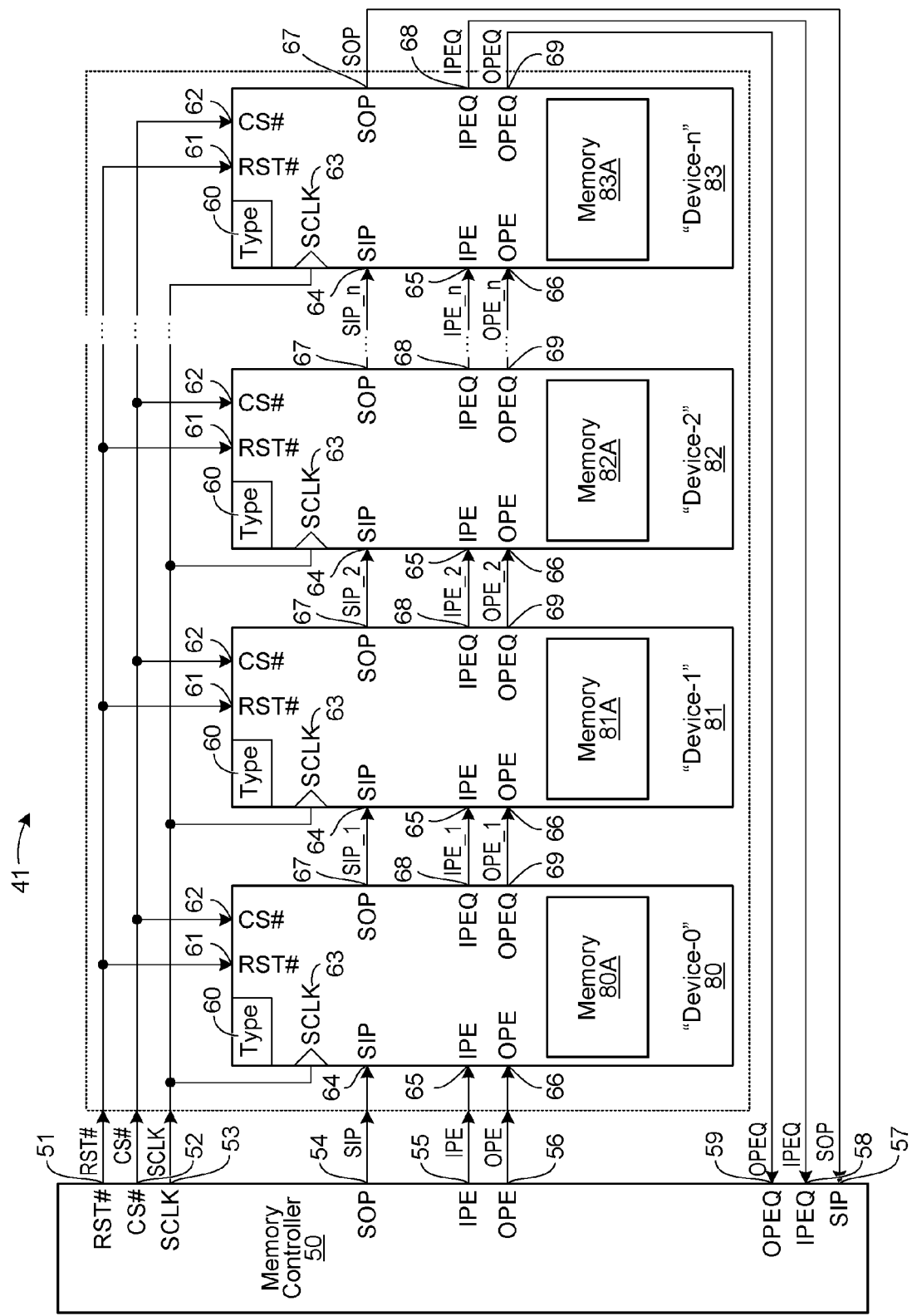
FIGS. 3A, 3B, 3C, 3D and 3E are schematics of specific example memory systems according to embodiments of the present invention.

FIG. 3A shows a first specific example memory system 41 that includes a memory controller 50 and a plurality of (n+1) memory devices, n being an integer. In this particular example, memory devices 80, 81, 82, . . . , and 83 are shown; however, more generally, there may be any appropriate number of memory devices.

Referring to FIG. 3A, the memory controller 50 has a reset port "RST#" 51, a chip select port "CS#" 52, and a serial clock port "SCLK" 53 connected to each of the memory devices 80, 81, 82, . . . , and 83. Accordingly, each of the memory devices 80, 81, 82, . . . , and 83 has corresponding ports: a reset port "RST#" 61, a chip select port "CS#" 62 and a serial clock port "SCLK" 63. The memory controller 50 has an output interface including a serial output "SOP" 54, an input enable "IPE" 55, and output enable "OPE" 56 connected to the first memory device 80. Accordingly, the first memory device 80 has a corresponding input interface including a serial input "SIP" 64, an input enable "IPE" 65 and an output enable "OPE" 66. The first memory device 80 also has an output interface including a serial output "SOP" 67, an input enable echo "IPEQ" 68 and an output enable echo "OPEQ" 69. Each of the other memory devices 81, 82, . . . , and 83 has corresponding input and output interfaces. Each of the input interface includes a serial input "SIP" 64, an input enable "IPE" 65 and an output enable "OPE" 66. Each of the output interfaces includes a serial output "SOP" 67, an input enable echo "IPEQ" 68 and an output enable echo "OPEQ" 69. Therefore, the memory devices 80, 81, 82, . . . , and 83 are interconnected through serial links. The memory controller 50 has an input interface including a serial input "SIP" 57, an input enable echo "IPEQ" 58 and an output enable echo "OPEQ" 59 for connection, respectively, with the output interfaces the serial output "SOP" 67, the input enable echo "IPEQ" 68 and the output enable echo "OPEQ" 69 of the last memory device 83.

The memory controller 50 has components (not shown) similar to those of the memory controller shown in FIG. 2B, but they are not shown for sake of simplicity.

The memory devices 80, 81, 82, . . . , and 83 have memory-type specific components such as respective memories 80A, 81A, 82A, . . . , and 83A. In the illustrated example, each of the memories 80A, 81A, 82A, . . . , and 83A is any type of memories, such as, for example, a flash memory, random access memory. Each of the memory devices 80, 81, 82, . . . , and 83 has device operation circuitry and interface circuitry (not shown) between its interfaces and its memory. Each of the memory devices 80, 81, 82, . . . , and 83 also has a type register 60 for maintaining an identification of its memory type. In other implementations, each of the memory devices 80, 81, 82, . . . , and 83 has alternative circuitry for maintaining the identification of its memory type. Each of the memory devices 80, 81, 82, . . . , and 83 may have other components, but they are not shown for sake of simplicity.

In operation, the memory system 41 operates in a similar manner as the memory system 40 described above with reference to FIG. 2B. However, for explanatory purposes, further exemplary details of the operation of the memory system 41 are provided below with reference to additional figures.

In the memory system 41 of FIG. 3A, the address scheme is a "type-independent" addressing scheme, that is, the device addresses are assigned regardless of the memory types. The assigned addresses are indicated as 'Device-0', 'Device-1', 'Device-2', . . . , and 'Device-n', assuming there are (n+1) memory devices. The device addresses are assigned in the initialization phase 35 (the address assignment part 35-1) as shown in FIG. 2C.

Figure 3B:
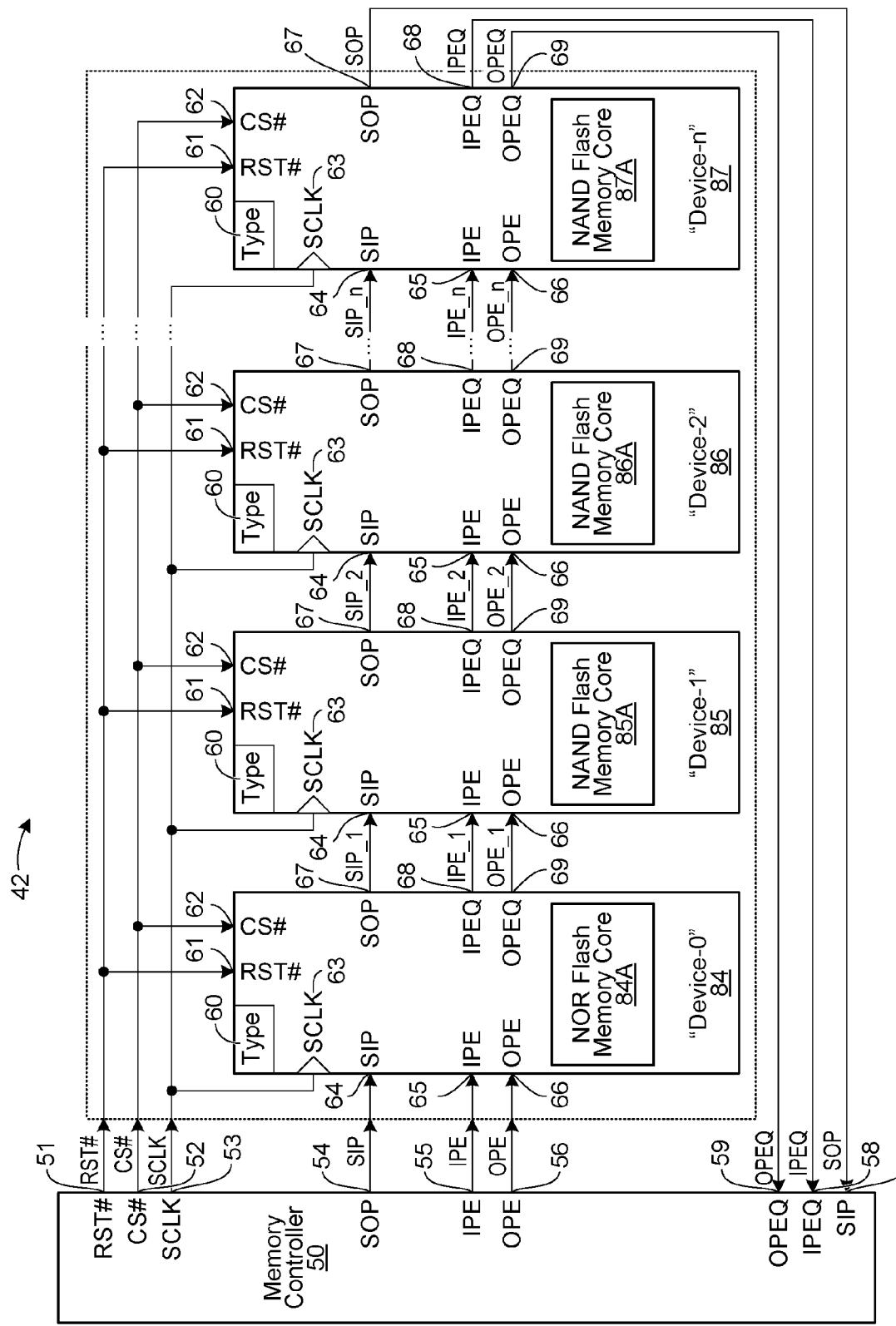

FIG. 3B shows a second specific example memory system 42. The memory system 42 is similar to the memory system 41 shown in FIG. 3A. The memory system 42 includes (n+1) memory devices 84, 85, 86, . . . , and 87 having the memory cores 84A, 85A, 86A, . . . , and 87A. In the particular example shown in FIG. 3B, the first memory device 84 has a NOR flash memory core 84A and the second, third, . . . , and (n+1)-th memory devices 85, 86, . . . , and 87 have NAND flash memory cores 85A, 86A, . . . , and 87A, respectively. The FIG. 3B example is more specific than the FIG. 3A example. However, the device addresses are assigned as regardless of the memory types, as consecutive "Device-0', 'Device-1', 'Device-2', . . . , and 'Device-n', in the initialization phase 35 (the address assignment part 35-1) as shown in FIG. 2C.

Figure 3C:
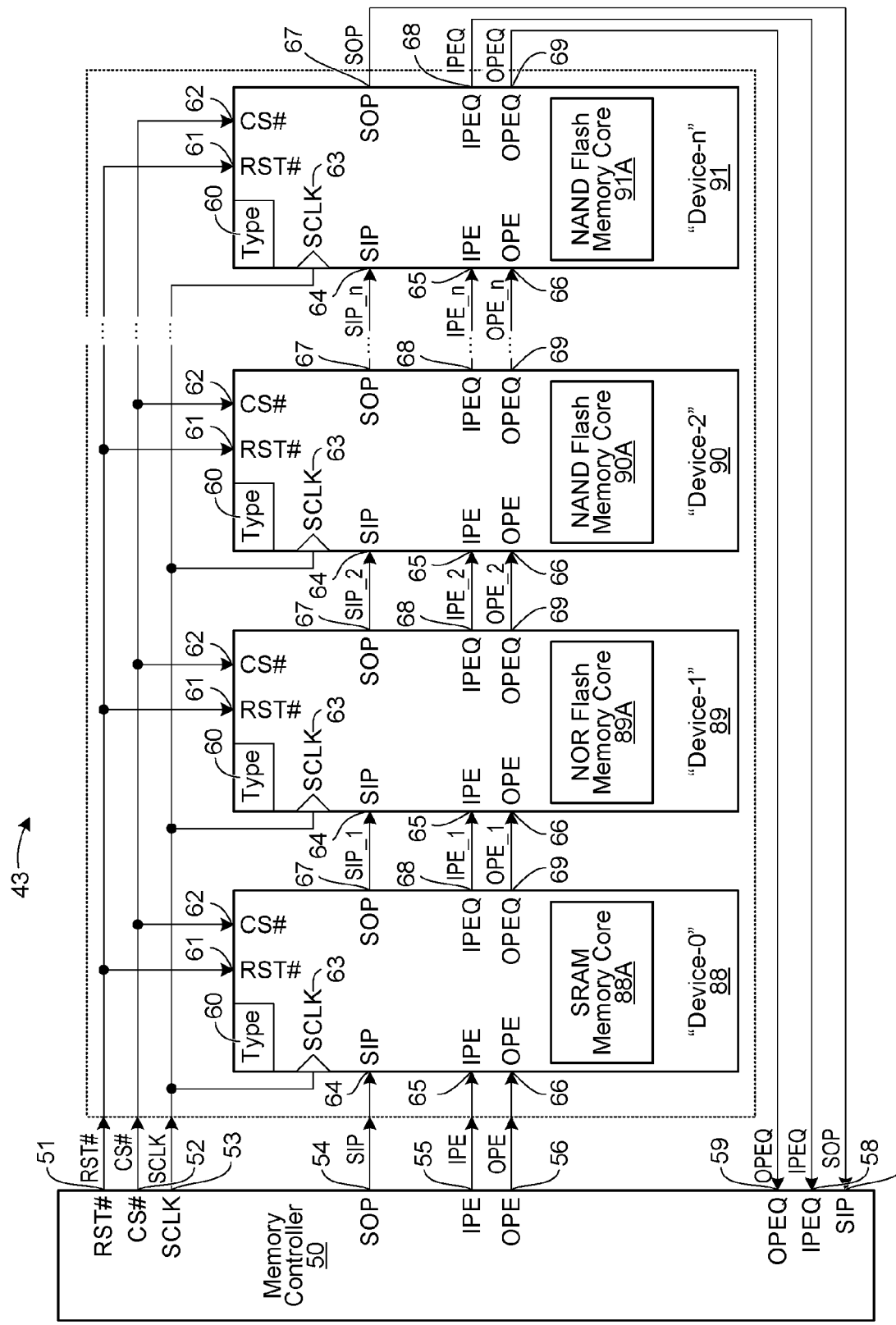

FIG. 3C shows a third specific example memory system 43. The memory system 43 is similar to the memory system 42 shown in FIG. 3B, except the memory system 43 has different memory devices. In the particular example shown in FIG. 3C, the memory system 43 includes a plurality (n+1) memory devices 88, 89, 90, . . . , and 91 having mixed memory cores 88A, 89A, 90A, . . . , and 91A, respectively. The first memory device 88 has an SRAM memory core 88A and the second memory device 89 has a NOR flash memory core 89A. The third memory device 90, . . . , and (n+1)-th memory device 91 have NAND flash memory cores 90A, . . . , and 91A, respectively. The memory devices are addressed in the same manner as that of FIGS. 3A and 3B. The assigned devices addresses are indicated as 'Device-0', 'Device-1', 'Device-2', . . . , and 'Device-n'.

Figure 3D:
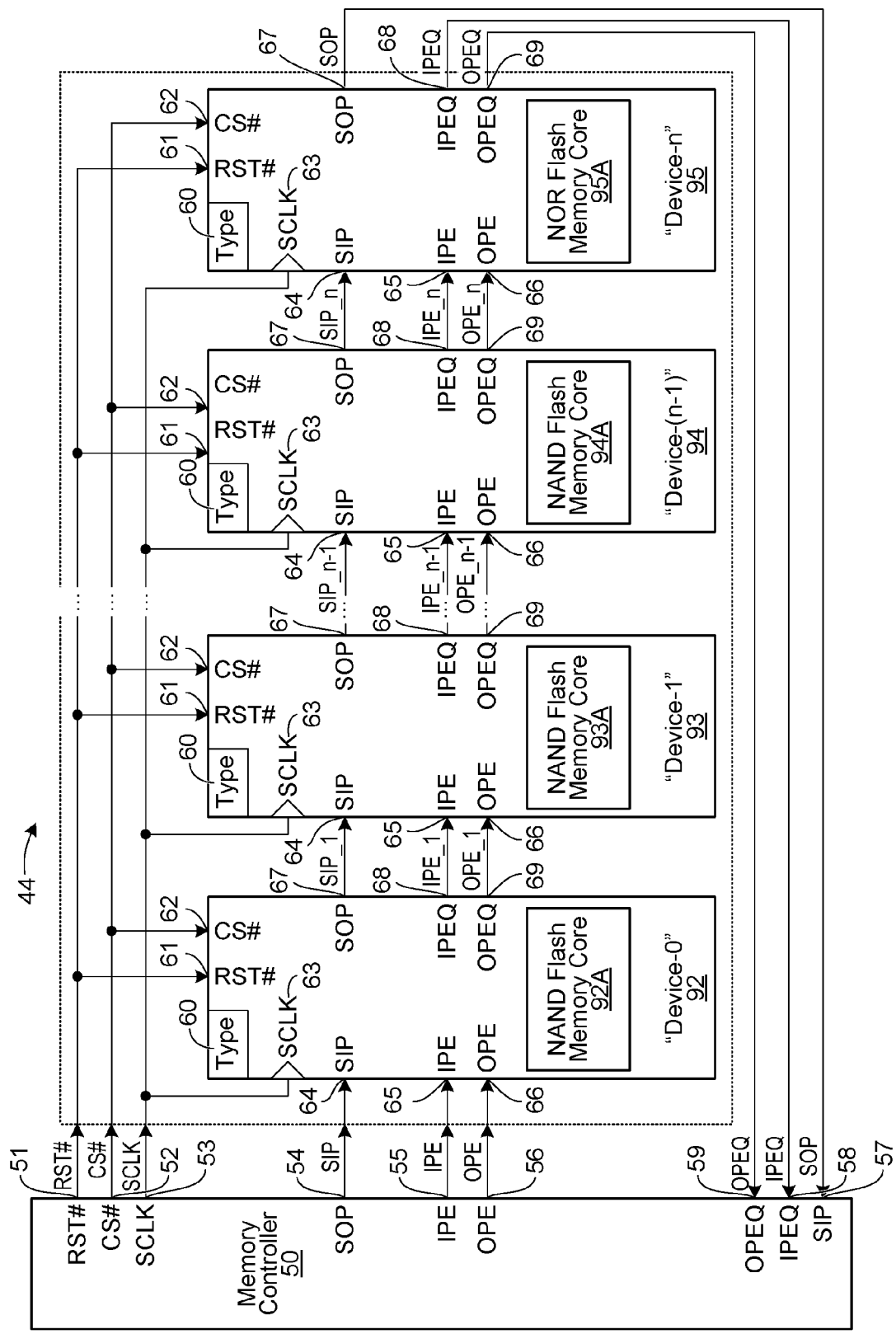

FIG. 3D shows a fourth specific example memory system 44 including a plurality (n+1) of memory devices. Referring to FIG. 3D, the memory system 44 is similar to the memory system 42 shown in FIG. 3B. The memory system 44 has different memory devices 92, 93, . . . , 94 and 95. In the particular example shown in FIG. 3D, the memory cores 92A, 93A, 94A, . . . , and 95A of the memory devices 92, 93, . . . , 94 and 95 are mixed. In the illustrated example, the first, second, third, . . . , and n-th memory devices 92, 93, . . . , and 94 have NAND flash memory cores 92A, 93A, . . . , and 94A, respectively. The last ((n+1)-th) memory device 95 has a NOR flash memory core 95A. The memory devices are addressed in the same manner as that of FIGS. 3A-3C. The assigned device addresses are indicated as 'Device-0', 'Device-1', . . . , 'Device-(n–1)', and 'Device-n', assuming there is 'n' NAND devices and one NOR device. Note the memory controller 50 would not be aware of the difference in physical layout between the examples of FIGS. 3B and 3D.

Figure 3E:
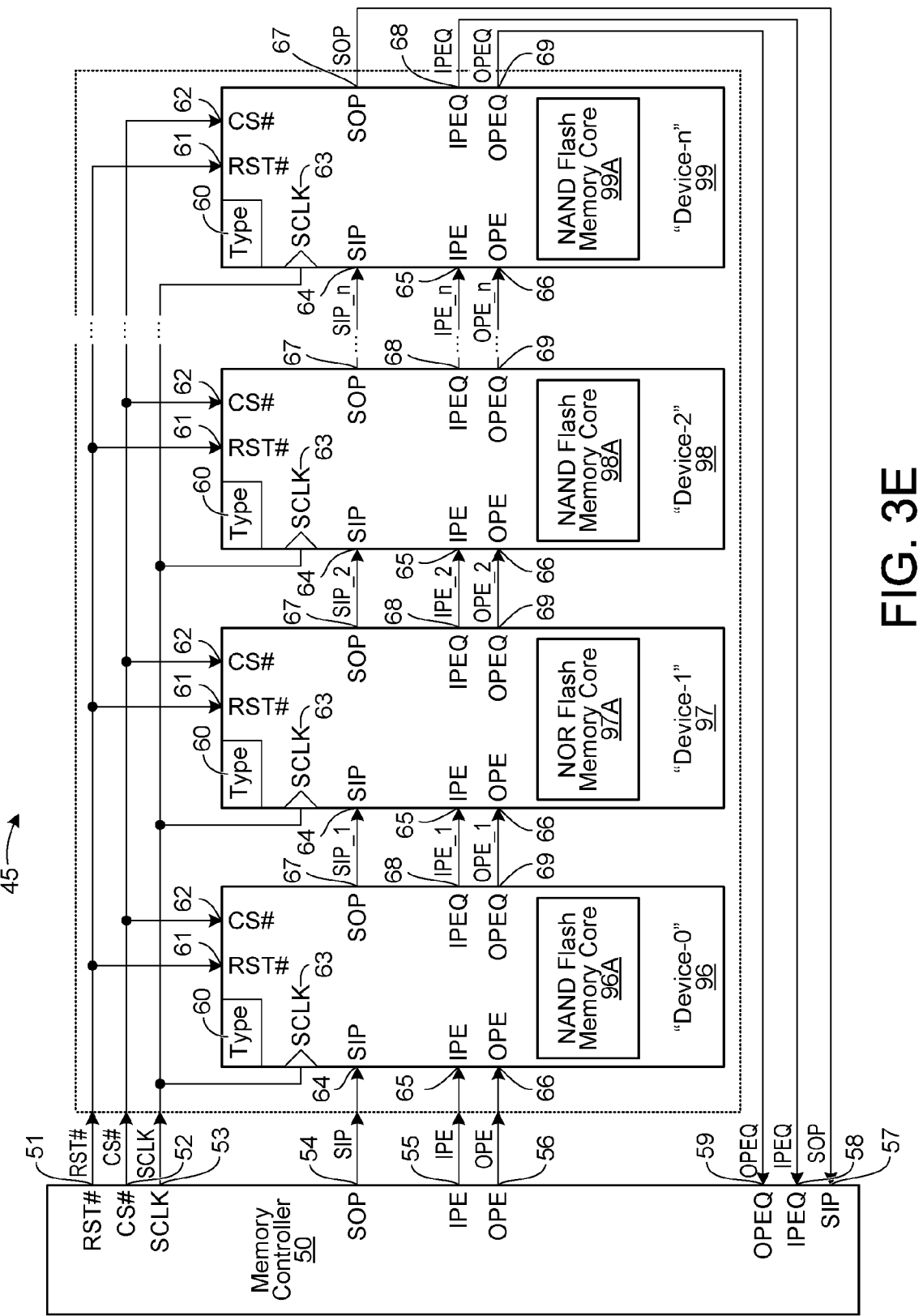

FIG. 3E shows a fifth specific example memory system 45. The memory system 45 is similar to the memory system 42 shown in FIG. 3B. The memory system 45 has different memory devices 96, 97, 98, . . . , and 99. In the particular example shown in FIG. 3E, the memory cores 96A, 97A, 98A, . . . , and 99A of the memory devices 96, 97, 98, . . . , and 99 are mixed. In the illustrated example, the first memory device 96 has a NAND flash memory core 96A. The second memory device 97 has a NOR flash memory core 97A. The third, . . . , and the last ((n+1)-th) memory devices 98, . . . , and 99 have NAND flash memory cores 98A, . . . , and 99A, respectively. The memory devices are addressed in the same manner as that of FIGS. 3A-3D. The assigned device addresses are indicated as 'Device-0', 'Device-1', 'Device-2', . . . , and 'Device-n'. Note that the memory controller 50 would not be aware of the difference in physical layout between the examples of FIGS. 3B, 3C and 3E.

It can be seen that the four examples of FIGS. 3B, 3C, 3D and 3E can be implemented with an identical circuit layout, identical memory controller 50, and 'lots' or 'sockets' for the memory devices, assuming that the memory controller 50 is capable of interacting with at least NOR flash devices, NAND flash devices and SRAM devices. Then, an arbitrary arrangement of the supported memory types can be installed in the 'lots' or 'sockets'.

Figure 3F:
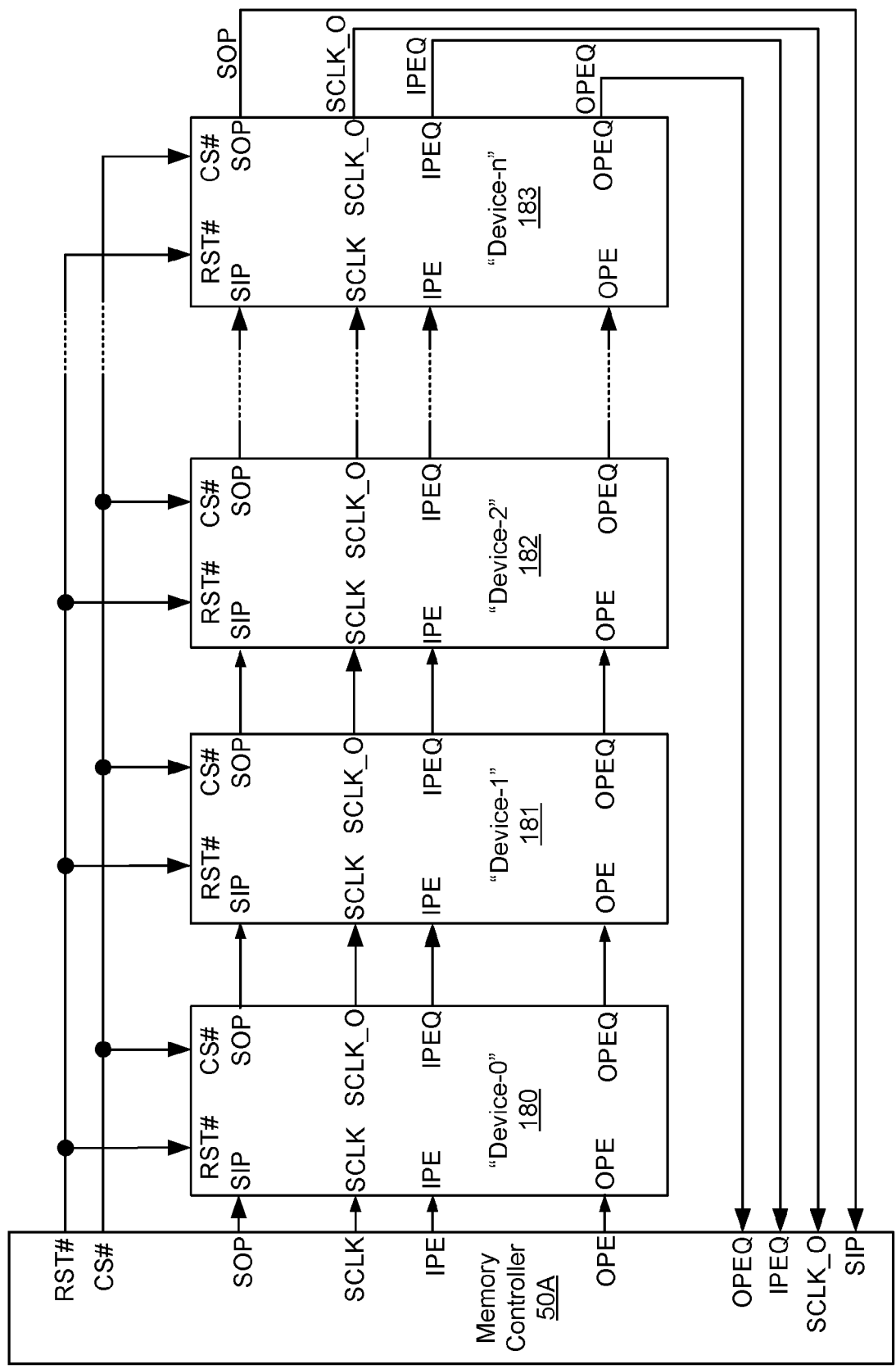
FIG. 3F is a schematic of another example memory system according to an embodiment of the present invention.

In each of the examples illustrated in FIGS. 3A-3E, the reset, the chip select and the serial clock signals are provided through the common links in a multi-drop manner. In another implementation as shown in FIG. 3F, the serial clock signal is connected in point-to-point ring type scheme with the addition of output echo clock signal, 'SCLK_O'. SCLK is a system clock to synchronize a memory controller 50A and memory devices 180, 181, 182, . . . , and 183. The memory controller 50A and the memory devices 180, 181, 182, . . . , and 183 operate as a master device and slave devices, respectively. The addresses assigned in the initialization phase are indicated as 'Device-0', 'Device-1', 'Device-2', . . . , and 'Device-n', assuming there are (n+1) memory devices.

In the examples presented, clocking is based on SDR (Single Data Rate); however, it is to be understood that other appropriate clocking schemes may be contemplated. Other appropriate clocking schemes may, for example, include DDR (Double Data Rate), QDR (Quad Data Rate), rising edge SDR or falling edge SDR. There may be other appropriate clocking schemes that may be contemplated, e.g., differential clock schemes like CK and CK# (CKO and CKO#) with SDR or DDR or QDR.

Figure 3G:
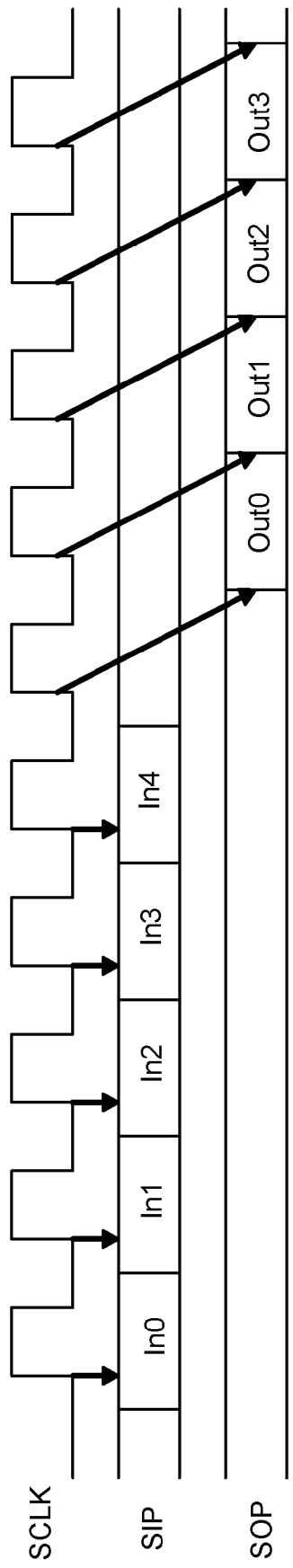
FIG. 3G is a timing diagram of example single data rate operation of memory devices.

FIG. 3G shows a relative timing sequence for an example SDR operation of memory devices. FIG. 3G shows operation in one port. Referring to FIGS. 3A and 3G, the operation is that information transferred to the devices 80, 81, 82, . . . , and 83 can be captured at different times of the clock signal SCLK fed to the serial clock ports 63 of the devices. In an example of the SDR implementation, information fed to one of the devices at its serial input 64 can be captured at the rising edge of the clock signal SCLK. In the SDR operation, the chip select signal is commonly fed to enable all devices at the same time, so that input data of the first device is transferable through the serial interconnection configuration. Alternatively, in the SDR operation, information fed to the device at the SIP connection may be captured at the falling edge of the clock signal SCLK.

Figure 3H:
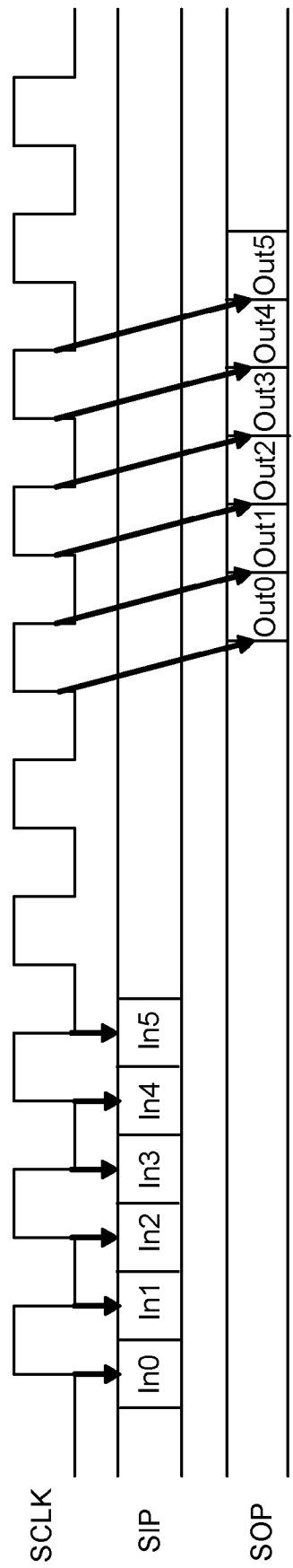
FIG. 3H is a timing diagram of example double data rate operation of memory devices.

FIG. 3H shows a relative timing sequence for an example DDR operation of memory devices. FIG. 3H shows operation in one port. In the DDR operation, both of the rising and falling edges of the clock signal SCLK can be used to capture information fed to the serial input 64.

Figure 4A:
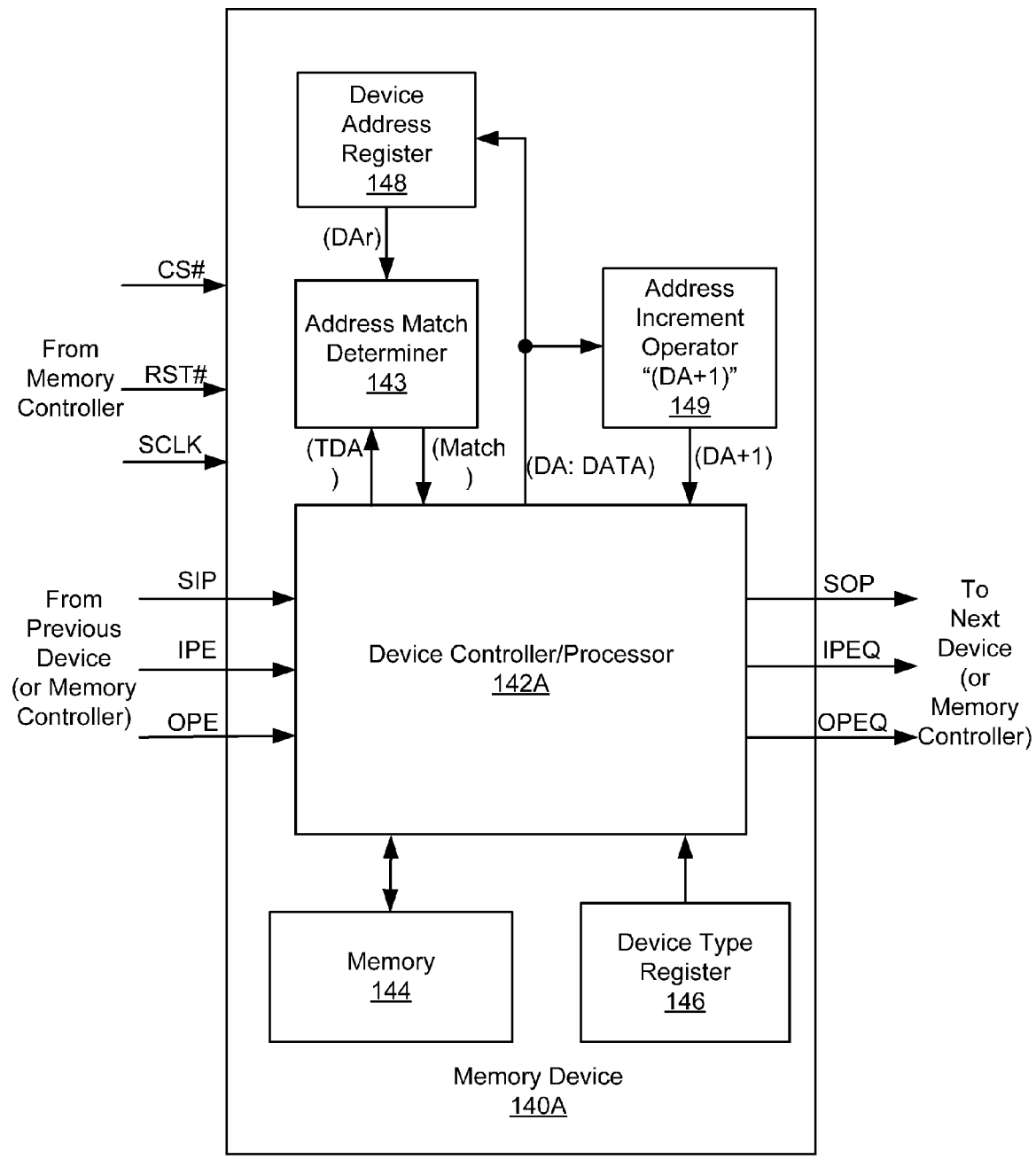
FIG. 4A is a schematic of an example memory device used as the memory devices shown in FIGS. 3A, 3B, 3C, 3D and 3E.
Figure 5A:
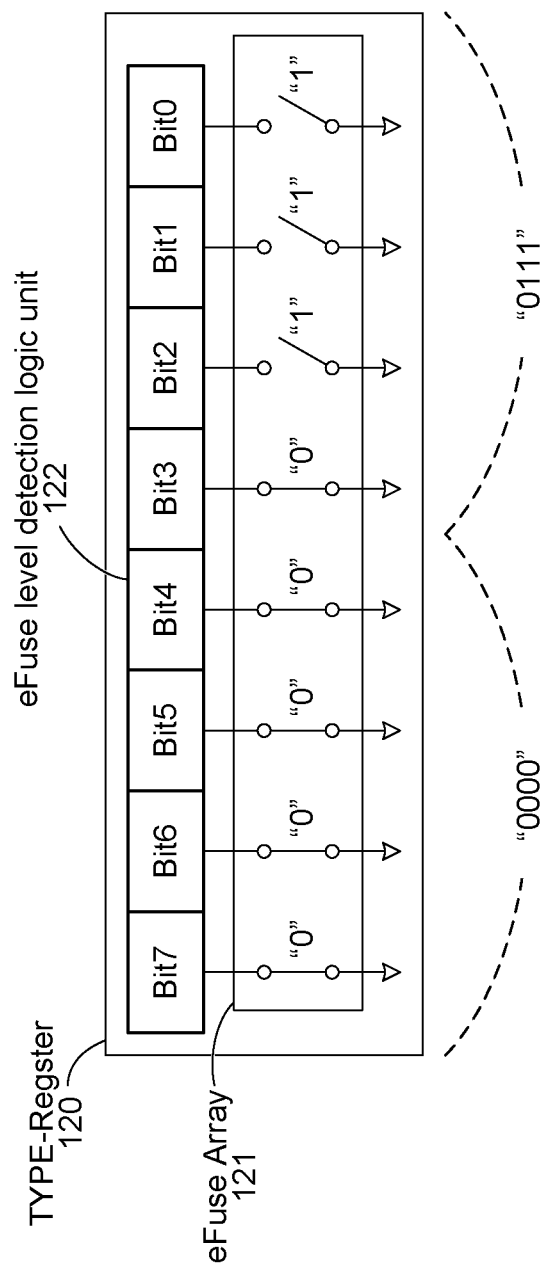
FIG. 5A is a schematic of an example register block used to identify a memory type.

FIG. 4A shows an example memory device block used as a memory device shown in FIGS. 3A-3E. A memory device 140A represents any one of the memory devices. Referring to FIG. 4A, the memory device 140A includes a device controller/processor 142A, an address match determiner 143, a memory 144, a device (or memory) type register 146, a device (or memory) address register 148 and an address increment operator 149. The device controller/processor 142A controls the operations of the memory device 140A. The memory 144 includes any type of memories, such as, for example, NAND flash memories, NOR flash memories, SRAMs and DRAMs. The device type register 146 includes the type register 60 for maintaining an identification of its memory type as shown in FIGS. 3A-3E. The device address register 148 holds an assigned device address (DA) by the device controller/processor 142A of that memory device 140A. Details of the device type register 146 are shown in FIG. 5A.

The device 140A has a reset port "RST#", a chip select port "CS#" and a serial clock port "SCLK" connected to the memory controller (e.g., the memory controller 50 as shown in FIG. 3A). The device controller/processor 142A is connected to a serial input "SIP", an input enable "IPE" and an output enable "OPE" of that memory device connected to the previous memory device. In a case where the memory device 140A is the first memory device of the serial interconnection configuration, the SIP, the IPE and the OPE are connected to the memory controller. Also, the device controller/processor 142A is connected to a serial output "SOP", an input enable echo "IPEQ" and an output enable echo "OPEQ" of that memory device connected to the next memory device. In a case where the memory device 140A is the last memory device of the serial interconnection configuration, the SOP, the IPEQ and the OPEQ are connected to the memory controller. The memory 144 corresponds to one used in any of the memory devices, i.e., any type of memories. The device type register 146 corresponds to the type register 60 for holding an identification of its memory type.

An example format of a memory command issued by the memory controller is formed as:

| Memory Command (1) | | |
|---|---|---|
| TDA (xxh) | CMD (yyh) | DATA (zzh) |

TDA is a target device address for identification of a specific memory device. CMD is an operation command to be executed by the target memory device. DATA contains information (a number or value) on process or control for the memory device. For example, a target memory device is "Device-0", TDA will be '00h'. If the operation of the target device is a "write device address", CMD will be '39h'. If a device address is "00", DATA will be '00h'. Such a memory command format is formed as:

| Memory Command (2) | | |
|---|---|---|
| TDA (00h) | CMD (39h) | DATA (00h) |

If the memory controller targets, for example, Device-2, TDA will be "02h". In a case where a device address is generated by address increment operation of the memory device (e.g., 01h=DATA+1), the number of DATA is replaced with the generated device address. If the operation of the memory device requested by the memory controller is, for example, to read the device type of a specified memory device, CMD will be a "read device type". Examples of various operation commands will be later described in conjunction with Table 1.

If no target device address is, however, necessary, an example format of a memory command will include CMD and DATA. Such a memory command is formed as:

| Memory Command (3) | |
|---|---|
| CMD (39h) | DATA (zzh) |

The address match determiner 143 under control by the device controller/processor 142A determines whether the memory command is addressed to that memory device 140A in response to the device address contained in the serial input (SIP). For example, the address match determiner 143 first determines whether a target device address (TDA) contained in the SIP matches the device address (DAr) held in the device address register 148 of that memory device 140A. If there is a match between the two device addresses, the address match determiner 143 will provide a match indication to the device controller/processor 142A to execute the received command contained in the SIP. Otherwise, the device controller/processor 142A forwards the command over the SOP. In the device address assignment operation, in response to the match indication, the received device address (DA) of DATA is registered in the device address register 148 and the address increment operator 149 performs a function of a device address increment (i.e., "DA+1"). The incremented device address (DA+1) is provided to the device controller/processor 142A. The received device address (DA) or the incremented device address (DA+1) is forwarded over the SOP in the case of a non-device address match or a device address match.

Figure 4B:
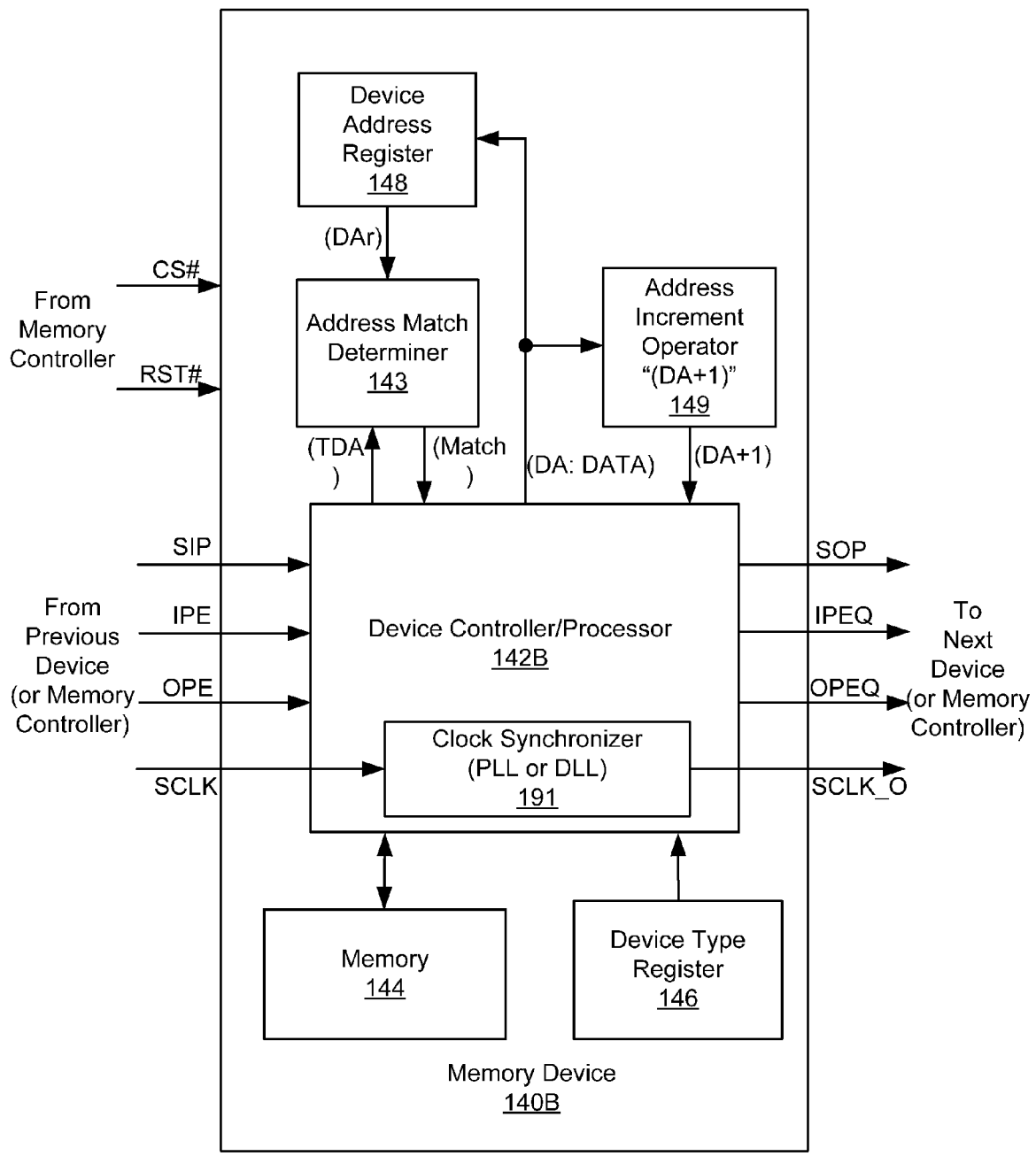
FIG. 4B is a schematic of an example memory device used as the memory devices shown in FIG. 3F.

FIG. 4B shows an example memory device used as a memory device shown in FIG. 3F. A memory device 140B shown in FIG. 4B represents any one of the memory devices shown in FIG. 3F. The memory device 140B is similar to the memory device 140A shown in FIG. 4A. A device controller/processor 142B of the memory device 140B includes a clock synchronizer 191 for outputting an output clock synchronized with an input clock that is fed thereto. For example, the clock synchronizer 191 includes a phase-locked loop (PLL) or a delay-locked loop (DLL). The other operations of the device 140B are the same as those of the device 140A.

In the examples presented above with reference to FIGS. 3A-3F, each of the memory devices has a register (e.g., the device type register 146). For example, flash memories (e.g., NAND flash, NOR flash memories) contain factory programmed registers inside the device utilizing spare sections of flash cell core arrays in order to identify useful information, for example, a manufacturer code, a memory density, a page size, a block size, a number of banks, an I/O configuration, or any critical AC/DC characteristics. As noted above, in some implementations, the register is used for maintaining an identification of memory type. There are many ways for a register to indicate a memory type. An example of the device type register 146 is provided below with reference to FIG. 5A.

Referring to FIG. 5A, an example register block 120 has a type-register, which is a type of physical hard programmable register unit. The register block 120 has an eFuse (electrically programmable fuse) array 121 and an eFuse level detection logic unit 122. In the illustrated example, the eFuse array 121 is shown with an eight-bit configuration of bits 7, 6, 5, . . . , 1 and 0. In this particular example, first four bits 7-4 are '0000' and second four bits 3-0 are '0111'. This represents '07h' (=00000111), for example. In a specific implementation, this configuration indicates a PCRAM memory type. Different configurations may indicate different memory types. In the illustrated example, 'closed' and 'open' fuses indicate '0' and '1', respectively. Such '0' and '1' logics are detected by the eFuse level detection logic unit 122 and detected bit status (bits 7-0) are provided to the device controller/processor 142A shown in FIG. 4A (or the device controller/processor 142B shown in FIG. 4B). Alternatively, the register block 120 may have conventional poly or metal Fuse, OTP (One Time Programmable memory), or any non-volatile programmable components.

FIG. 5B shows a table of an example encoding scheme for each memory type. The table of FIG. 5B defines the encoding scheme for each of 10 memory types: NAND Flash, NOR Flash, DRAM, SRAM, PSRAM, DiNOR Flash, FeRAM, PCRAM, Serial EEPROM, and MRAM. In the table, 'RFU' means 'Reserved for Future Usage'. For example, the SRAM memory type has an encoding scheme of '03h'. The NAND flash type is assigned as '00h', while NOR flash type is assigned as '01h'. In this example, the bit structure is the MSB (most significant bit) to the LSB (least significant bit). In other implementations, it can be reversed in order, which starts from the LSB first instead of MSB. Some register configurations are reserved for future use (RFU). For example, if a DRAM is used for the memory 80A of the device 80 shown in FIG. 3A, the type register 60 (or the device type register 146 of FIGS. 4A and 4B, the type register block 120 of FIG. 5A) outputs a device type indication "00000010" (MSB to LSB) to the controller/processor.

An example when a memory device is receiving data and forwarding data to a next memory device in a memory system is provided below with reference to FIG. 6.

Figure 6:
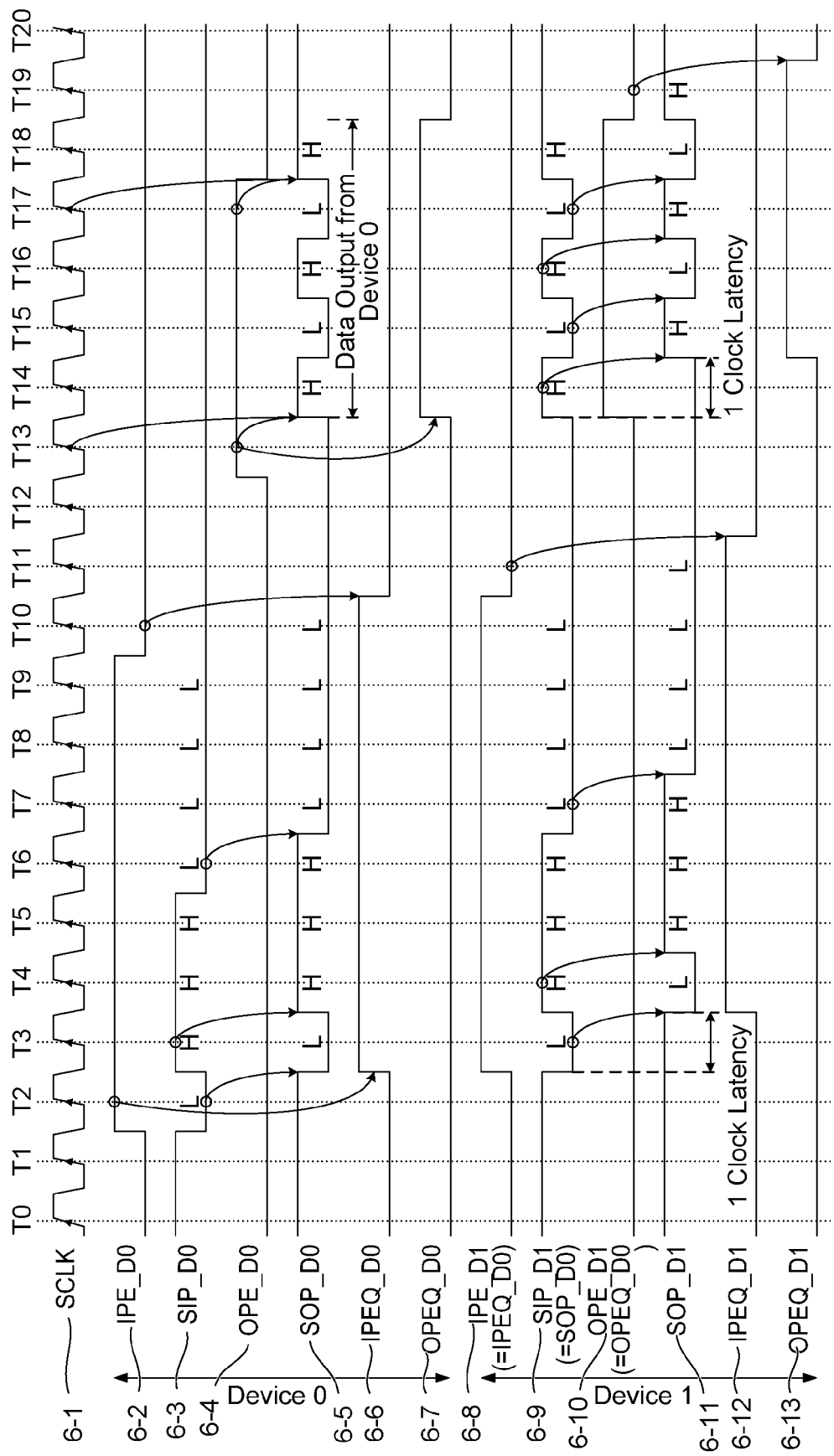
FIG. 6 is a timing diagram of example signaling through two adjacent memory devices.

FIG. 6 shows a timing sequence of example signaling through two adjacent memory devices of each of the memory systems shown in FIGS. 3A-3F. This timing diagram is applicable to each pair of adjacent memory devices of the example memory system described above. In this example, the first device, named Device 0, and the second device, named Device 1, are chosen for the purpose of description. The suffix '_D0' and '_D1' in every signal name represent two devices, Device 0 and Device 1, respectively, for the purpose of description. At the top of the timing diagram, a signal is plotted for the serial clock (SCLK) as indicated by 6-1. The timing diagram includes signals for the input interface of Device 0, namely the input enable (IPE_D0), the serial input (SIP_D0) and the output enable (OPE_D0) as indicated by 6-2, 6-3 and 6-4, respectively. Also, the timing diagram includes signals from the output interface of Device 1, namely the serial output (SOP_D0), the input enable echo (IPEQ_D0) and the output enable echo (OPEQ_D0) as indicated by 6-5, 6-6 and 6-7, respectively. The timing diagram includes signals from the input interface of Device 1, namely the input enable (IPE_D1), the serial input (SIP_D1) and the output enable (OPE_D1) as indicated by 6-8, 6-9 and 6-10, respectively. The signals input to the input interface of the second memory device, Device 1, are identical to the signals output from the output interface of the first memory device, Device 0. Therefore, the IPE_D1, the SIP_D1 and the OPE_D1 are identical to the IPEQ_D0, the SOP_D0 and the OPEQ_D0, respectively. Furthermore, the timing diagram includes signals from the output interface of Device 1, namely the serial output (SOP_D1), the input enable echo (IPEQ_D1) and the output enable echo (OPEQ_D1) as indicated by 6-11, 6-12 and 6-13, respectively.

The timing diagram is provided only for description purpose; therefore all waveforms are not showing real operation. At time T2, IPE_D0 6-2 is a logic 'high' state on the rising edge of the SCLK 6-1, which means the beginning of serial data stream-in through SIP_D0 6-3. Next, Device 0 starts to receive SIP_D0 6-3 and processes appropriate operation according to the serial stream-in information. Also, Device 0 echoes the logic 'high' state of IPE_D0 6-2 to IPEQ_D0 6-6, which is connected to the IPE port of Device 1. Also, stream-in data of SIP_D0 6-3 is echoed to SOP_D0 6-5, which is connected to the SIP port of Device 1. This procedure continues until time T10, where a logic 'low' state of IPE_D0 6-2 is detected on the rising edge of the SCLK 6-1. In Device 1, IPE_D1 6-8 shows the same signal waveforms logically with IPEQ_D0 6-6 signal in Device 0 because IPEQ_D0 6-6 connects to IPE_D1 6-8 directly through a wire or other interconnecting method. Also, SIP_DL 6-9 shows the same signal waveforms logically with SOP_D0 6-5 signal in Device 0 because SOP_D0 6-5 connects to SIP_D1 6-9 directly through a wire or other interconnecting method. In Device 1, similar procedure as in Device 0 occurs, resulting in echoing of SIP_D1 6-9 to SOP_D1 6-11 and IPE_D1 6-8 to IPEQ_DL 6-12.

In the illustrated example, there is one clock cycle latency for the echoing procedure. However, more generally, any appropriate clock cycle latency may be implemented. For example, clock cycle latencies of a half clock cycle, two clock cycles, or more than two clock cycles may be implemented. The clock cycle latency through each memory device determines the total clock latency of the memory system. Assuming a one-clock cycle latency and four devices (Devices 0-3) in the memory system, then the SOP_D3 and IPEQ_D3 of the last device (i.e., Device 3) will have four clock cycles of latencies from the original SIP_D0 6-3, IPE_D0 6-2 signals. From time T13 to time T17 in Device 0, OPE_D0 6-4 signal is active, causing the serial output operation from Device 0 through the signal SOP_D0 6-5. At time T13, OPE_D0's 6-4 logic 'high' state is detected on the rising edge of SCLK 6-1, then Device 0 starts to output serial data stream through SOP_D0 6-5 port according to the device's previous condition. In this example, Device 0 is selected to output serial data, and Device 1 is not selected; therefore, Device 1 just echoes SIP_D1 6-9 signal (same to SOP_D0 6-5) to the SOP_D1 6-11 port. Serial output operation along with OPE ports has the same clock latency as the serial input procedure.

Example details will now be provided in the context of the examples presented above with reference to FIGS. 3A-3F. These details relate to implementations with type-independent addressing. In these implementations, the memory type does not play a role for addressing purposes. It is to be understood that these details provided in this section are very specific for example purposes only. There are many ways to implement the initialization phase 35 shown in FIG. 2C. A process for assigning the device addresses with type-independent addressing is described below with reference to FIG. 7.

Figure 7:
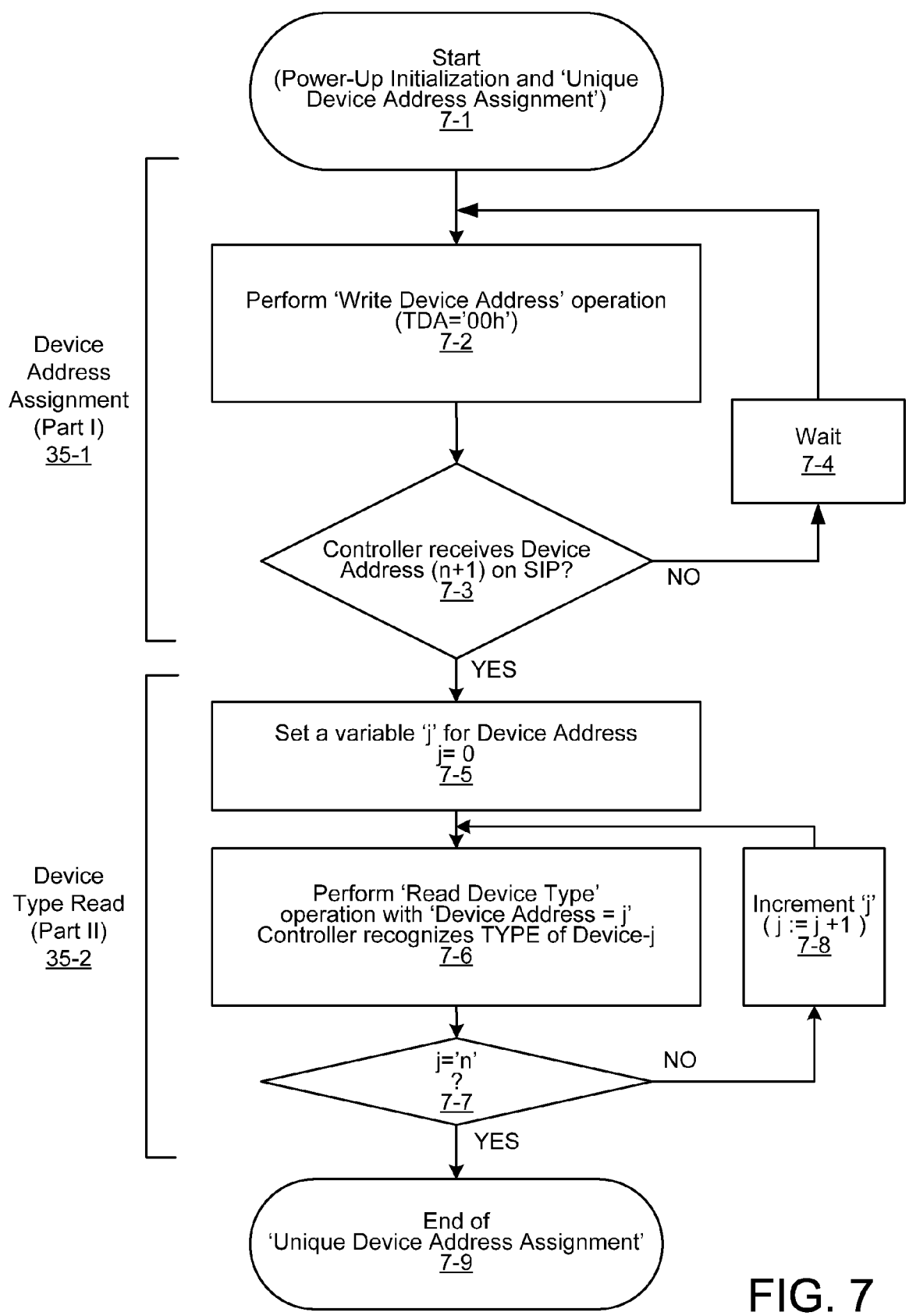
FIG. 7 is a flowchart of a method of initializing a memory system with type-independent addressing.

FIG. 7 shows a method of initializing a memory system with type-independent addressing. It is to be understood that this process is very specific for example purposes only. This particular example method is one application of the initialization phase 35 shown in FIG. 2C. The method includes the address assignment (part I) 35-1 and the device address read (part II) 35-2 as shown in FIG. 2D.

Referring to FIGS. 2B, 2C, 2D, 3A, 4A and 7, when there is a power-up initialization (step 7-1), then the memory controller 10, 50 performs a write device address operation (step 7-2). The write device address operation has a target device address (TDA) of '00h' because all of the memory devices 80, 81, 82, ..., and 83 have a device address initially set to '00h' during power-up. In this case, the memory command is one previously described as "Memory Command (2)". When the write device address operation traverses each memory device, its target device address remains '00h' so that each memory device processes the write device address operation. Each of the memory devices 80, 81, 82, ..., and 83 is assigned its device address based on the device address indicated by the write device address operation. The device address register 148 holds the assigned device address. The address increment operator 149 of each memory device increments the device address indicated by the write device address operation before forwarding it to the next memory device. Eventually, the write device address operation makes it way back to the memory controller 50. If the write device address operation arrives back at the memory controller 50 as indicated by signals input enable echo (IPEQ) and serial input (SIP) (YES at step 7-3) with a wait (step 7-4), the memory controller 50 will determine the number of memory devices '(n+1)' from the device address 'n+1' indicated by the write device address operation. The number 'n+1' is included in DATA of the memory command. At this point, the memory controller 50 is aware of the device address of each memory device. However, the memory controller 50 may not be aware of the memory type of each memory device. Therefore, as shown in steps 7-5 through 7-9, further initializations may be performed to determine the memory type of each of the memory devices 80, 81, 82, ..., and 83.

For the write device address operation, the memory controller 50 sends the target device address (TDA '00h') and an initial device address number (DATA '00h') as the SIP. At step 7-2, each of the "target" devices performs the device address match determination and device address assignment operations. As shown in FIG. 4A, in the representing device 140A, under control by the device controller/processor 142A, the address match determiner 143 determines whether the received target device address (TDA) matches the device address (DAr) held in the device address register 148. Because the registers 148 of all devices are reset at the power-up initialization (step 7-1), the device address held in the device address register 148 is '00'. There is, therefore, a device address match indication between the target device address and the device address held in the register 148. Then, in response to the device address match result, the device address register 148 registers or holds the device address number (DATA as DA) fed from the previous device through the device controller/processor 142A. Also, the address increment operator 149 increments the fed device address number (DATA as DA), so that the number or data is incremented (i.e., DATA (or DA)+1). The incremented number as a new device address is provided to the device controller/processor 142A, which in turn transfers it to the next device over the SOP.

At step 7-5, the memory controller 50 sets a variable 'j' for device address to zero. At step 7-6, for device address 'j', the memory controller 50 performs an operation to read the device (or memory) type based on the device address j (which is a target device address). If the address 'j' is not equal to the number or value 'n' of the last memory device 83 of the serial interconnection configuration (NO at step 7-7), the memory controller 50 will increment 'j' (step 7-8) and repeats the operations of step 7-6. Steps 7-6, 7-7, and 7-8 are repeated until 'j' is equal to 'n' (YES at step 7-7). At this point, the memory controller 50 has issued a respective operation to read the memory type for each memory device. Therefore, the process of initializing the memory system 41 that has type-independent addressing is complete (step 7-9).

For the read device type operation at step 7-6, the memory controller 50 sends the target device address (TDA) with reference to variable "j" (which is initially '00h') as the SIP. As shown in FIG. 4A, in the representing device 140A, under control by the device controller/processor 142A, the address match determiner 143 determines whether the target device address (TDA) matches the assigned device address (DAr) held in the device address register 148. In a case where there is a device address match between the two device addresses, the device controller/processor 142A reads the memory type held in the device type register 146. The read memory type of the device 140A together with the TDA is transferred to the next device over the SOP.

The devices of the serial interconnection configurations perform operations in response to commands issued by the memory controller. Table 1 shows examples of memory operations and command bytes.

TABLE 1

| Operation | Command (1 Byte) |
|---|---|
| Page Read | 00h |
| Random Data Read | 05h |
| Page Program | 10h |
| Chip Erase | 20h |
| Sector Erase | 21h |
| Page Read for Copy | 35h |
| Write Device Address | 39h |
| Block Erase | 60h |
| Read Status | 70h |
| Serial Data Input (Write to Buffer) | 80h |
| Random Data Input | 85h |
| Target Address Input for Copy | 8Fh |
| Read Device Type | 90h |
| Write Configuration Register | A0h |
| Program/Erase Suspend | C0h |
| Program/Erase Resume | D0h |
| Reset | FFh |

Figure 8A:
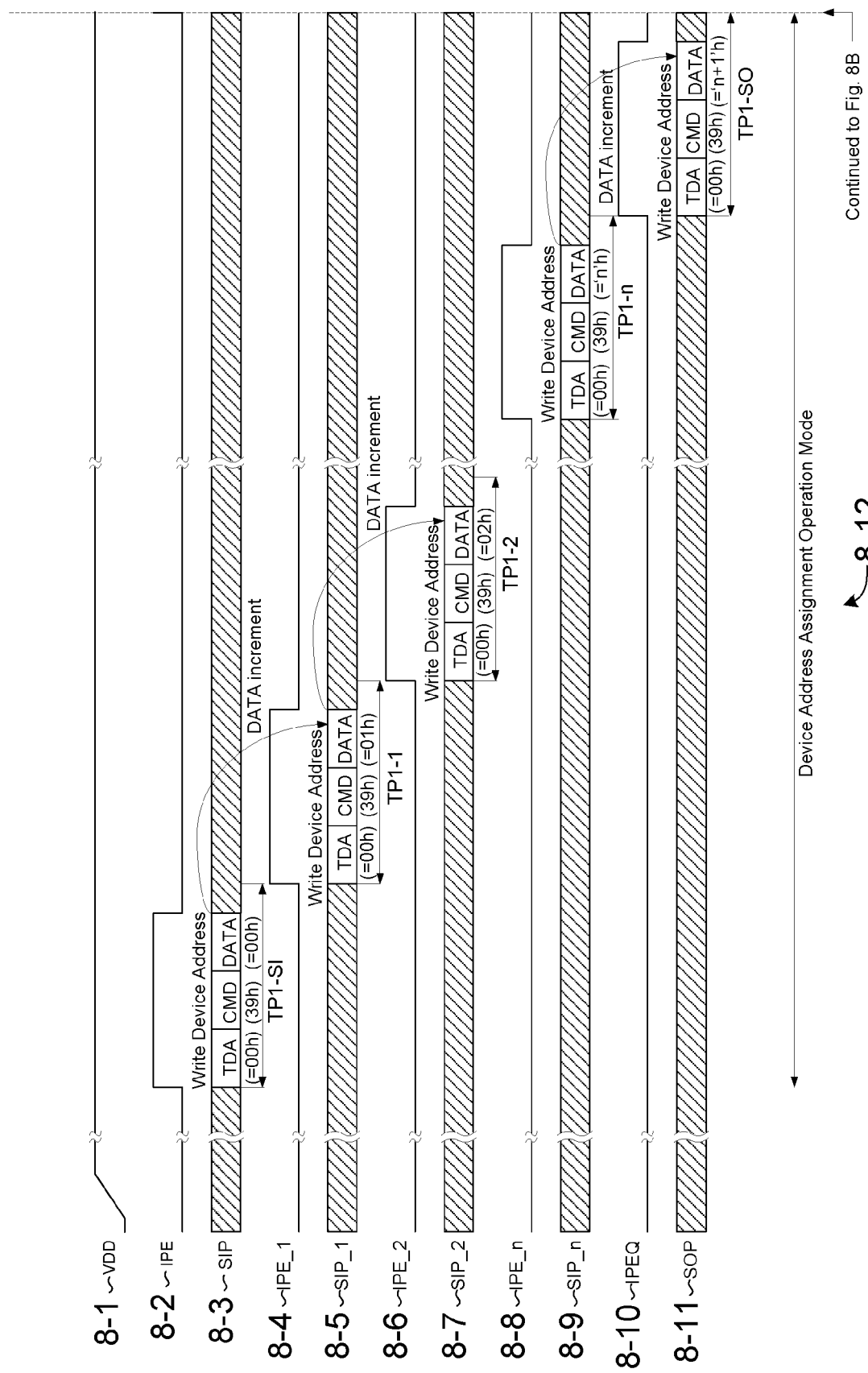
FIGS. 8A and 8B are timing diagrams of initializing the memory system by the method shown in FIG. 7.
Figure 8B:
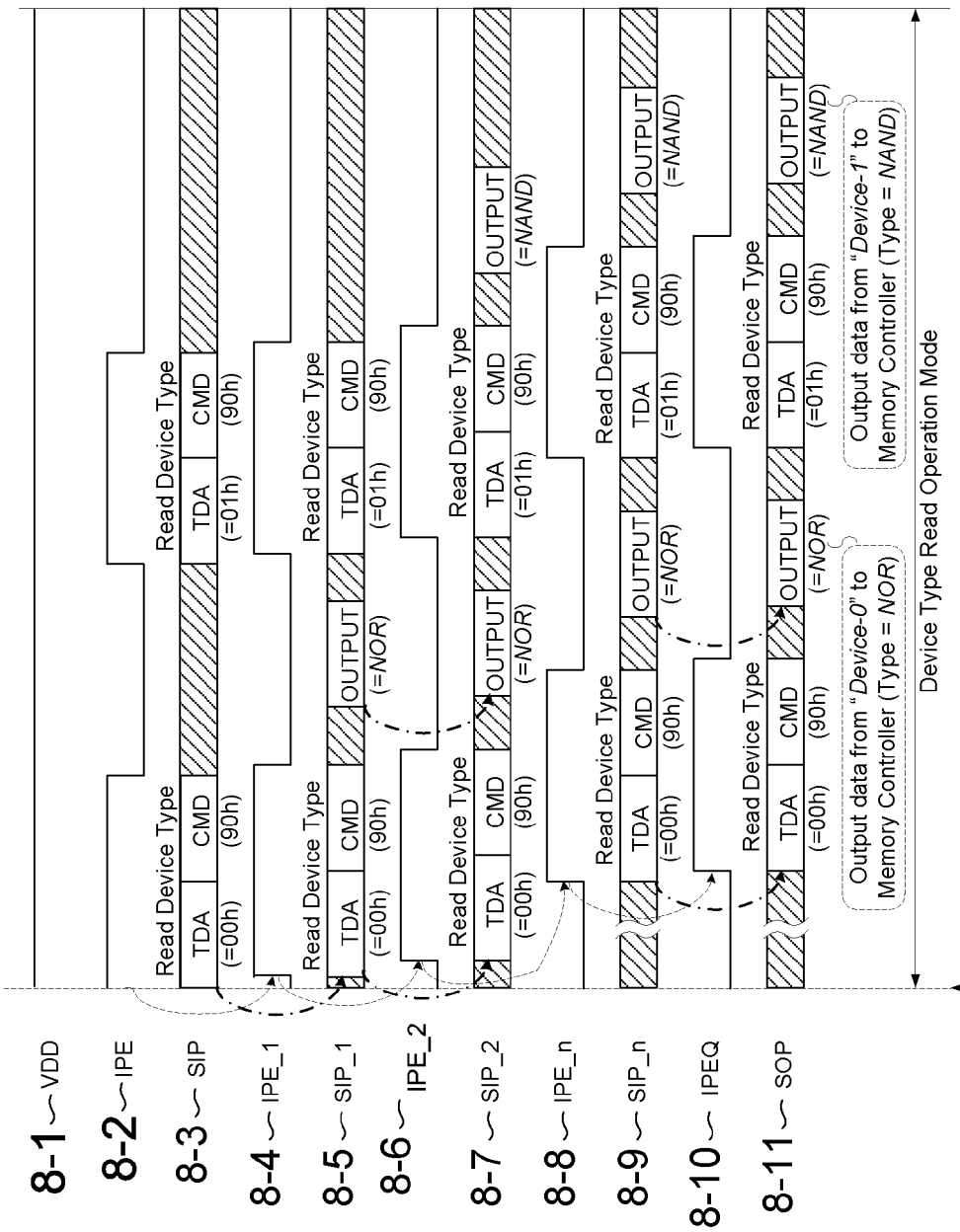

Further explanation of the process described above will be provided with reference to timing diagrams shown in FIGS. 8A and 8B.

FIGS. 8A and 8B show timing sequences for the signals for initializing the memory systems by the method shown in FIG. 7. The timing diagram of FIG. 8A shows example signals that may result from the memory system 41 of FIG. 3A. The timing diagram of FIG. 8B shows example signals that may result from the memory system 42 of FIG. 3B.

Referring to FIGS. 3A, 4A and 8A, the memory system 41 has (n+1) memory devices 80, 81, 82, ..., and 83 of unknown type interconnected. At the top of the timing diagram of FIGS. 8A and 8B, there is a signal for power (VDD) as indicated by 8-1. The timing diagram includes signals for the input enable (IPE) and the serial input (SIP) for Device-0 as indicated by 8-2 and 8-3, respectively. The timing diagram includes signals for the input enable (IPE_1) and the serial input (SIP_1) for Device-1 as indicated by 8-4 and 8-5, respectively. The timing diagram includes signals for the input enable (IPE_2) and the serial input (SIP_2) for Device-2 as indicated by 8-6 and 8-7, respectively. The timing diagram includes signals for the input enable (IPE_n) and the serial input (SIP_n) for Device-n as indicated by 8-8 and 8-9, respectively. Finally, the timing diagram includes signals for the input enable echo (IPEQ) and the serial output (SOP) for the device controller 50 as indicated by 8-10 and 8-11, respectively.

The memory system 41 is powered on as indicated by VDD 8-1 transitioning to a high state. Soon after this, in a device address assignment operation mode indicated by 8-12, a write device address operation is issued by the memory controller 50. The operations of the device address assignment operation mode correspond to the operations conducted as part I of the initialization phase I as shown in FIGS. 2C and 2D. The write device address operation traverses each memory device. Each of the memory devices 80, 81, 82, ..., and 83 is assigned its device address based on the device address indicated by the write device address operation as described above. Each memory device increments the device address indicated by the write device address operation before forwarding it along to the next memory device. There are n+1 increments corresponding to 'n+1' memory devices. Eventually, the write device address operation makes it way back to the memory controller 50. At this point, the memory controller 50 determines the number of memory devices to be 'n+1', as this is indicated by the write device address operation.

The "write device address" operation by one device is performed during a time period of the input enable (IPE) is logic high and the device address transfer is completed before the next device performs the "write device address" operation.

In the illustrated example, during the time period TP1-SI between the IPE transition to high and the IPE_1 transition to high, the device 80 is set as "Device-0", then bypass the whole message to next device with DATA increment. During the time period TP1-1 between the IPE_1 transition to high and the IPE_2 transition to high, the device 81 is set as "Device-1", then bypass the whole message to next device with DATA increment. Similarly, during the time period TP1-2, the device 82 is set as "Device-2", then bypass the whole message to next device with DATA increment. During the time period TP2-n, the device 83 is set as "Device-n", then bypass the whole message to next device with DATA increment. During the time period TP1-SO, the memory controller 50 receives this feedback message, then reconizes total number of device is "n+1".

After the device addresses are assigned to the devices, the device type read operation is conducted. In a memory type read operation mode indicated by 8-13, the memory controller 50 recognizes the memory type of each the memory devices 80, 81, 82, . . . , and 83. The operations of the memory type read operation mode correspond to the operations conducted as part 11 of the initialization phase I as shown in FIGS. 2C and 2D. The memory controller 50 accomplishes this by issuing a read type command for each device address to read the memory type of the memory device addressed by the device address as described above.

FIG. 8B shows example signals in the memory system 42 shown in FIG. 3B. The memory system 42 includes one NOR-type flash device 84 and n NAND-type flash devices 85, 86, . . . , and 87 interconnected.

Referring to FIGS. 3B, 4A and 8B, the memory controller 50 issues a first read device type message that includes a device address of '00h' (the target device address(TDA) and a read type command of '90h'. In this case, the memory command is formed as:

| Memory Command (4) | |
|---|---|
| TDA | CMD |
| (00h) | (90h) |

The TDA ('00h') corresponds to the first memory device 84 (Device-0). The first device 84 responds to the command by indicating its memory type, namely a NOR flash device. The first device 84 transmits the read memory type over its serial output, which is received by the second device 85 via SIP_1 8-5. The response further traverses each subsequent memory device until it is received by the memory controller 50. At this point, by receiving the target device address ('00h') and the read memory type (NOR), the memory controller 50 recognizes that the first memory device 84 is a NOR flash device. Then, the memory controller 50 issues an additional read device type message for each additional memory device. As shown in the illustrated example, a second read device type message addressed to '01h' is issued. This time, the second memory device 85 (Device-1) responds to the second read device type command. By receiving the target device address ('01h') and the read memory type (NAND), the memory controller 50 recognizes that the second memory device 85 is a NAND flash device. Further read device type commands may be issued by the memory controller 50, but are not shown for sake of simplicity. As such, the memory controller 50 can recognize the memory types of all devices in the serial interconnection configuration.

FIG. 9 shows a table of example predetermined formats for memory operations with type-independent addressing. It is to be understood that this table is very specific for example purposes only. In the table:
TDA: Target Device Address
CMD: Command Code
CA: Column Address
RA: Row Address
Note *1: TDA (Target Device Address) is '00h' when the first Write Device Address command is issued after power-up or hard reset.

The table shows varying formats for different memory operations. No predetermined formats of memory types are necessary, because the device addresses provide the unique addressing of the memory devices.

FIG. 10 shows a table of an example encoding scheme for NAND flash commands. There is no need for the memory type because the device addresses provide for unique addressing of the memory devices. In the table:
Note *1: Target device address should be '00h' when the Write Device Address command is issued after power-up or hard reset.
Note *2: Row and Column Address bytes may not be provided if the same location is page read command was issued before.

FIG. 11 shows a table of an example encoding scheme for NOR flash commands. There is no need for the memory type because the device addresses (TDA) provide for unique addressing of the memory devices. In the table:
Note *1: Target DA should be '00h' when 'Write Device Address' command is issued after power-up or hard reset.
Note *2: Row and Column Address bytes may not be provided if the same location is read command was issued before.

FIG. 12 is a table of an example address format including target device addresses, row addresses and column addresses. Note that as the SIP, the target device address byte is sent as TDA, the row address and the column address are sent as DATA in the memory command by the memory controller.

The memory systems shown in FIGS. 3A-3F perform data access operations of phase 11 (the normal mode operations) as shown in FIG. 2C. The operations are conducted by the memory device 140A or 140B shown in FIG. 4A or 4B.

Figure 13A:
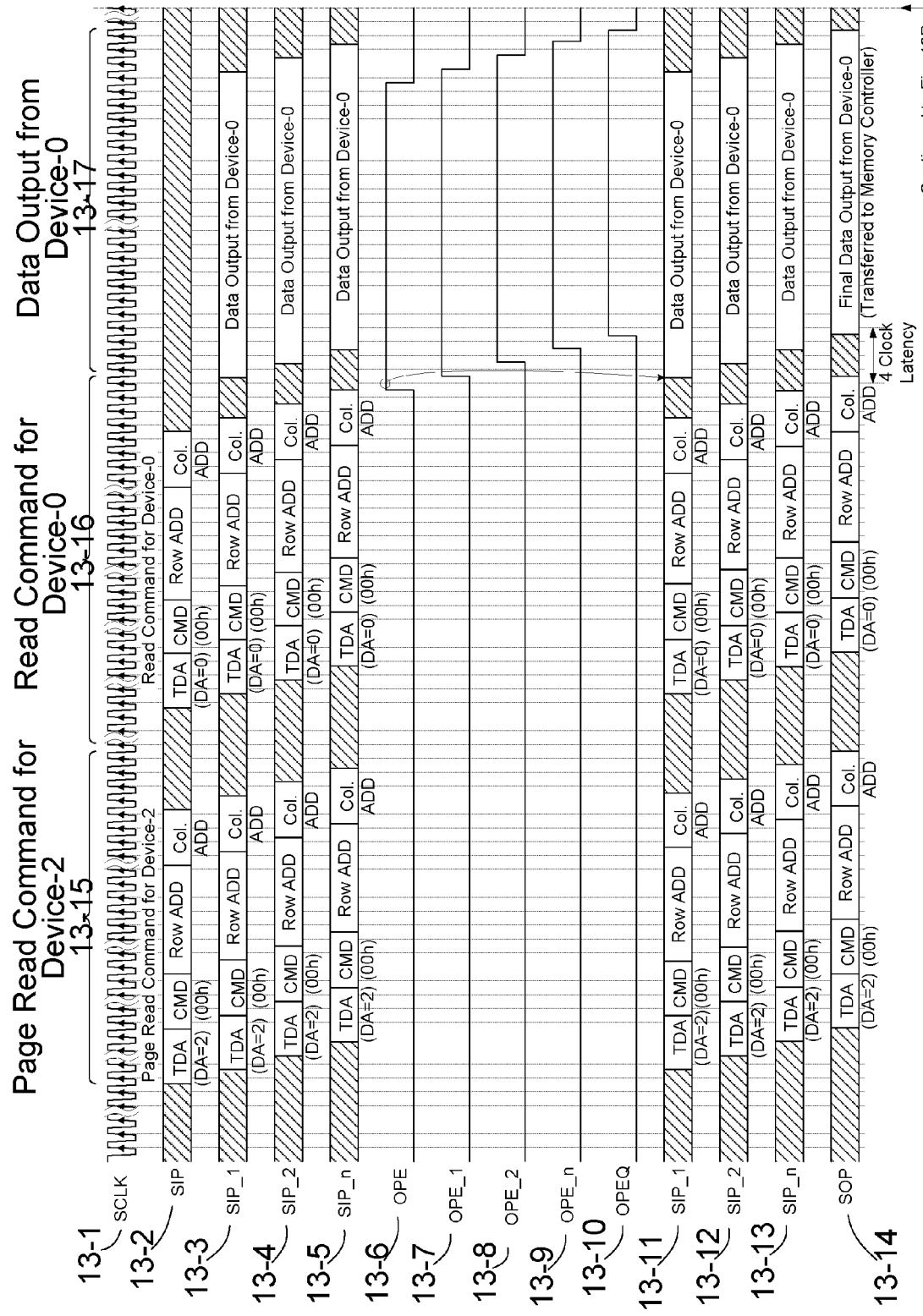
FIGS. 13A and 13B are timing diagrams of processing memory operations.
Figure 13B:
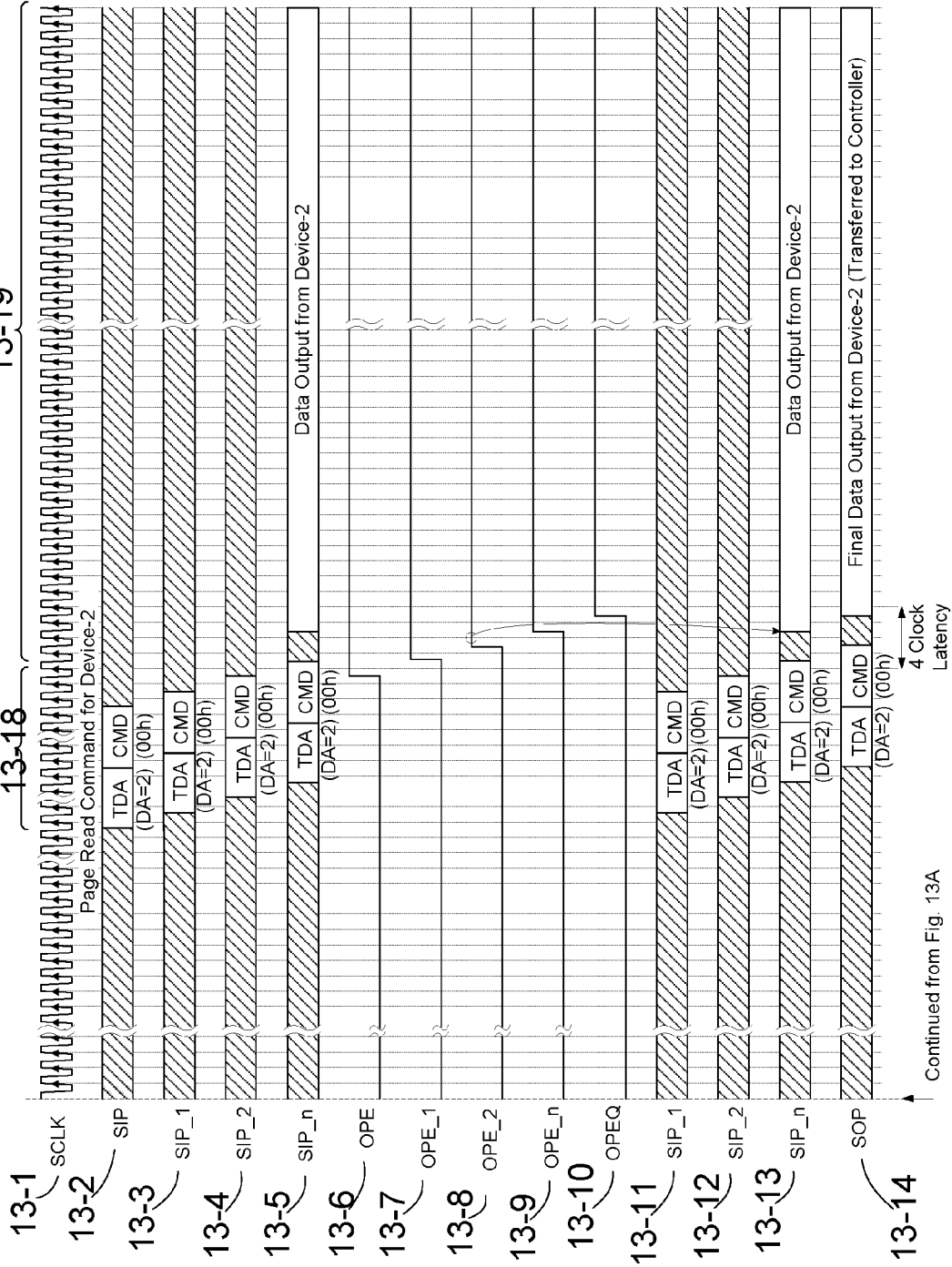

FIGS. 13A and 13B show timing sequences for the signals for processing memory operations with type-independent addressing. The timing diagram shows example signals that may result from the memory system of FIG. 3B, which has one NOR-type flash device 84 and n NAND-type flash devices 85, 86, . . . , and 87 interconnected.

Referring to FIGS. 3B, 13A and 13B, the NOR-type flash device 84 (Device-0) is the first device in the interconnection (i.e., the closest to the memory controller 50. The NAND-type flash device 87 (Device-n) is the last device in the serial interconnection configuration.

At the top of the timing diagram of FIGS. 13A and 13B, there is a signal for the serial clock (SCLK) as indicated by 13-1. The timing diagram includes signals for the serial input (SIP) for each memory device 84, 85, 86, . . . , and 87 as indicated by 13-2, 13-3, 13-4, . . . , and 13-5, respectively. The timing diagram includes signals for the output enable (OPE) for each memory device 84, 85, 86, . . . , and 87 as indicated by 13-6, 13-7, 13-8, . . . , and 13-9, respectively. The timing diagram includes a signal for the output enable echo (OPEQ) for the last memory device 87 as indicated by 13-10. The timing diagram includes signals for the serial output (SOP)

for each memory device 84, 85, 86 and 87 as indicated by 13-11 (SIP_1), 13-12 (SIP_2), 13-13 (SIP-n), . . . , and 13-14 (SOP), respectively. For the simple descriptive purpose, other signals like IPE, CS#, RST# are not shown in the timing diagram.

The signals as indicated by 13-1 through 13-14 do not include the memory type, as the device addressing is independent of the memory type.

In the timing diagram, as indicated by 13-15, a 'page read command set for 'Device-2' is issued first with a target device address (TDA: DA=2), command (00h) and row/column addresses by the memory controller 50. This serial stream of input signals is bypassed through the devices in sequence, and only the selected device (in this case, Device-2) processes the given 'page read' command in the device.

Subsequently, the memory controller 50 issues a 'page read command set for Device-0' as indicated by 13-16. As indicated by 13-17, the final read data output from Device-0 appears on the SOP port of the device 84, which is directly connected to the SOP port of the memory controller 50, after (n+1) clock cycle latency because the total number of connected memory devices is (n+1). In a case of four devices, there is four clock cycle latency.

After waiting for predetermined time, as indicated by 13-18, the memory controller 50 issues 'page read command set for Device-2' without row/column address bytes, and raises OPE 13-6 signal from logic 'low' to logic 'high' state, so that the signal transmission function of Device-2 is enabled. Then, the read data from Device-2 is streamed out through SIP/SOP ports connected in series as indicated by 13-19. In the illustrated example, there is four clock cycle latency at the final data output of the SOP fed back to the SIP port of the memory controller 50.

Figure 14A:
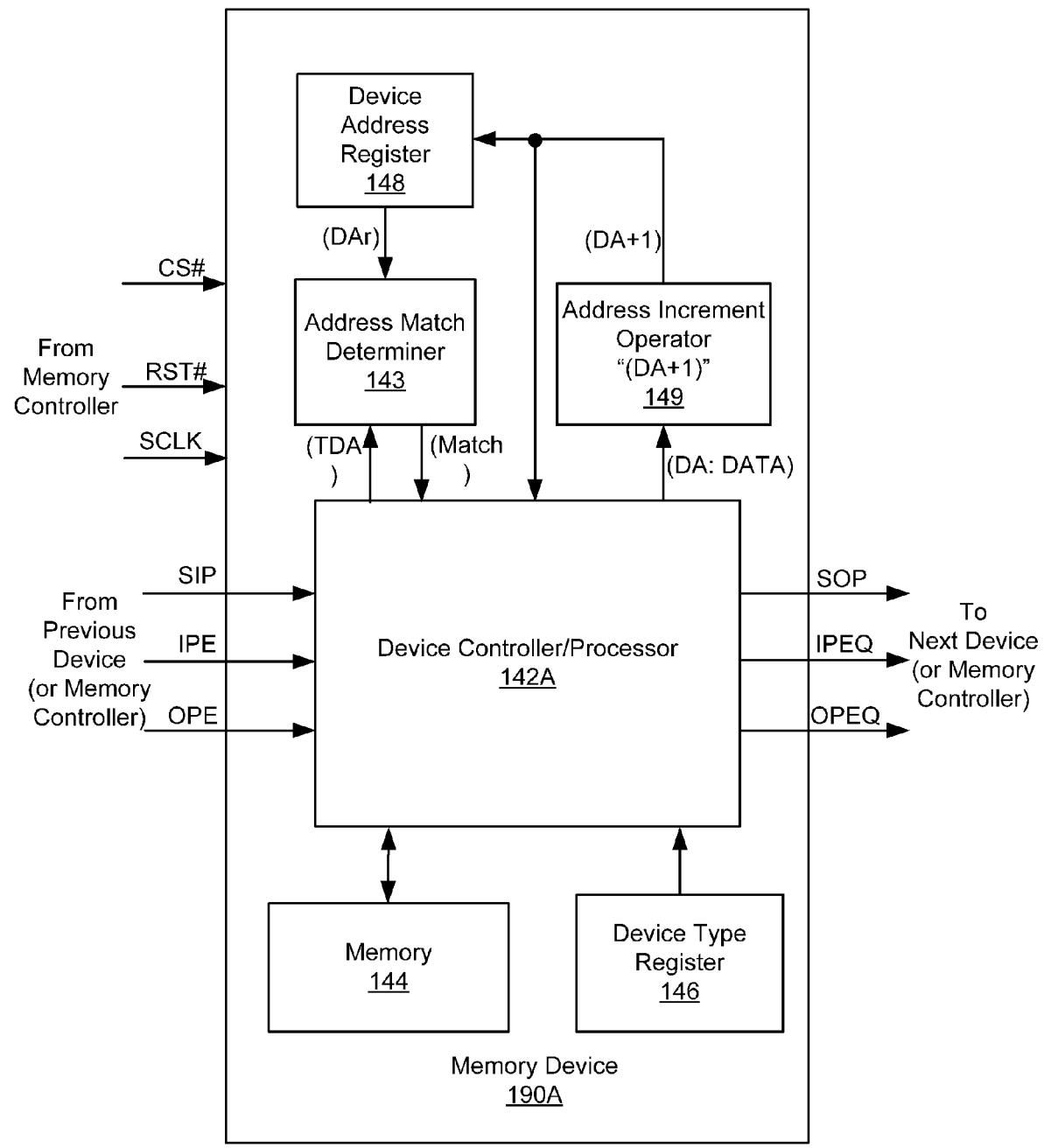
FIG. 14A is a schematic of another example memory device block used as the memory devices shown in FIGS. 3A, 3B, 3C, 3D and 3E.

FIG. 14A shows another example memory device block used as the memory devices shown in FIGS. 3A-3E. A memory device 190A shown in FIG. 14A is similar to the memory device 140A shown in FIG. 4A. In the device 190A of FIG. 14A, the assigned device address, which is to be held in the device address register 148 is one (DA+1) incremented by the address increment operator 149.

Referring to FIG. 14A, in a case where the target device address (TDA) included in the SIP matches the device address (DAr) held in the device address register 148, the address match determiner 143 outputs a match indication. In response to the match indication, the device address (DA) as DATA contained in the SIP is incremented by the address increment operator 149 to output the incremented device address (DA+1) that is provided to the device controller/processor 142A. The incremented device address is transmitted to the next device over the SOP. Also, the incremented device address (DA+1) is fed to the device address register 148, so that the device address incremented by the present device 190A is registered for a device address assignment in the initial phase 35 and the device address assignment part 35-1 as shown in FIGS. 2C and 2D. Other operations of the device 190A are the same as those of the device 140A of FIG. 4A.

Figure 14B:
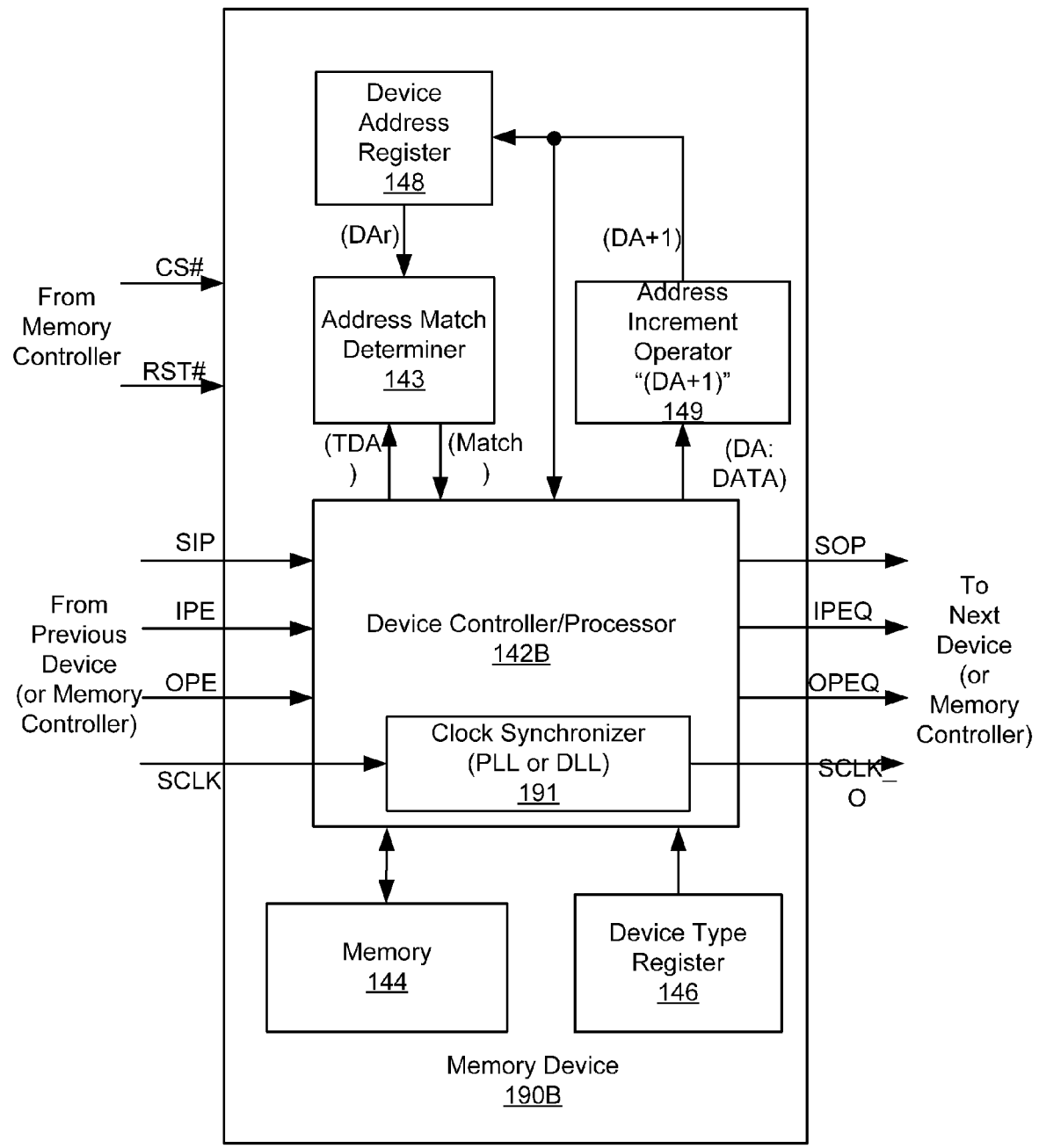
FIG. 14B is a schematic of another example memory device block used as the memory devices shown in FIG. 3F.

FIG. 14B shows another example memory device block used as the memory devices shown in FIG. 3F. A memory device 190B shown in FIG. 14B is similar to the memory device 190A shown in FIG. 14A. Referring to FIG. 14B, an address increment operator 149 performs a device address adding operation in response to a request in the initial phase from the device controller/processor 142B.

Figure 14C:
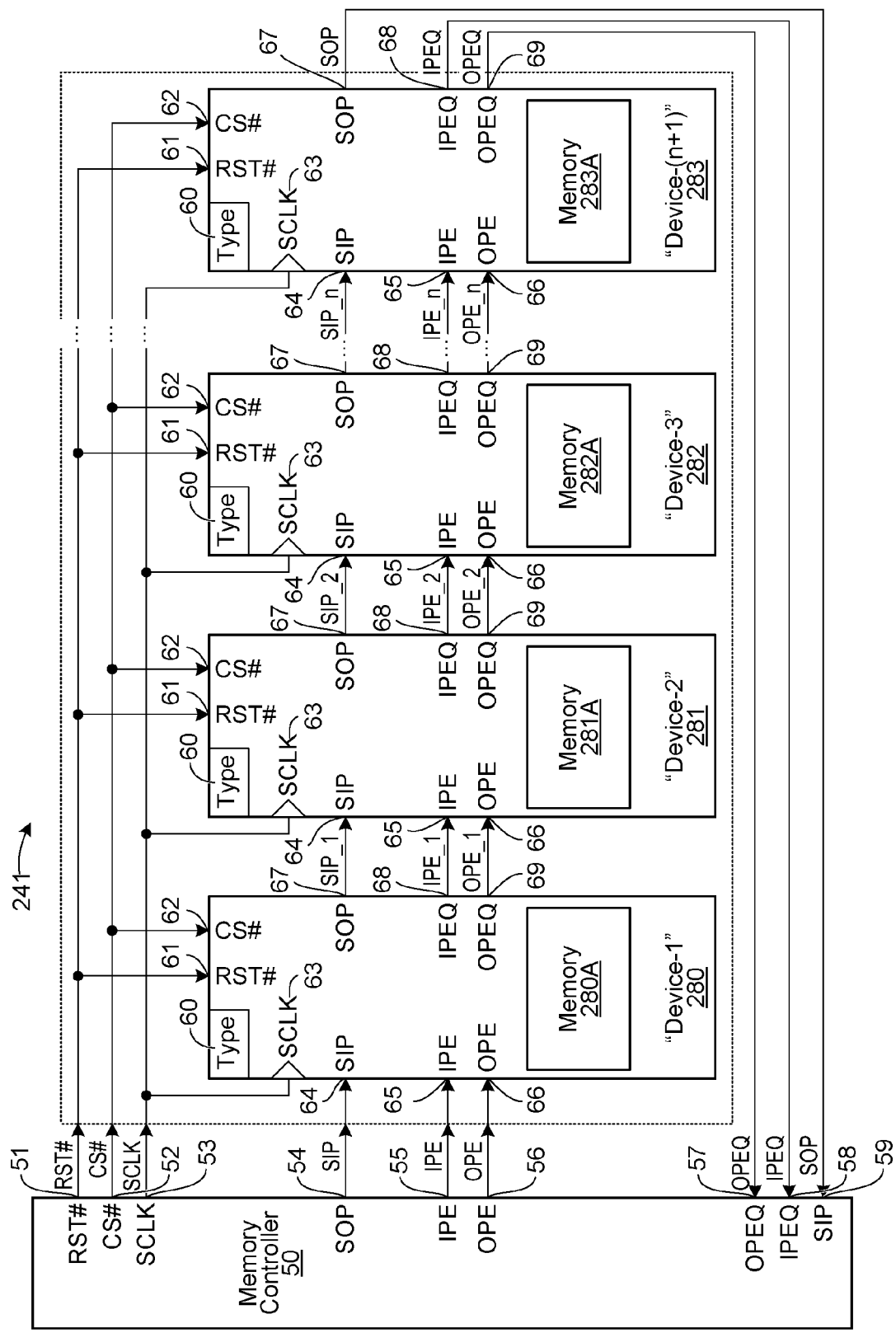
FIG. 14C is a schematic of an example memory system wherein device addresses are assigned by the devices shown in FIG. 14A or 14B.

The device addresses assigned by the memory devices of FIG. 14A or 14B are shown in FIG. 14C. As illustrated in FIG. 14C, (n+1) memory devices 280, 281, 282, . . . , and 283 of a memory system 241 are assigned with device addresses "Device-1", "Device-2", "Device-3", . . . , and "Device-(n+1)".

Figure 15A:
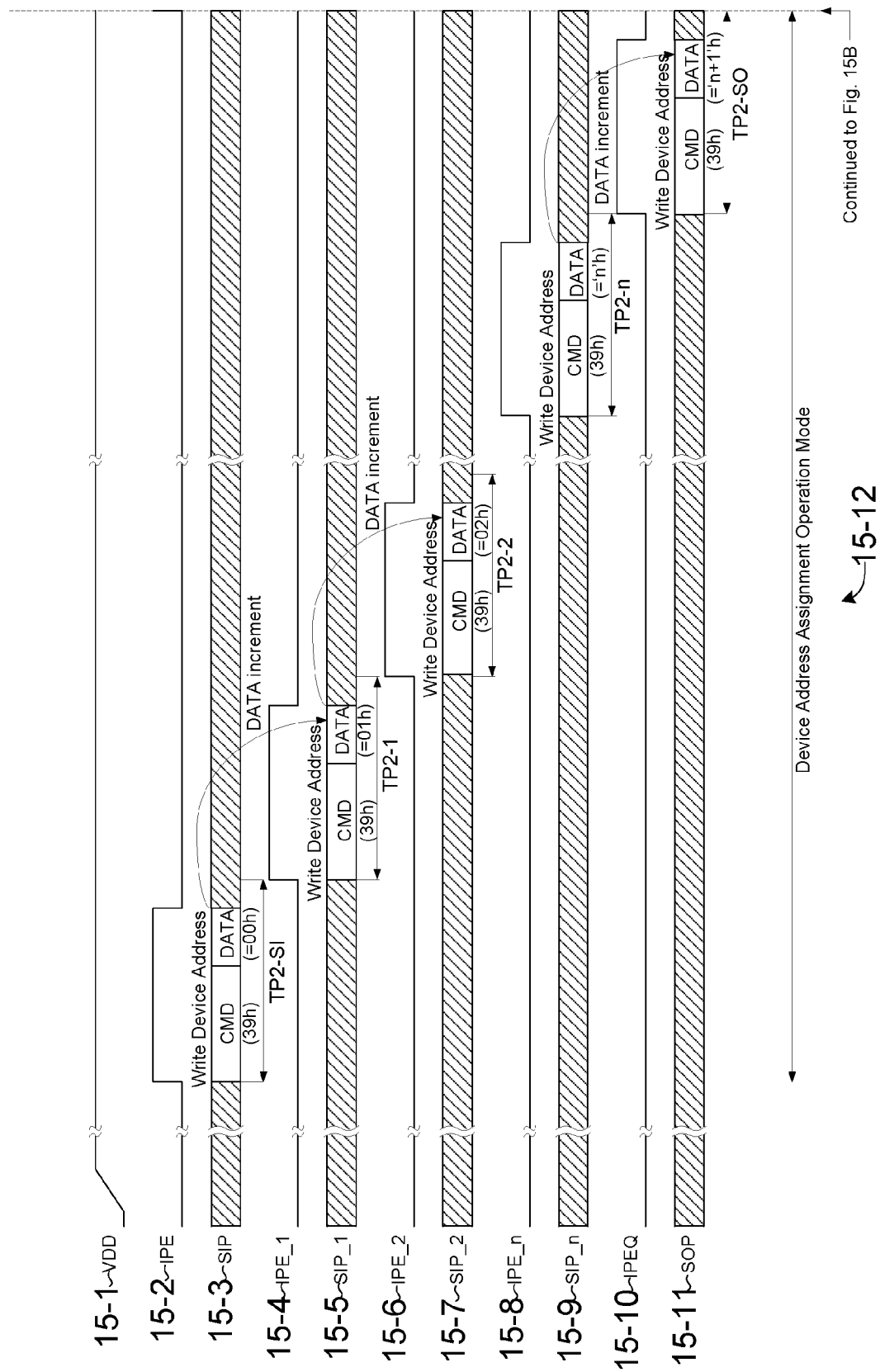
FIGS. 15A and 15B are timing diagrams of initializing the memory system using the device as shown in FIG. 14A.
Figure 15B:
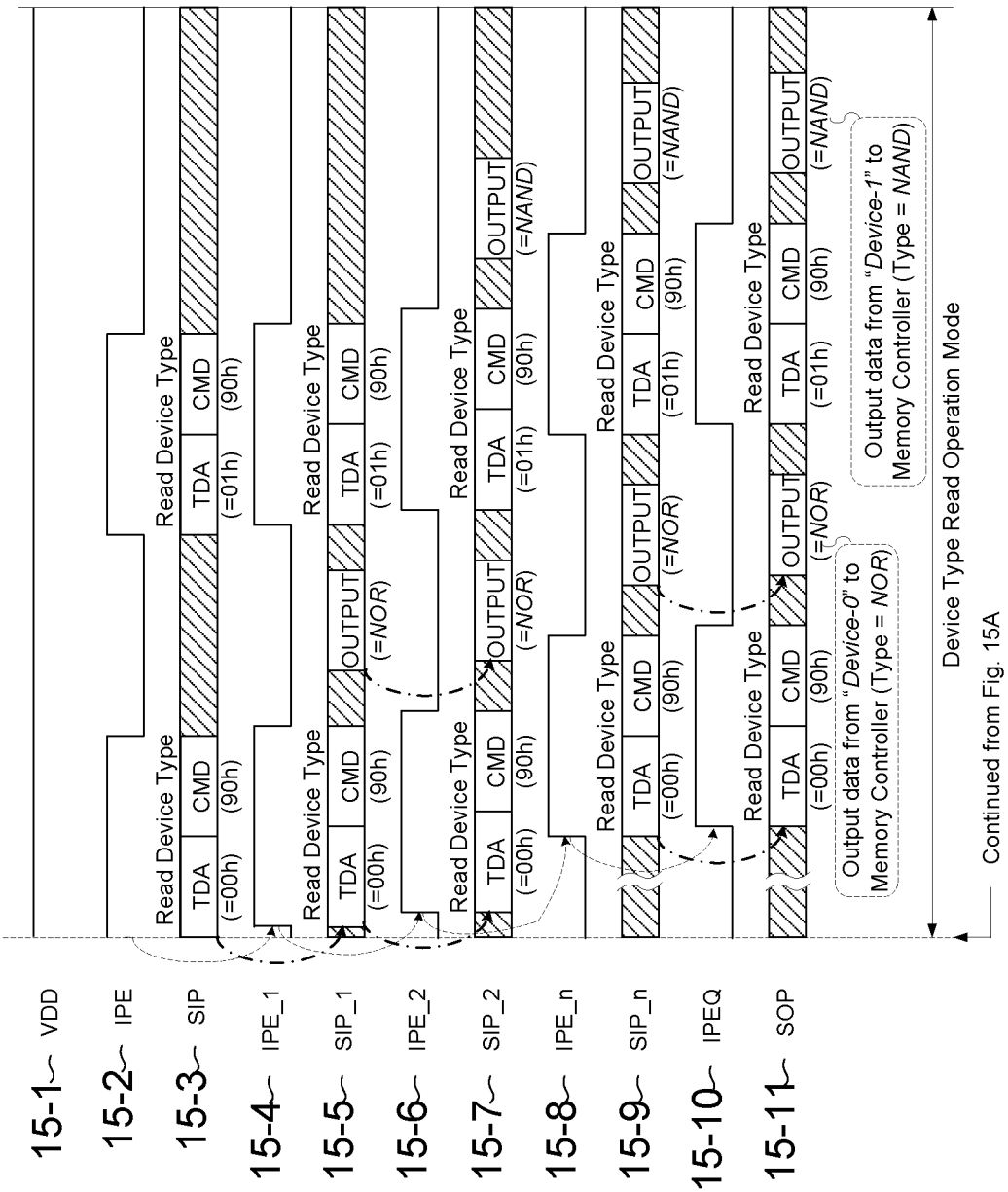
Figure 16A:
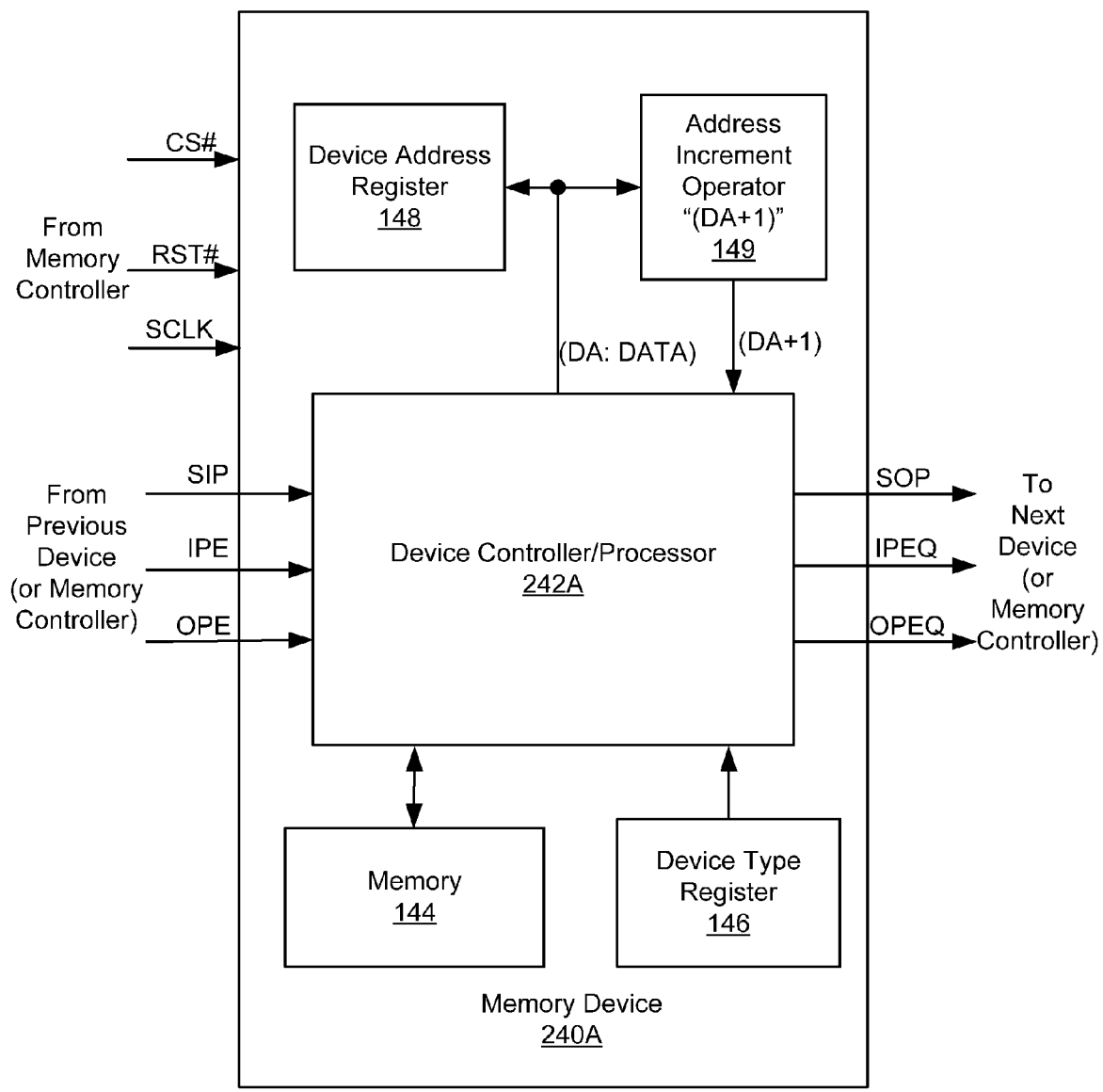
FIG. 16A is a schematic of another example memory device used as the memory devices shown in FIGS. 3A, 3B, 3C, 3D and 3E wherein an address assignment is performed.
Figure 16B:
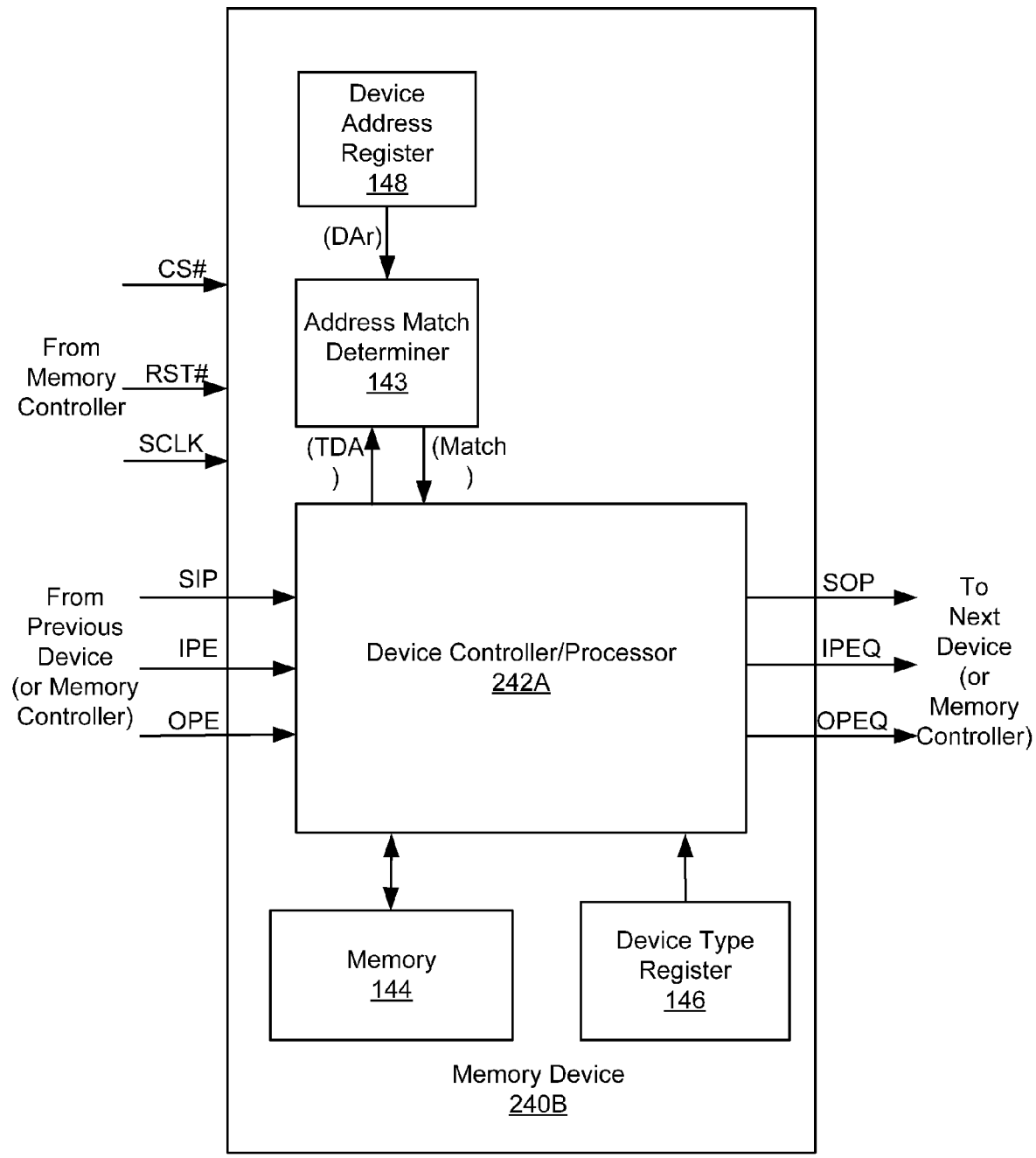
FIG. 16B is a schematic of another example memory device used as the memory devices shown in FIGS. 3A, 3B, 3C, 3D and 3E wherein a device type read and a memory access are conducted.

FIGS. 15A and 15B show the initialization of the memory system with type-independent addressing using the device as shown in FIGS. 16A and 16B. The initialization operation is similar to that of the memory device 140A shown in FIG. 4A. A memory device 240A shown in FIG. 16A performs the device address assignment operation, among others. A memory device 240B performs the device type read and the memory access operations, among others. The devices 240A and 240B have no address match determiner.

Referring to FIGS. 3A, 15A and 16A in the initial phase, no target device address (TDA) is provided by the memory controller 50. In this particular example, each of the memory devices assigns the input value ("DATA") as its device address in the device address register 148 and the value is incremented by the address increment operator 149. The incremented value ("DATA") is provided by the device controller/processor 242A to the next memory device that in turn performs the same functions of the address assignment and address increment. In this case, the memory command is formed as:

| Memory Command (5) | |
|---|---|
| CMD | DATA |
| (39h) | (00h) |

Each of the devices executes the command of write device address as specified by CMD. During the time period TP2-SI: in accordance with the input DATA ('00h'), the device 80 is set as "Device-0", then bypass the whole message to the next device with DATA increment ('01h'). During the time period TP2-1, the device 81 is set as "Device-1", then bypass the whole message to the next device with DATA increment ('02h'). During the time period TP2-2, the de device 82 is set as "Device-2", then bypass the whole message to the next device with DATA increment. During the time period TP2-n, the device 83 is set as "Device-n", then bypass the whole message to the next device (i.e., the memory controller 50) with DATA increment ('(n+1)h'). During the time period TP2-SO, the memory controller 50 receives this feedback message, then recognizes the total number of devices is "n+1".

Again referring to FIGS. 3A and 15A, after a signal for power (VDD) as indicated by 15-1 is high, during the input enable (IPE) being high as indicated by 15-2, the SIP of a write device address operation is input to the first device of the serial interconnection configuration, as indicated by 15-3. The write device address message includes a write device address command ('39h') and DATA ('00h') as a device address (DA). The address is incremented by an adding operation (i.e., DA (DATA)+1). The incremented device address is assigned to the first device, so that the device address of the first device is "Device-1". The incremented device address is transmitted with the command ('39h') to the next device (i.e., the second device). That signal transmission is performed as the serial input (SIP_1) indicated by 15-5, in response to the input enable (IPE_1) indicated by 15-4. The subsequent devices perform the same operations. Shown are signals for the input enable (IPE_2) and the serial input (SIP_2) for device-2 as indicated by 15-6 and 15-7, respectively. Also, the timing diagram includes signals for the input enable (IPE_n) and the serial input (SIP_n) for device-n as indicated by 15-8 and 15-9, respectively. Furthermore, the timing diagram includes signals for the input enable echo (IPEQ) and the serial output (SOP) for the device controller 50 as indicated by 15-10 and 15-11, respectively. The device address assignment operation mode as indicated by 15-12 is completed and the system operation moves to the device type read operation mode as indicated by 15-13.

Once device addresses are assigned to all memory devices, the memory type of each of the memory devices is read and recognized by the memory controller 50 as shown in FIG. 15B.

Referring to FIGS. 3B, 15B and 16B, the memory controller 50 issues a first read device type message that includes a device address of '01h' (the target device address (TDA) and a read type command of '90h'. The TDA ('01h') corresponds to the first memory device 84 (device-1) via the SIP. The first device 84 responds to the command by indicating its memory type, namely a NOR flash device. The first device 84 transmits the read memory type over its serial output, which is received by the second device 85 via SIP_1 15-5. The response further traverses each subsequent memory device until it is received by the memory controller 50. At this point, by receiving the target device address ('01h') and the read memory type (NOR), the memory controller 50 recognizes that the first memory device 84 is a NOR flash device. Then, the memory controller 50 issues an additional read device type message for each additional memory device. As shown in the illustrated example, a second read device type message addressed to '02h' is issued. The second memory device 85 (device-2) responds to the second read device type command, via SIP_2 15-7. By receiving the target device address ('02h') and the read memory type (NAND), the memory controller 50 recognizes that the second memory device 85 is a NAND flash device. More read device type commands may be issued by the memory controller 50, but are not shown for sake of simplicity. As such, the memory controller 50 can recognize the memory types of all devices in the serial interconnection configuration.

After the device addresses are assigned to the memory devices and the device types of the devices in the serial interconnection configuration are read based on the assigned device addresses, the data access operation is conducted in the normal phase (see FIG. 2C).

Figure 17A:
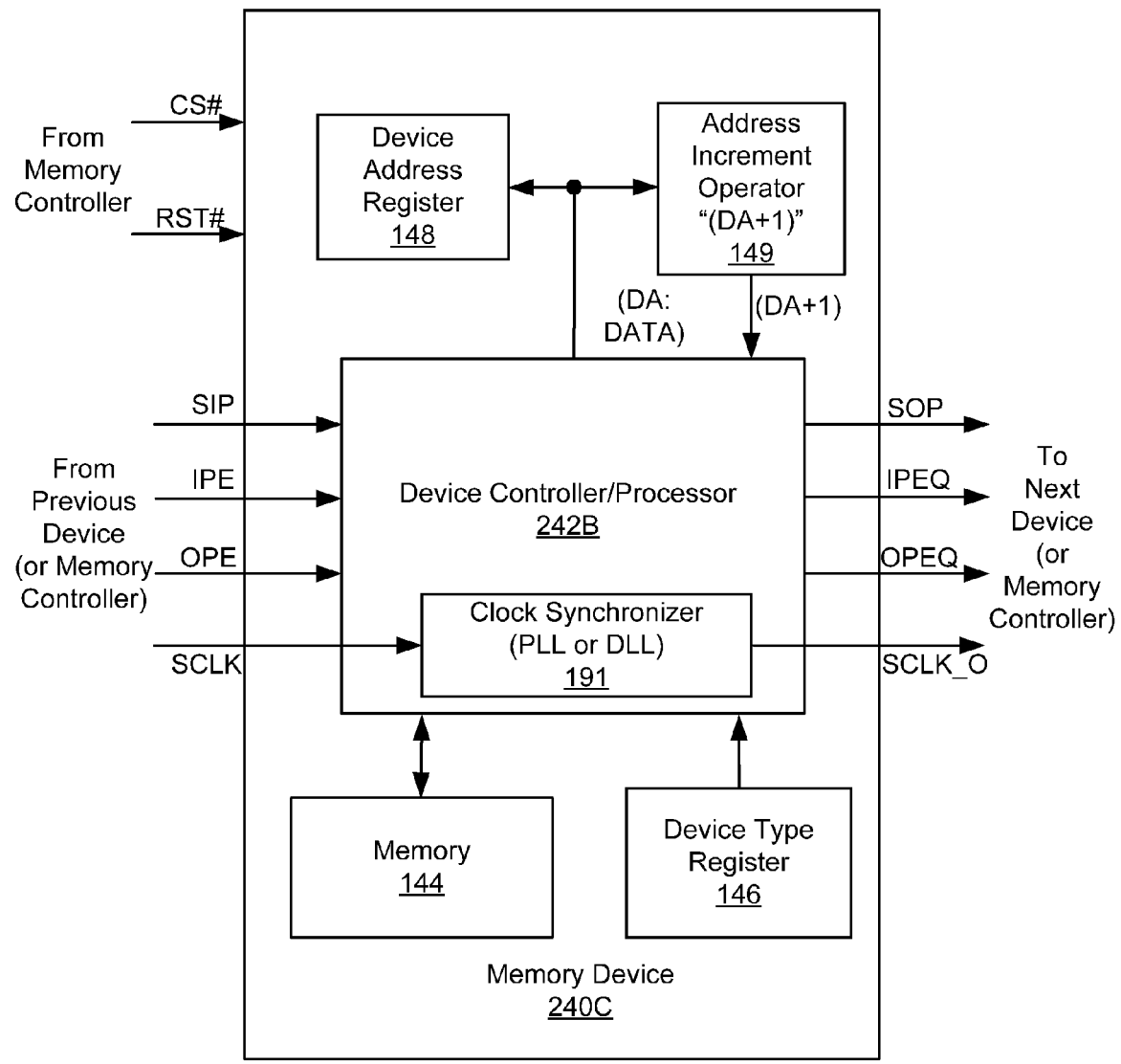
FIG. 17A is a schematic of another example memory device used as the memory devices shown in FIG. 3F wherein an address assignment is performed.
Figure 17B:
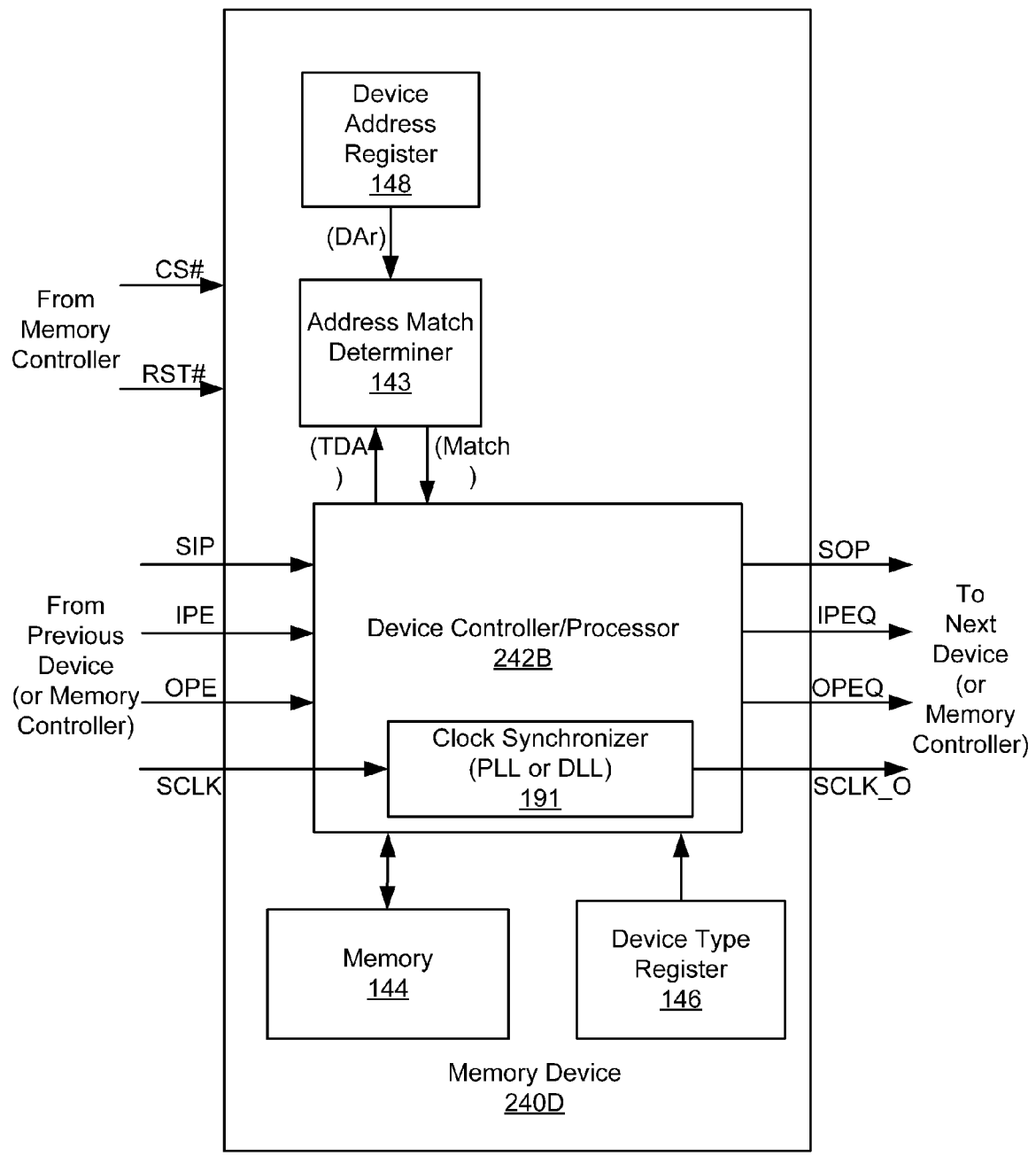
FIG. 17B is a schematic of another example memory device used as the memory devices shown in FIG. 3F wherein a device type read and a memory access are conducted.

FIG. 17A shows another example memory device used as the memory devices shown in FIG. 3F. A memory device 240C including a device controller/processor 242B performs the device address assignment. FIG. 17B shows another example memory device used as the memory devices shown in FIG. 3F. The device 240D performs the device type read. The device address assignment, the device type read and the memory access operations of the devices 240C and 240D are the same as those of the devices 240A and 240B of FIGS. 16A and 16B.

Figure 18A:
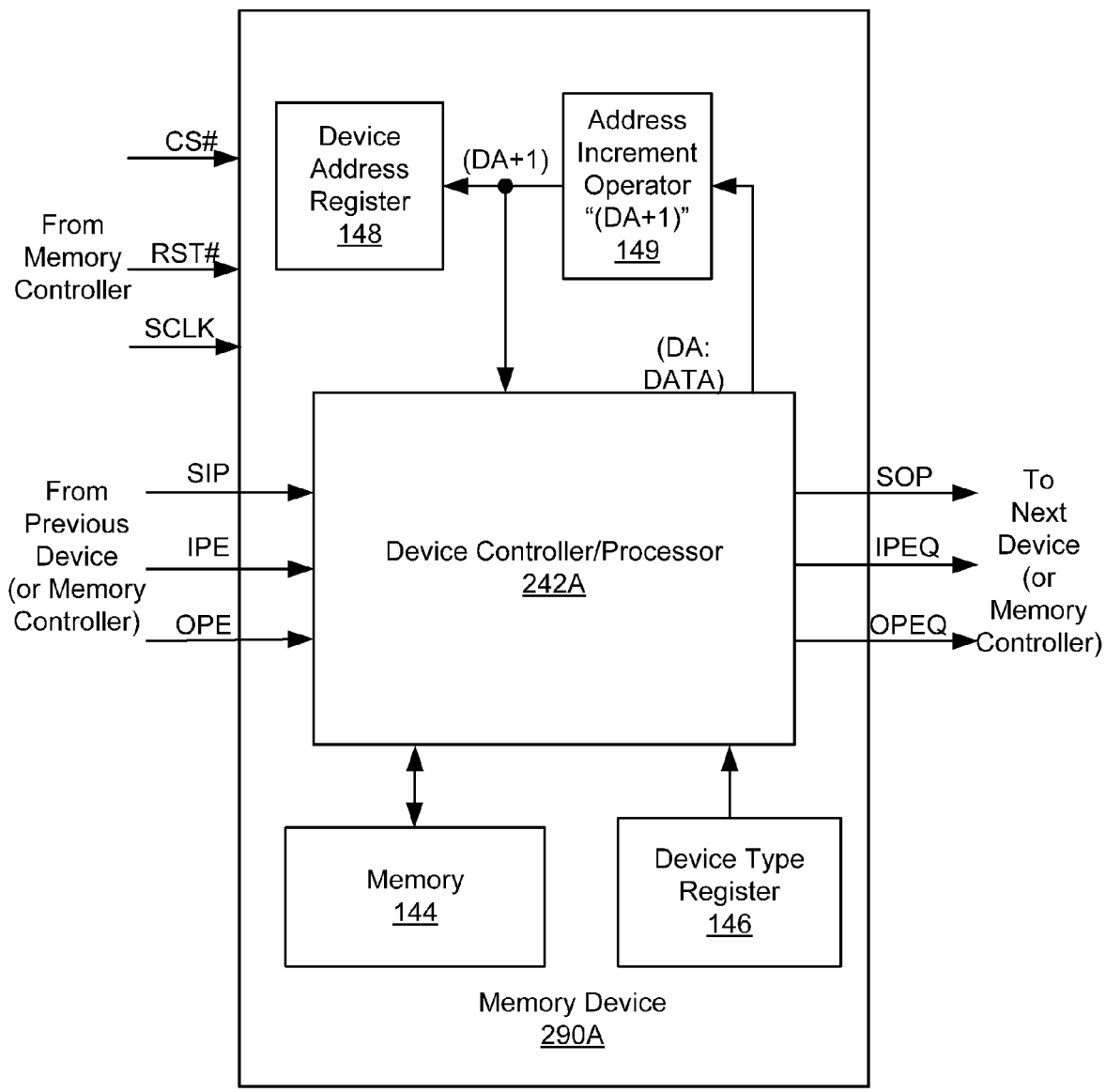
FIG. 18A is a schematic of another example memory device block used as the memory devices shown in FIGS. 3A, 3B, 3C, 3D and 3E wherein an address assignment is performed.
Figure 18B:
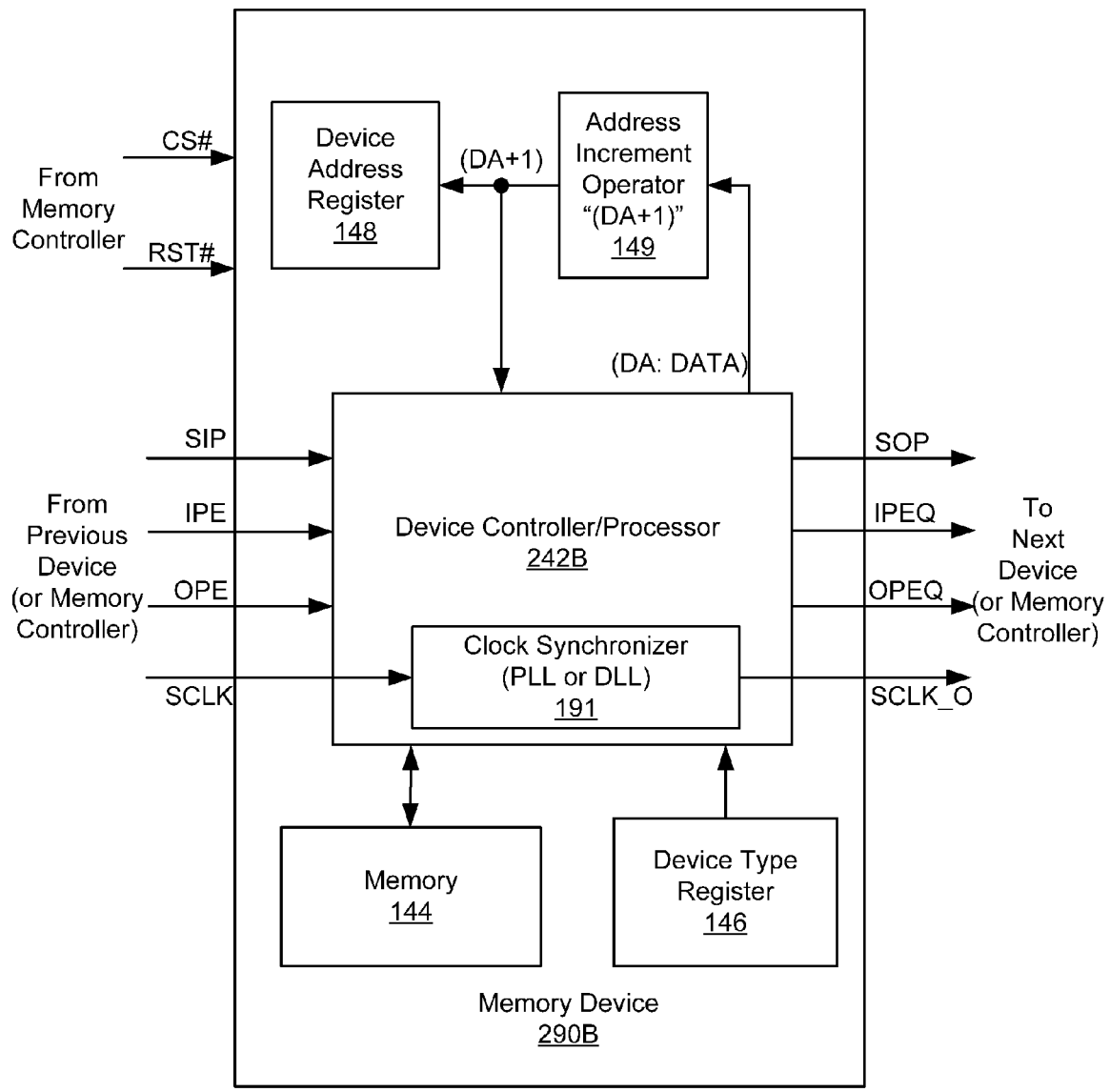
FIG. 18B is a schematic of another example memory device block used as the memory devices shown in FIG. 3F wherein an address assignment is performed.

FIG. 18A shows another example memory device block used as the memory devices shown in FIGS. 3A, 3B, 3C, 3D and 3E. In a memory device 290A, an incremented device address ('DA+1') provided by the address increment operator 149 is held in the device address register 148. FIG. 18B shows another example memory device block used as the memory devices shown in FIGS. 3F. In a memory device 290B, an incremented device address ('DA+1') provided by the address increment operator 149 is held in the device address register 148. The device addresses are assigned by the memory devices of FIG. 18A or 18B are shown in FIG. 14C.

Figure 19:
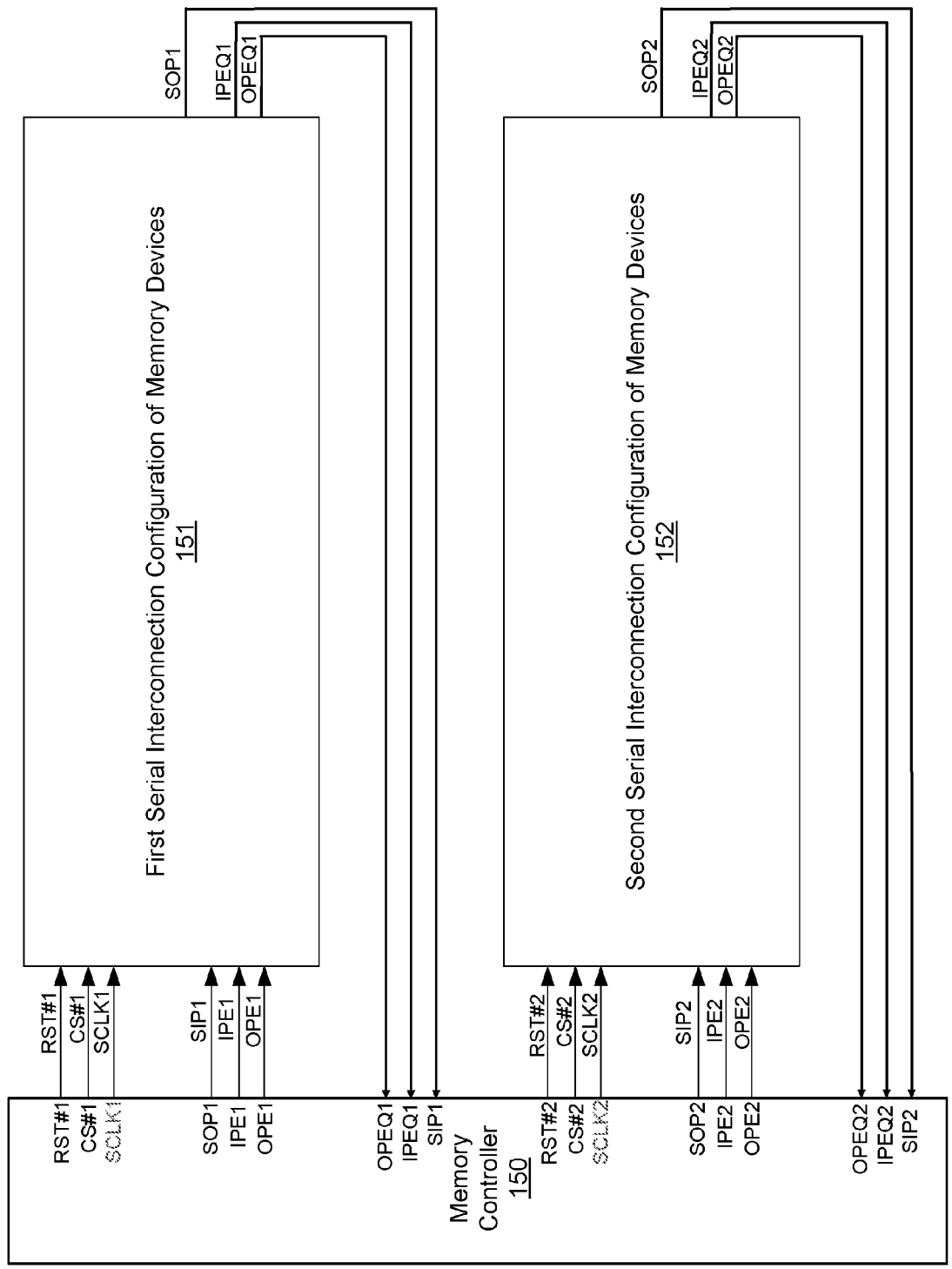
FIG. 19 shows a memory system of two channels according to another embodiment of the present invention.

FIG. 19 shows a memory system of two channels according to another embodiment of the present invention. Referring to FIG. 19, a first channel of the memory controller 150 is connected to a first serial interconnection configuration of memory devices 151 that are connected via serial links. Similarly, a second channel of the memory controller 150 is connected to a second serial interconnection configuration of memory devices 152 that are connected via serial links. The serial output (SOP), the input enable echo (IPEQ) and the output enable echo (OPEQ) from the last device of each of the serial interconnection configurations 151 and 152 are feed backed to the memory controller 150.

Figure 20A:
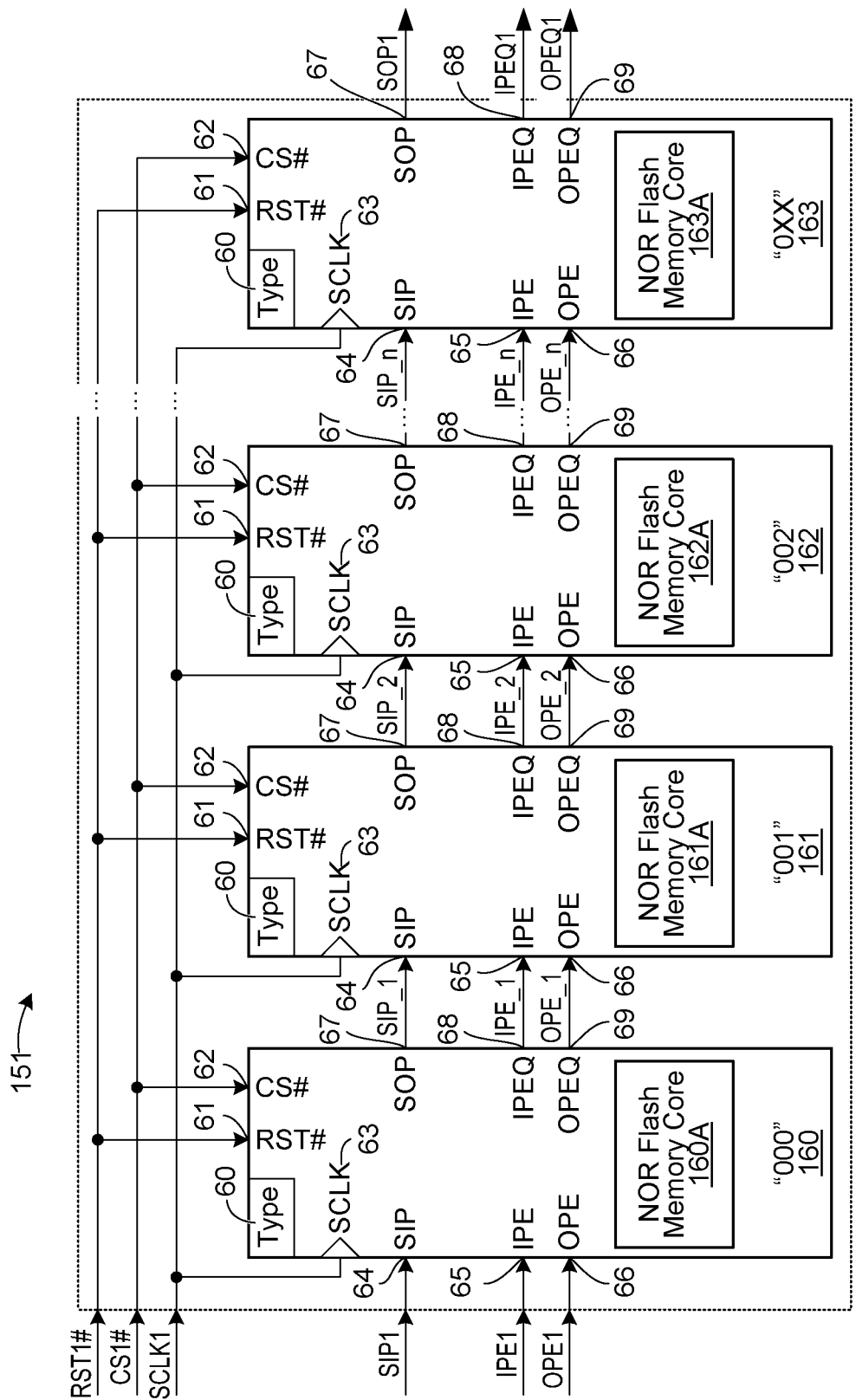
FIGS. 20A and 20B are schematics of specific example memory devices used in the memory system shown in FIG. 19.

Details of the first serial interconnection configuration of memory devices 151 are shown in FIG. 20A. Details of the second serial interconnection configuration of memory devices 152 are shown in FIG. 20B.

Referring to FIG. 20A, the first serial interconnection configuration of memory devices 151 includes (n+1) NOR flash memory devices 160, 161, 162, . . . , and 163 that are serially interconnected. The devices 160, 161, 162, . . . , and 163 have NOR flash memory cores 160A, 161A, 162A, . . . , and 163A, respectively. Each of the devices 160, 161, 162, . . . , and 163 has its a type register 60 holding its memory type (NOR flash). In operation of initialization, the devices 160, 161, 162, . . . , and 163 are assigned with device addresses "000", "001", "002", . . . , and "0XX", respectively, with the start of "000", for example. The assigned device addresses are held in the registers (not shown) of the devices.

Figure 20B:
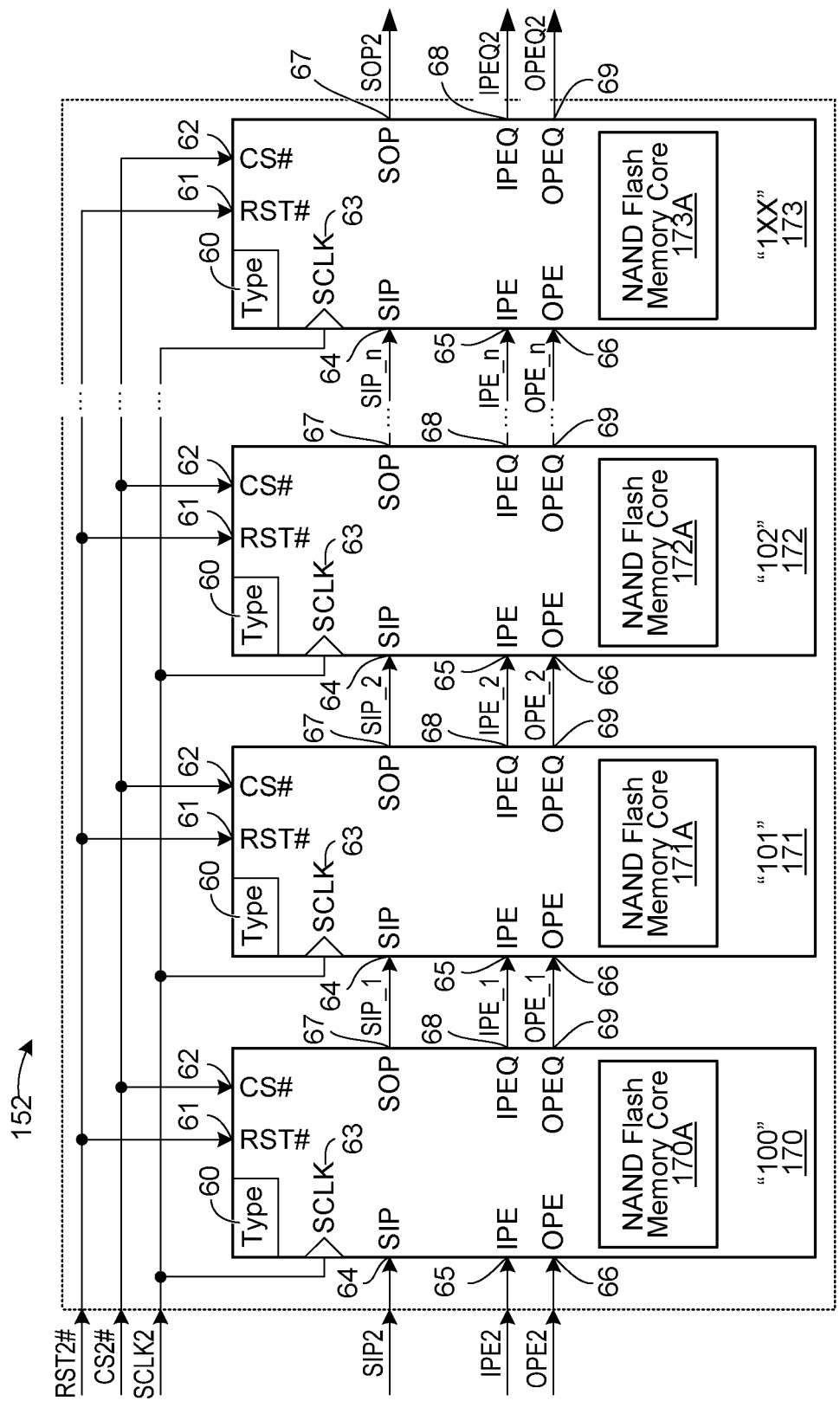

Referring to FIG. 20B, the second serial interconnection configuration of memory devices 152 includes (n+1) NAND flash memory devices 170, 171, 172, . . . , and 173 that are serially interconnected. The devices 170, 171, 172, . . . , and 173 have NAND flash memory cores 170A, 171A, 172A, . . . , and 173A, respectively. Each of the devices 170, 171, 172, . . . , and 173 has its a type register 60 holding its memory type (NAND flash). In operation of initialization, the devices 170, 171, 172, . . . , and 173 are assigned with device addresses "100", "101", "102", . . . , and "1XX", respectively, with the start of "100", for example. The assigned device addresses are held in the registers (not shown) of the devices.

Alternatively, the first serial interconnection configuration of memory devices 151 may include devices of mixed type. Also, the second serial interconnection configuration of memory devices 152 may include devices of mixed type.

Figure 21:
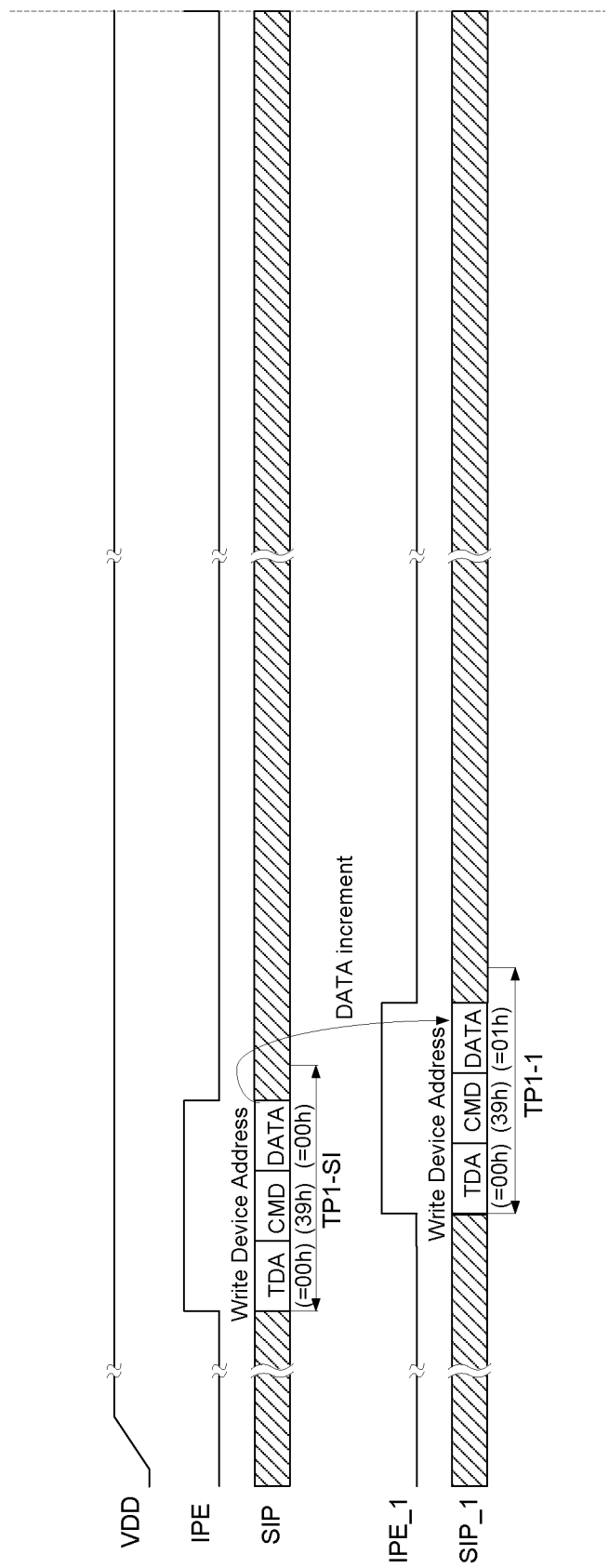
FIG. 21 is a timing diagram of another example of initializing the memory system.

In the embodiments described above, one memory command (e.g., the "write device address" command of the SIP is not overlapped with another memory command (e.g., the "write device address" command of SIP_1). In another implementation, the memory commands in the serial inputs to the devices may be overlapped as shown in FIG. 21. It requires, however, that the device address (DATA) increment by one device should be completed before the other device performs the address (DATA) increment.

Figure 22:
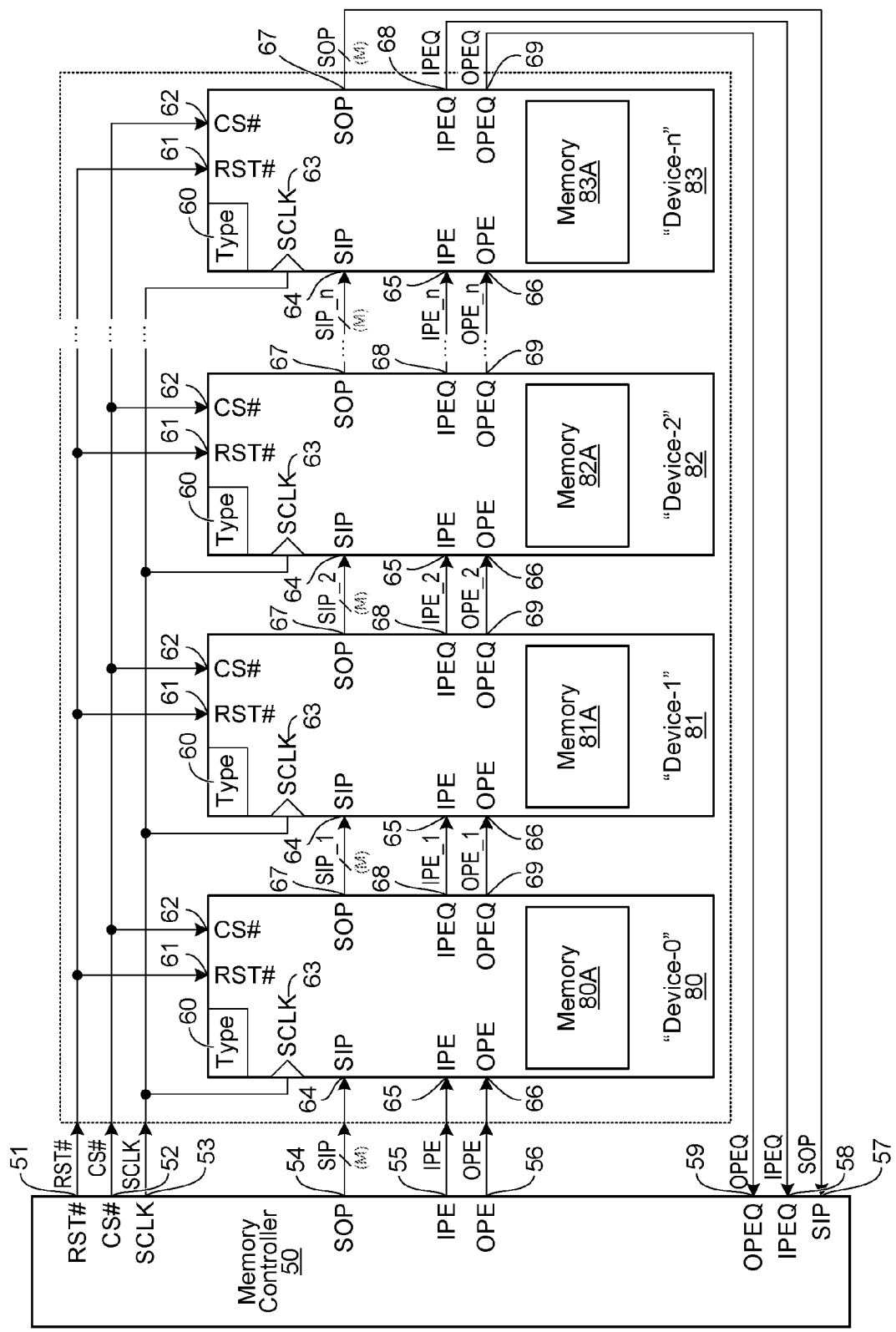
FIG. 22 is a schematic of another example memory system according to an embodiment of the present invention.

It will be apparent to those of ordinary skill in the art that the transmission of data, information or signals is performed by a single bit or a plurality of bits. For example, the data transmission over the serial input SIP and the serial output SOP is performed by a single bit or by M bits as shown in FIG. 22, M being an integer greater than one. The interface may include a single I/O pin or a plurality of I/O pins.

Figure 23:
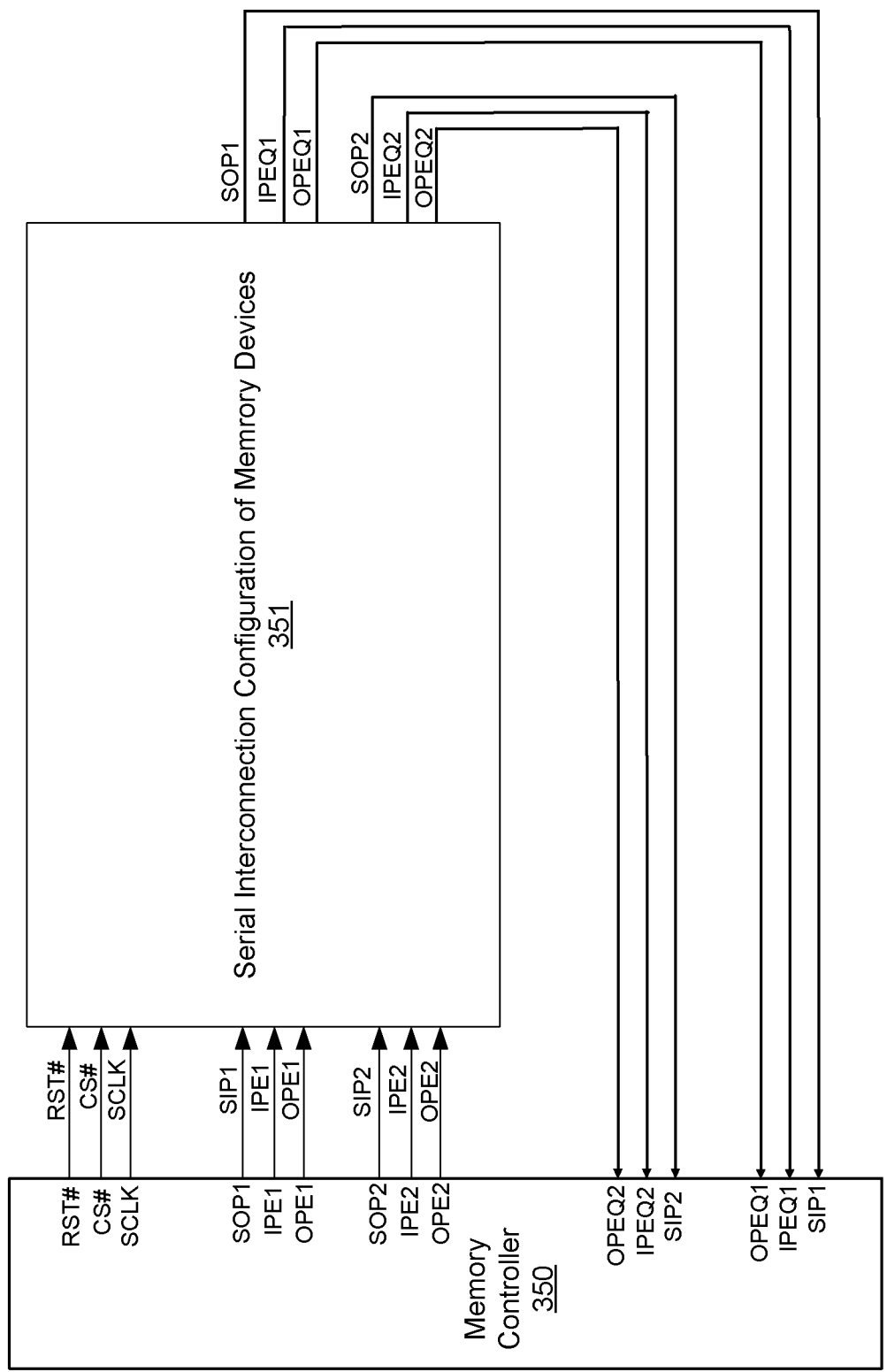
FIG. 23 is a block diagram of a memory system according to another embodiment of the present invention.
Figure 24:
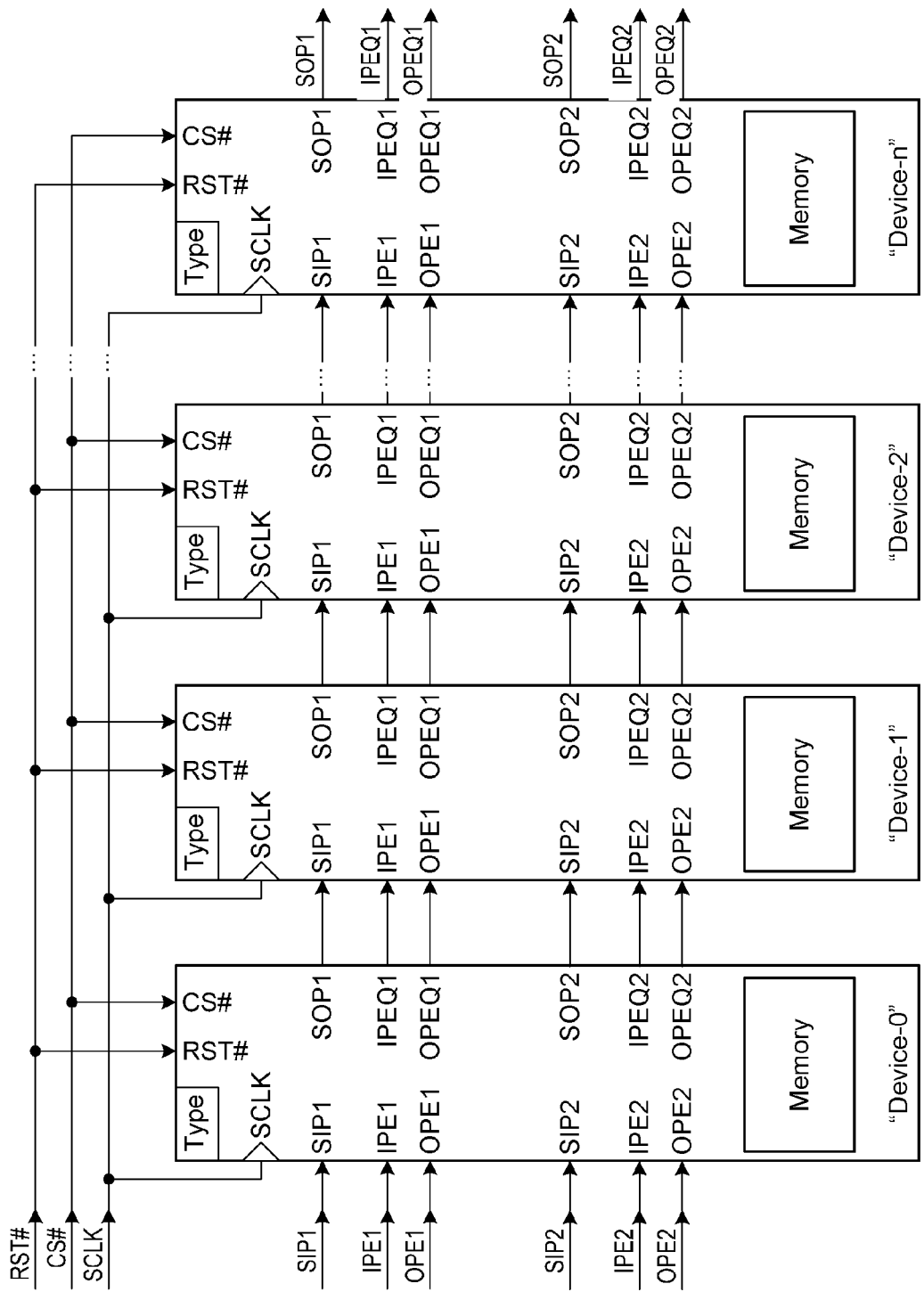
FIG. 24 is a schematic of specific example memory devices used in the memory system shown in FIG. 23.

FIG. 23 shows a memory system according to another embodiment of the present invention. The memory system shown in FIG. 23 includes a serial interconnection configuration of a plurality of memory devices 351 and a memory controller 350 for controlling operations of the devices. Details of memory devices in the configuration are shown in FIG. 24. In the illustrated example, the configuration includes (n+1) memory devices: Device-0, Device-1, Device-2, . . . and Device-n. Each of the memory devices has a plurality of ports. In the particular example of FIG. 24, each device is a two port device. The memory controller 350 provides a reset signal "RST#", a chip select signal "CS#" and a serial clock signal "SCLK" to the respective ports of each of the memory devices.

Referring to FIGS. 23 and 24, a first memory device (Device-0) has a plurality of data input ports (SIP1, SIP2), a plurality of data output ports (SOP1, SOP2), a plurality of control input ports (IPE10, IPE2), and a plurality of control output ports (OPE1, OPE2). The data and control signals are sent from the memory controller 350 to the first memory device. A second memory device (Device-1) has the same types of ports as Device-0 to which Device-1 is connected. For example, Device-1 receives data and control signals from Device 0. A last memory device (Device-n) in the configuration provides data and control signals back to the memory controller 350 after a predetermined latency. Each memory device outputs an echo (IPEQ1, IPEQ2, OPEQ1, OPEQ2) of IPE1, IPE2, OPE1, and OPE2 (i.e., control output ports) to the subsequent device.

Figure 25:
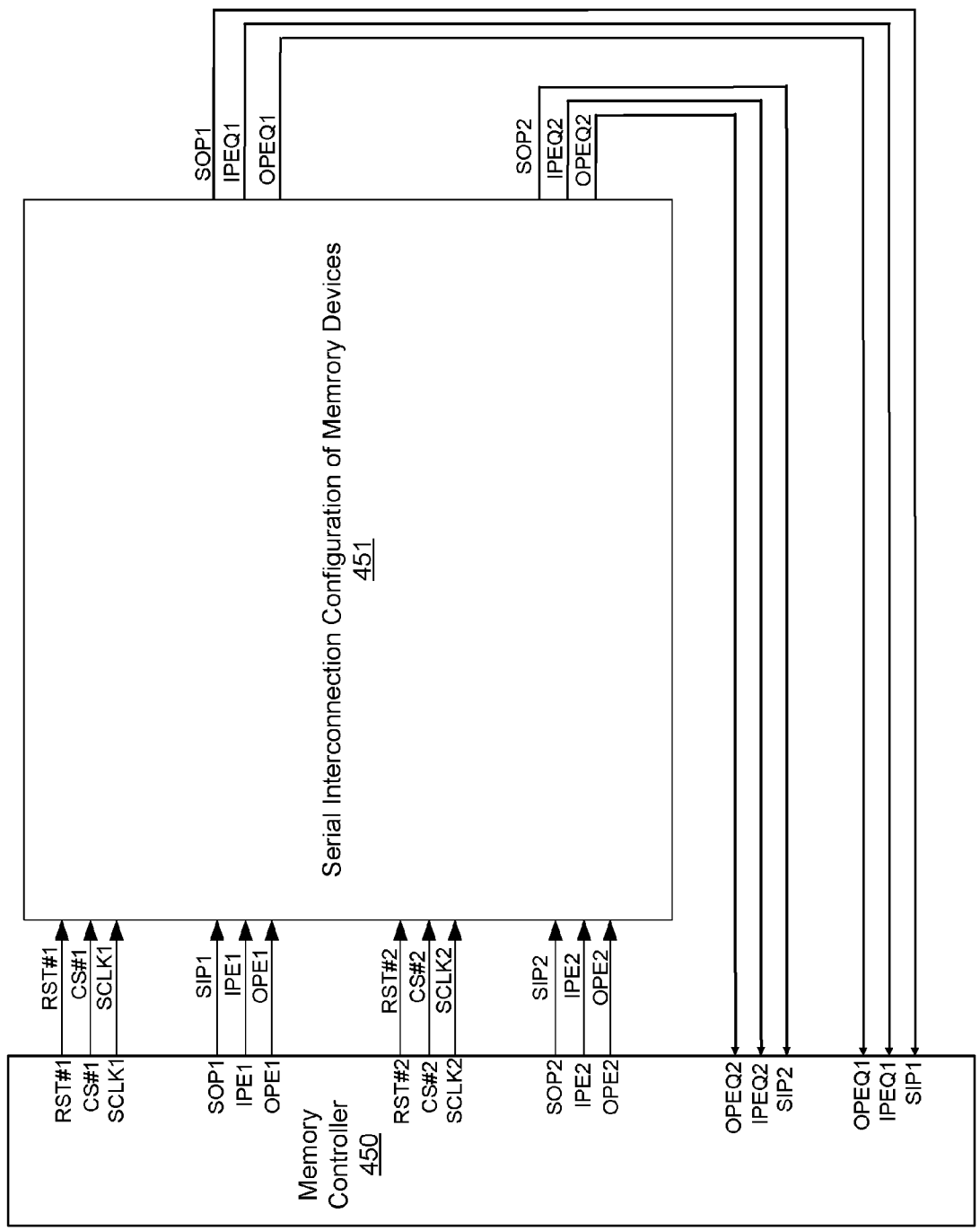
FIG. 25 is a block diagram of a memory system according to another embodiment of the present invention.
Figure 26:
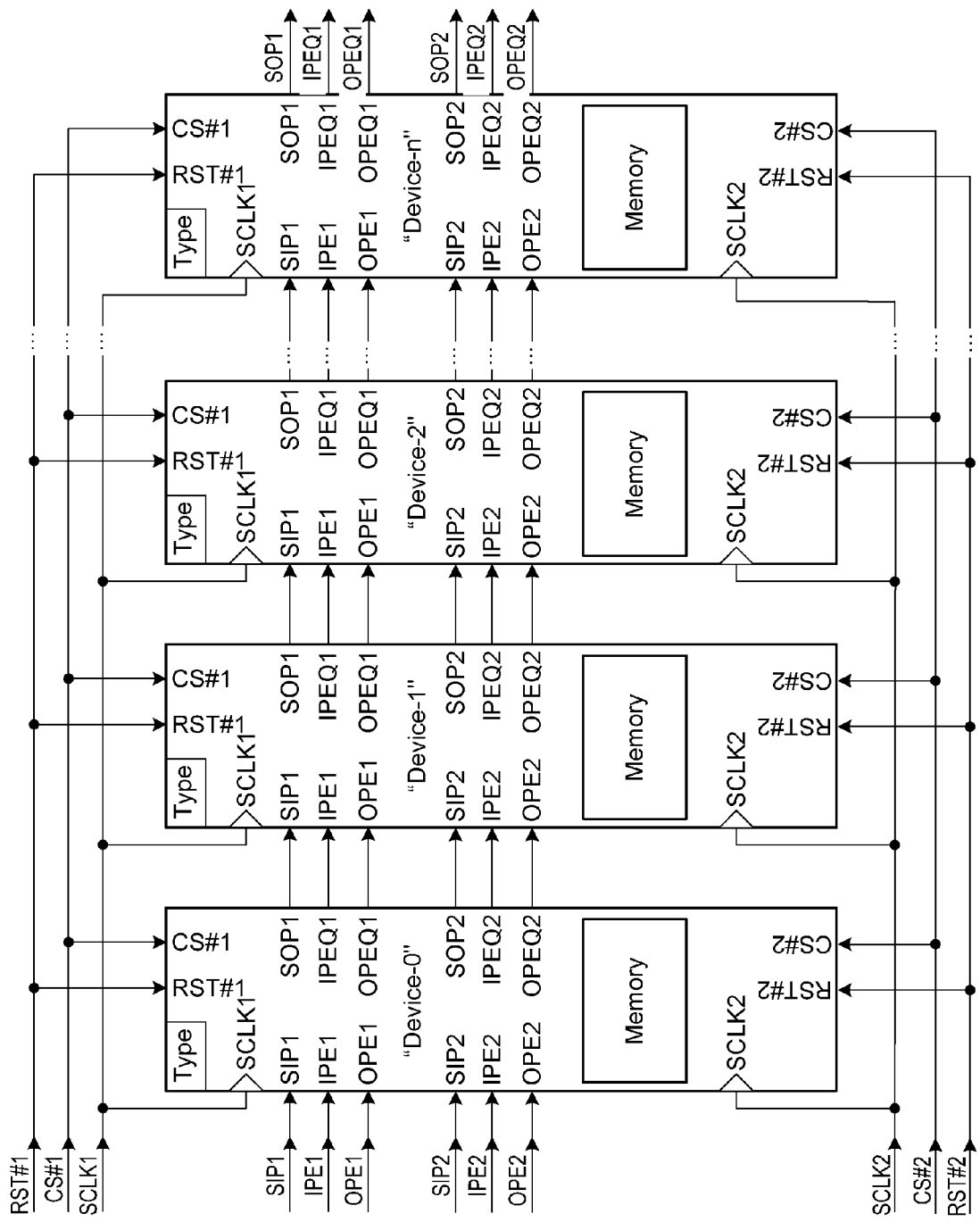
FIG. 26 is a schematic of specific example memory devices used in the memory system shown in FIG. 25.

FIG. 25 shows a memory system according to another embodiment of the present invention. The memory system shown in FIG. 25 includes a memory controller 450 and a serial interconnection configuration of a plurality of memory devices 451. The configuration of devices is shown in FIG. 26. Each of the memory devices has a plurality of ports. In the particular example of FIG. 26, each device is a two port device. The memory controller 450 provides a plurality of groups of signals corresponding to the polarity of pots to the devices. In the illustrated example, a reset signal "RST#1", a chip select signal "CS#1" and a serial clock signal "SCLK1" are provided to the respective ports 1 of each of the memory devices. Similarly, for port 2, a reset signal "RST#2", a chip select signal "CS#2" and a serial clock signal "SCLK2" are provided to the respective ports of each of the memory devices.

In the memory systems and the devices shown in FIGS. 23-26, the devices shown in FIGS. 4A, 16A and 16B can be used in the serial interconnection configuration of memory devices. Also, the devices shown in FIGS. 4B, 17A and 17B can be used in the serial interconnection configuration of memory devices. In such a case, the clock signal SCLK is required to be transmitted as shown in FIG. 3F and each device has a clock synchronization circuit for providing the output echo clock signal, 'SCLK_O' for the next device.

In the embodiments described above, the device elements and circuits are connected to each other as shown in the figures, for the sake of simplicity. In practical applications of the present invention, elements, circuits, etc. may be connected directly to each other. As well, elements, circuits etc. may be connected indirectly to each other through other elements, circuits, etc., necessary for operation of the devices or apparatus. Thus, in actual configuration of devices and apparatus, the elements and circuits are directly or indirectly coupled with or connected to each other.

It will be apparent to those of ordinary skill in the art that semiconductor devices can be implemented as devices.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A method for use in a system comprising a memory controller and at least one serial interconnection configuration including a plurality of memory devices of mixed device type serially interconnected, each of the plurality of memory devices including a memory for storing data, a signal input, a signal output, an enable input and an enable output, the enable output of one memo device being coupled to the enable input of a subsequent memo device the output of the one memo device being coupled to the input of the subsequent memory device, the method comprising:

holding a device type identification in each of the plurality of serially interconnected memory devices of mixed device type, the device type identification of each of the serially interconnected devices indicating a device type of the memory included therein;

holding an assigned device address identifying an address in each of the serially interconnected memory devices;

providing a first input signal to the signal input of a first memory device of the serially interconnected memory devices by the memory controller, the first input signal comprising a device type read message and a first target device address;

providing a first input enable signal having a predetermined logic level to the enable input of the first memory device of the serially interconnected memory devices by the memory controller, a first output enable signal derived from the first input enable signal being outputted from the enable output of the first memory device, the first output enable signal being provided to the enable input of the subsequent memory device, the first input enable signal being propagated through the remaining memory devices of the serially interconnected memory devices;

in one memory device of the serially interconnected memory devices
receiving the first input signal at the signal input in response to the propagated first input enable signal,
determining whether the first target device address of the received first input signal matches the assigned device address of the one memory device to provide a first determination result,
in response to the first determination result and in accordance with the device type read message of the received first input signal, reading the device type identification held in the one memory device to provide a first read device type identification, the first read device type identification being forwarded to the signal output of the one memory device, providing a first output signal comprising the first read device type identification to the signal input of the subsequent memory device, the first read device type identification of the one memory device being propagated through the remaining memory devices of the serially interconnected memory devices in response to the propagated first input enable signal;

receiving a first read output signal from a last memory device of the serially interconnected memory devices, the first read output signal containing the first read device type identification of the one memory device;

providing a second input signal to the signal input of the first memory device of the serially interconnected memory devices by the memory controller, the second input signal comprising the device type read message and a second target device address that is different from the first target device address;

providing a second input enable signal having a predetermined logic level to the enable input of the first memory device of the serially interconnected memory devices by the memory controller, a second output enable signal derived from the second input enable signal being outputted from the enable output of the first memory device, the second output enable signal being forwarded to the enable input of the subsequent memory device, the second input enable signal being propagated through the remaining memory devices of the serially interconnected memory devices;
in another memory device of the serially interconnected memory devices
receiving the second input signal at the signal input in response to the propagated second input enable signal,
determining whether the second target device address of the received second input signal matches the assigned device address of the another memory device to provide a second determination result,
in response to the second determination result and in accordance with the device type read message, reading the device type identification held in the another memory device to provide a second read device type identification, the second read device type identification being forwarded to the signal output of the another memory device,
providing a second output signal comprising the second read device type identification to the signal input of the subsequent memory device, the second read device type identification of the another memory device being propagated through the remaining memory devices of the serially interconnected memory devices in response to the propagated second input enable signal;
receiving a second read output signal from the last memory device of the serially interconnected memory devices, the second read output signal containing the second read device type identification of the another memory device;
identifying a target memory device of the serially interconnected memory devices to be accessed based on the first and second read device type identifications of the received first and second read output signals;
providing a third input enable signal having a redetermined logic level to the enable input of the first memo device of the serial interconnected memo devices by the memory controller a third output enable signal derived from the third input enable signal being outputted from the enable output of the first memory device, the third output enable signal being provided to the enable input of the subsequent memory device, the third input enable signal being propagated through the remaining memory devices of the serially interconnected memory devices;
providing a third input signal to the signal input of the first memory device of the serially interconnected memory devices by the memory controller, the third input signal comprising an access operation message and a device address of the identified target memory device of the serially interconnected memory devices; and
selecting a memory device of the serially interconnected memory devices in accordance with the device address of the identified target memory device comprised in the third input signal propagated in response to the propagated third input enable signal, the selected memory device being configured to perform an operation to the memory included in the selected memory device in accordance with the access operation message of the third input signal.

2. The method of claim 1, further comprising:
producing device addresses with consecutive numbers, the produced device addresses being assigned to respective ones of the serially interconnected memory devices.

3. The method of claim 1, wherein the providing a third input signal comprises:
providing the third input signal including a data read operation message as the access operation message and address information identifying a location of data store in the memory.

4. The method of claim 3, wherein the selecting comprises:
in the selected memory device, performing a data read operation in accordance with the data read operation message and the address information included in the third input signal to read data from the location of data store of the memory included in the selected memory device.

5. The method of claim 1, wherein the providing a third input signal comprises:
providing the third input signal including a data write operation message as the access operation message, address information identifying a location of data store in the memory.

6. The method of claim 5, wherein the selecting comprises:
in the selected memory device, performing the data write operation in accordance with the data write operation message and the address information included in the third input signal to write the data comprised in the third input signal to the location of data store of the memory included in the selected memory device.

7. The system of claim 1, wherein the serially interconnected memory devices are selected from a plurality of NAND Flash Electrically Erasable Programmable Read-Only Memory (EEPROM), NOR Flash EEPROM, AND Flash EEPROM, DiNOR Flash EEPROM, Serial Flash EEPROM, Dynamic Random Access Memory (DRAM), Static Random Access Memory (SRAM), Read-Only Memory (ROM), Erasable Programmable Read-Only Memory (EPROM) Ferroelectric Random-Access Memory (FRAM), Magneto-resistive Random-Access Memory (MRAM) and Phase-Change Random Access Memory (PCRAM) devices.

8. The method of claim 1, wherein the device type of the plurality of memory devices comprises NAND EEPROM, NOR Flash EEPROM, AND Flash EEPROM, DiNOR Flash EEPROM, Serial Flash EEPROM, DRAM, SRAM, ROM, EPROM FRAM, MRAM and PCRAM.

9. The method of claim 2, wherein the holding an assigned device address comprises:
holding each of the assigned device addresses in the respective memory device of the serially interconnected memory devices.

* * * * *